(12) United States Patent
Reza

(10) Patent No.: US 10,388,302 B2
(45) Date of Patent: Aug. 20, 2019

(54) METHODS FOR PROCESSING AND ANALYZING A SIGNAL, AND DEVICES IMPLEMENTING SUCH METHODS

(71) Applicant: Yves Reza, Cormondreche (CH)

(72) Inventor: Yves Reza, Cormondreche (CH)

(\*) Notice: Subject to any disclaimer, the term of this patent is extended or adjusted under 35 U.S.C. 154(b) by 0 days.

(21) Appl. No.: 15/539,979

(22) PCT Filed: Dec. 23, 2015

(86) PCT No.: PCT/EP2015/081128
§ 371 (c)(1),
(2) Date: Jun. 26, 2017

(87) PCT Pub. No.: WO2016/102651
PCT Pub. Date: Jun. 30, 2016

(65) Prior Publication Data
US 2018/0005644 A1    Jan. 4, 2018

(30) Foreign Application Priority Data

Dec. 24, 2014  (BE) .................................. 2014/5159

(51) Int. Cl.
*G10L 25/00* (2013.01)
*G10L 19/00* (2013.01)
(Continued)

(52) U.S. Cl.
CPC .............. *G10L 25/18* (2013.01); *G01R 23/16* (2013.01); *G01R 23/167* (2013.01); *G10L 25/03* (2013.01); *G10L 25/84* (2013.01)

(58) Field of Classification Search
CPC ......... G10L 25/00; G10L 25/18; G10L 19/00; G10L 19/02; G10L 19/0204
See application file for complete search history.

(56) References Cited

U.S. PATENT DOCUMENTS 5,214,708 A    5/1993  McEachern
9,754,597 B2 * 9/2017  Jot ...................... G10L 19/0204
(Continued)

FOREIGN PATENT DOCUMENTS

EP        2603862 B1   10/2014
WO    WO-2012019251 A2   2/2012

OTHER PUBLICATIONS

International Search Report and written opinion, International Application No. PCT/EP2015/081128, dated Apr. 4, 2016.
(Continued)

*Primary Examiner* — Paras D Shah
(74) *Attorney, Agent, or Firm* — Marshall, Gerstein & Borun LLP

(57) ABSTRACT

A method for processing an initial signal includes a useful signal and added noise, which comprises a step of frequency selective analysis providing starting from initial signal a plurality of wideband analysis signals corresponding to one of the analyzed frequencies, and comprising the following actions: zero or more complex frequency translations, one or more undersampling operations, computation of the instantaneous Amplitude, of the instantaneous Phase, and of the instantaneous Frequency of the wideband analysis signals. This information then allow to detect modulations of signals included in high levels of noise and to detect with a good probability the presence of a signal in a high level of noise.

15 Claims, 20 Drawing Sheets

(51) Int. Cl.
*G10L 25/18* (2013.01)
*G01R 23/16* (2006.01)
*G10L 25/03* (2013.01)
*G10L 25/84* (2013.01)
*G01R 23/167* (2006.01)

(56) References Cited

U.S. PATENT DOCUMENTS

| | | | | |
|---|---|---|---|---|
| 2002/0133333 | A1* | 9/2002 | Ito | G10L 19/10 704/208 |
| 2003/0028374 | A1* | 2/2003 | Ribic | G10L 21/0208 704/233 |
| 2004/0064324 | A1* | 4/2004 | Graumann | G10L 19/0208 704/500 |
| 2010/0158158 | A1* | 6/2010 | Menu | G10L 19/0204 375/334 |
| 2013/0035777 | A1* | 2/2013 | Niemisto | G10L 19/0204 700/94 |
| 2013/0138398 | A1* | 5/2013 | Reza | G06F 17/141 702/190 |
| 2014/0278382 | A1* | 9/2014 | Ricci | G10L 19/26 704/206 |

OTHER PUBLICATIONS

International Search Report and written opinion, International Application No. BE20145159, dated Jul. 15, 2015.
E.G. Lyons, "Understanding Digital Signal Processing—Third Edition", 2011, Prentice Hall.
G. Evangelopoulos et al. "Multiband Modulation Energy, Tracking for Noisy Speech Detection", Ieee Transactions on Audio, Speech and Language Processing, vol. 14, No. 6, Nov. 1, 2006.
Reilly A. et al. "An Efficient Algorithm for Analytic Signal Generation for Time-Frequency Distributions", Proceedings of Icassp, '94. Ieee International Conference on Acoustics, Speech and Signal Processing, vol. Iii, Apr. 19, 1994.
Boualem Boashash "Estimating and Interpreting the Instantaneous Frequency of a Signal—Part 1: Fundamentals" Proceedings of the Ieee vol. 80, No. 4, Apr. 1992 pp. 520-538.
Sylvain Marchand, Philippe Depaille "Generalization of the Derivative Analysis Method to Non Stationary Sinusoidal Modeling" Proceedings of the 11th Conference of Digital Audio Effects (Dafx-08), Sep. 2008.
Sylvain Marchand "The simplest analysis method for non stationary sinusoidal modeling" Proceedings of the 15th conference of Digital Audio Effects (DAFx-12), Sep. 2012.
François Auger, Eric Chassande Motin, Patrick Flandrin, "On Phase Magnitude Relationships in the Short Time Fourier Transform" IEEE Signal Processing Letters vol. 6, No. 1, Jan. 2012.
Lawrence Rabiner, Ronald Crochiere "A novel implementation for Narrow band FIR digital filters" IEEE Transactions on Acoustics, Speech and Signal Processing vol. ASSP-23, No. 5, Oct. 1975.
Article Wikipedia "Pitch Detection Algorithm", dernière mise à jour de la page le 24 février 2014.
Thomas F. Quatieri, "Discrete Time Speech Signal Processing", Prentice Hall éditeur, 2002.
Frederic J. Harris "On the use of Windows for Harmonic Analysis with the Discrete Fourier Transform" Proceedings of the IEEE vol. 66, No. 1, Jan. 1978 pp. 51-83.
Boualem Boashash "Estimating and Interpreting the Instantaneous Frequency of a Signal—Part 2: Algorithns and Applications" Proceedings of the IEEE vol. 80, No. 4, Apr. 1992 pp. 540-568.
James B. Tsui "Digital techniques for wideband receivers" 2004 edition, 2011, SciTech Publishing éditeur, en particulier les sections 10.6 et 10.7.
Jae S. Lim et Allan V. Oppenheim Editors "Advanced Topics in Signal Processing", Prentice Hall, 1988 et 1989, et en particulier le chapitre 6 <<Short Time Fourier Transform>>, (auteurs: Nawab et Quatieri).

* cited by examiner

METHODS FOR PROCESSING AND ANALYZING A SIGNAL, AND DEVICES IMPLEMENTING SUCH METHODS

TECHNICAL FIELD

Present invention is relative to a method for processing and analyzing an initial signal in order to provide analysis signals, to a method for the analysis of an initial signal in order to provide parameters for analysed frequencies, and to devices adapted to implement either one of the said methods.

BACKGROUND

Methods for extracting information starting from signals which have a great content of information, such as audio signals (vocal and musical signals especially) are more and more important. They are in particular used in an increasing number of applications such as for example: speech recognition, analysis of musical signals, detection in telephony of service signaling (DTMF) in presence of audio signals.

More precisely, these applications comprise a step for extracting frequency information (typically: amplitude and evolution of amplitude for narrow frequency bands extracted from signal), followed by steps for recognizing or identifying using, often mainly, this information relative to frequencies contained in these signals.

However, one generally considers that there is necessarily a trade-off to be done between determination with a good accuracy of the frequencies contained in the signal on one hand, and on the other hand determination with a good accuracy of the instants of appearance and disappearance of the various frequencies contained in the signal to be studied.

Other signals, with a higher frequency, such as ultrasound signals or wideband radio signals may also have a great content of information and benefit from the same technical principles for frequency recognition as signals of vocal type.

Within this context, nature and richness of information gathered during extraction of information related to frequencies contained in the signal to be studied play a very significant role for the subsequent steps of signal processing, which are often steps for recognition or identification of signals determined by their frequency profile and their time profile (for example phonemes in vocal recognitions), and thus for the performance of the whole signal processing chain that may exist in such applications.

For example, signal processing for speech recognition is actually principally done by the means of audio filter banks operating in parallel (according to the principle of "vocoder") or, equivalently, by sliding windowed Fourier Transforms (that is operating on signals that have been previously multiplied by window). The audio signal main have been filtered in order to suppress or enhance frequencies, in order to operate on the audio frequency band which contains most of the information that allow speech recognition or source identification that is a frequency band containing the frequency band extending from 300 Hz to 3.200 Hz (frequency band for telephony).

Typically, frequency information obtained are obtained with time windows that have a duration on the order of 10 to 20 milliseconds, duration during which audio signals are supposed to be stationary (or quasi stationary).

This stationarity hypothesis is globally respected, but prevents to see well transitions between periods during which signal is stationary (or quasi stationary).

In the case of signal analysis Sliding Fourier Transform (TFG), but also with other techniques such as Wavelet analysis, it is a known fact that it is not possible to have simultaneously a good resolution in time and a good resolution in frequency. Furthermore, a good noise rejection is associated with an analysis that is as accurate as possible in frequency.

It would thus be particularly advantageous to have information that is both precise in time and frequency, and that also allow to reject noise as much as possible.

SUMMARY OF THE INVENTION

A first objective of the invention is to provide a method for processing an initial signal by the means of a plurality of analysed frequencies in said initial signal, comprising a useful signal comprising a sum of elementary signals, representative of a wave that propagates in a physical medium, to which added noise can be added.
said method being implemented on a sequence of samples, sampled at a constant sampling frequency, obtained from an initial signal, said method comprising a frequency selective analysis step, providing starting from the initial signal a plurality of wideband analysis signals, each wideband analysis signal corresponding to one of the analysed frequencies, said step comprising the following sub-steps:
  AS1) a series of undersampling operations, comprising each a low pass or bandpass frequency filtering, and a corresponding suppression of samples
  AS2) at least one low pass or bandpass frequency filtering operation not followed by a corresponding suppression of samples
  AS3) zero or more complex frequency translation operation which brings the analysed frequency to a first operating frequency (FTA) adapted to compute instantaneous Amplitude and to second operating frequency (FTP) adapted to compute Instantaneous Phase and Instantaneous Frequency of analysis signal.

In various implementation modes of the previous method, it is possible to use one and/or another of the following dispositions.

According to one aspect of the invention, steps AS1) and AS2) are the following AS21) and AS31) steps:
  AS21) zero or more low pass or passband frequency filtering,
  AS31) at least one complex Frequency Translation which transforms the analysed frequency to an operating frequency adapted to compute instantaneous Amplitude and to second operating frequency (FTP) adapted to compute Instantaneous Phase and Instantaneous Frequency of wideband analysis signal.

According to one aspect of the invention, steps AS1), AS2) and AS3) (or AS11), AS21 and AS31) are respectively the following AS10), AS20) and AS30) steps:
  AS10) a sequence of undersampling operations, each comprising a low pass frequency filtering around null frequency (F0) or bandpass frequency filtering around (F4) frequency equal to a quarter of sampling frequency (FE), and a corresponding suppression of samples
  AS20) at least one low pass frequency filtering around null frequency (F0) or bandpass frequency filtering around (F4) frequency equal to a quarter of sampling frequency (FE), not followed by a corresponding suppression of samples carried out with a frequency filter whose useful duration (DUF) expressed as a number of samples is less than or equal to 12, and advantageously equal to 8, and the bandwidth of which fills at least 30% of the signal spectrum at the output of AS1) step AS30) zero or more complex Frequency Translation which transforms the analysed frequency to the (F4) frequency equal to a quarter of sampling frequency (FE), adapted to compute instantaneous Amplitude, Instantaneous Phase and Instantaneous Frequency of wideband analysis signal.

According to one aspect of the invention, step AS20) is the following AS200) step:

AS200) A bandpass frequency filtering around (F4) frequency equal to a quarter of sampling frequency (FE), not followed by a corresponding suppression of samples, carried out with a Sliding Fourier Transform (TFG) of length 12 with a Hann window, restricted to the frequency channel centered on (F4) frequency equal to a quarter of sampling frequency (FE).

A second objective of the invention is to provide an analysis method of an initial signal using a plurality of analysed frequencies in the said initial signal, comprising a useful signal comprising a sum of elementary signals, representative of a wave that propagates in a physical medium, to which added noise can be added, in order to provide parameters indicating presence and a description of the modulations of each of the analysed frequencies of the plurality of analysed frequencies, said method being implemented on a sequence of samples, sampled at a constant sampling frequency, obtained from an initial signal, said method comprising following sequence of steps:

1.1) A frequency selective analysis step providing starting from the initial signal a plurality of wideband analysis signal, each wideband analysis signal corresponding to one of the analysed frequencies 1.2) A plurality of operations of extraction of parameters of the wideband analysis signal for each sample of the plurality of wideband analysis signals, these parameters comprising at least the following signals:

a) Instantaneous Amplitude of the wideband analysis signals b) Instantaneous Phase of the wideband analysis signals 1.3) A plurality of operations for estimation of the modulation of the signal which each one determine for each sample of the plurality of analysis signal, and for an observation duration of samples of wideband analysis signals the following indicator:

a) an indicator of non-significant signal, which is false by default and true if at least one of the three conditions is satisfied:

a.1) if the Instantaneous Amplitude of the wideband analysis signals is, during the duration of samples of the wideband analysis signals an average value lower than a first limit defined in advance or an instantaneous value lower than a second limit defined in advance a.2) if at least three observed indicators, directly comparable for both possible values and speed of variation, show a bad temporal concordance regarding the apparition of significant events, such as maximum, minimum or fast transitions a.3) if at least an indicator of useful signal presence and signal to noise ratio estimation indicates a signal absence or a too important noise b) and at least two other indicators, directly comparable for both possible values and speed of variation, such as:

ic.1) at least one of the directly comparable indicators comes from instantaneous amplitude information ic.2) at least one of the directly comparable indicators comes from instantaneous phase or frequency information.

Thanks to these arrangements, it is possible to detect in a reliable way, at a high frequency, and a reduced response time, in an initial signal possibly significantly noisy, the following information concerning an analysed frequency which may appear or disappear at each instant:

Instantaneous amplitude

Instantaneous frequency

Amplitude modulation

Frequency modulation

And this with simple and low cost means.

In various embodiments of the preceding method one can also use one and/or another of the following means.

According to one aspect of the invention, operations for extraction of signal parameters for each sample of the plurality of wideband analysis signals, provide also at least two out of the six following signals:

c) Instantaneous Phase of the derivative signal equal to the time derivative of a wideband analysis signal, d) Instantaneous Frequency of the derivative signal equal to the time derivative of said instantaneous Phase of the derivative signal e) Instantaneous Phase of the integral signal equal to the time integral of a wideband analysis signal, f) Instantaneous Frequency time derivative of said instantaneous Phase of the integral signal g) Instantaneous Amplitude of the derivative signal, h) Instantaneous Amplitude of the integral signal.

According to one aspect of the invention, the at least two directly comparable indicators are such as:

ic.3) at least one of the directly comparable indicators is made out of information from the time derivative signal or the time integral signal of the wideband analysis signal.

According to one aspect of the invention, the at least two directly comparable indicators are at least three and such as:

ic.4) at least one of the directly comparable indicators comes from information of the wideband analysis signal ic.5) at least one of the directly comparable indicators comes from information of the time derivative of the wideband analysis signal ic.6) at least one of the directly comparable indicators comes from information of the time integral of the wideband analysis signal According to one aspect of the invention, the directly comparable indicators comprise at least one of the following indicators:

b1) a sinusoidal amplitude modulation indicator which indicates to what extent the first time derivative of instantaneous Amplitude on one side and on the other side the second time derivative of instantaneous Amplitude are in quadrature b2) an exponential amplitude modulation indicator which indicates to what extent the first time derivative of the logarithm of the instantaneous Amplitude is constant b3) a detection of peaks of amplitude modulation indicator which indicates to what extent the second time derivative of the logarithm of the instantaneous Amplitude has a large and limited in time peak b4) a frequency modulation indicator which indicates to what extent the first time derivative of the instantaneous Frequency of the wideband analysis signal, which itself is the first time derivative of the instantaneous Phase of the wideband analysis signal, is constant b5) a first noise indicator computed as the instantaneous amplitude of the time integral of a wideband analysis signal, which presents fast oscillations when significant noise is present b6) a second noise indicator computed as the instantaneous phase of the time integral of a wideband analysis signal, which presents fast oscillations when significant noise is present b7) a third noise indicator computed as the instantaneous frequency of the time integral of a wideband analysis signal, which presents fast oscillations when significant noise is present.

According to one aspect of the invention, the indicators of useful signal presence and signal to noise ratio estimation comprise at least one of the following indicators:

b8) A first indicator of signal presence and signal to noise ratio estimation, equal to the variance during the observation duration of samples of the wideband analysis signal of the difference of instantaneous phase between, on one side, the instantaneous phase of the time integral of the signal and, on the other side, the instantaneous phase of the signal b9) A second indicator of signal presence and signal to noise ratio estimation, equal to the variance during the observation duration of samples of the wideband analysis signal of the difference of instantaneous frequency between, on one side, the instantaneous frequency of the time integral of the signal and, on the other side, the instantaneous frequency of the signal b.10) A third indicator of signal presence and signal to noise ratio estimation, computed as the ratio of the following amplitude ratios:

Ratio of instantaneous amplitudes of the time derivative of the signal (AID) and of the signal (AIS)

Ratio of instantaneous amplitudes of the time integral of the signal (AIP) and of the signal (AIS)

And for which the degree of temporal correlation with the two following signals:

b.10.a) the instantaneous frequency of the time integral signal (SAP) of the wideband analysis signal (SAL), b.10.b) one of the two following signals:

The instantaneous frequency of a wideband analysis signal

The instantaneous frequency of the time derivative of a wideband analysis signal provides an indication of detectable signal presence and signal to noise ratio of a wideband analysis signal (SAL) thanks to its following properties:

b.10.1) in the absence of a detectable signal, the ratio of the amplitude ratios is not correlated to any of the instantaneous frequency signals previously mentioned in b.10.a) or b.10.b)

b.10.2) in the presence of a detectable signal, and in the absence of significant noise, the ratio of the amplitude ratios is correlated to the three instantaneous frequency signals previously mentioned in b.10.a) or b.10.b)

b.10.3) in the presence of a detectable signal, and in the presence of significant noise, the ratio of the amplitude ratios is correlated to the instantaneous frequency of the time integral of the wideband analysis signal, but not to the other two instantaneous frequency signals previously mentioned in b.10.a) or b.10.b).

According to one aspect of the invention:

11.1) The time concordance between two significant events is measured as the number of samples that separate the apparition of the two events, without taking into account possible systematic differences of durations for computation of the corresponding indicators 11.2) A concordance of 0 or 1 sample is considered as good, a concordance of 2 samples is considered as average, and beyond two samples, it is considered as bad 11.3) When the concordance is relative to more than 2 indicators, a concordance indicator (ICO) will be computed from significant events identified in a window of 5 to 7 consecutive samples According to one aspect of the invention, Step 1.1 of frequency selective analysis is implemented in the following way:

AS1) a series of undersampling operations, each made of a low pass or bandpass frequency filtering and a corresponding suppression of samples AS2) at least one low pass or bandpass frequency filtering operation not followed by a corresponding suppression of samples AS3) zero or more complex Frequency Translation which brings the analysed frequency to a first operating frequency adapted to compute the instantaneous Amplitude and to a second operating frequency adapted to compute the instantaneous Phase and the instantaneous Frequency of the analysis signal.

According to one aspect of the invention, steps AS2) and AS3) are the following AS21) and AS31) steps:

AS21) zero or more low pass or bandpass frequency filtering operations,

AS31) at least one complex Frequency Translation which brings the analysed frequency to an operating frequency adapted to compute the instantaneous Amplitude and to an operating frequency adapted to compute the instantaneous Phase and the instantaneous Frequency of the analysis signal.

According to one aspect of the invention, steps AS1), AS2) and AS3) (or AS11), AS21 and AS31), are implemented respectively by the following AS10), AS20) and AS30) steps:

AS10) a series of undersampling operations, each made of a frequency filtering low pass around null frequency or bandpass around frequency equal to one quarter of sampling frequency, and a corresponding suppression of samples AS20) at least one frequency filtering operation low pass around null frequency or bandpass around frequency equal to one quarter of sampling frequency, not followed by a corresponding suppression of samples, implemented with a frequency filter whose useful duration (DUF) expressed as a number of samples is less than or equal to 12, and advantageously equal to 8, and whose passband occupies at least 30% of the spectrum of the output signal of step AS1)

AS30) zero or more complex Frequency Translation which brings the analysed frequency to a frequency equal to the quarter of the sampling frequency, adapted to compute the instantaneous Amplitude, the instantaneous Phase and the instantaneous Frequency of the analysis signal.

According to one aspect of the invention, step AS20) is implemented by the following AS200) step:

AS200) A bandpass frequency filtering operation with center frequency the frequency equal to one quarter of the sampling frequency, not followed by a corresponding sample suppression, implemented by a Sliding Fourier Transform of length 12 with a Hann window, restricted to the frequency channel centered on the frequency equal to one quarter of the sampling frequency.

According to one aspect of the invention, the duration of observation of (DOB) samples of the wideband analysis signal is on the order of 10 to 20 samples of the wideband analysis signal.

According to one aspect of the invention, the method is used for processing voice signals, allowing to detect the fundamental frequency of the signal by detecting the following elements:

VA) significant amplitude peaks of at least one of the following indicators:
 V1) the detection of peaks of amplitude modulation indicator
 V2) the indicator of signal presence probability
 V3) the frequency modulation indicator
VB) the time concordance for the appearance of amplitude peaks of previous indicators According to one aspect of the invention, applied to each of the at least one elementary signals of dimension 1, resulting from the decomposition of a multi-dimensional initial signal, with a number of dimensions, into a number of elementary signals out of which at least one has dimension 1.

According to one aspect of the invention, all the operations are performed at a speed adapted to process continuously all analysed frequencies from the plurality of analysed frequencies.

A third objective of the invention is to provide a device for processing and/or analysis of an initial signal and for detecting a plurality of analysed frequencies within said initial signal possibly significantly noisy, sampled at a constant sampling frequency, said device comprising a computing platform receiving an initial signal representative of a wave that propagates in a physical medium, and being adapted to implement one of the previously mentioned methods.

In various embodiments of the device, one can possibly use one and/or another of the following features.

According to one aspect of the invention, the device father comprises a sensor generating said initial signal starting from said wave.

According to one aspect of the invention, the platform for computation is adapted to fixed point computations.

REFERENCES RELATIVES TO THE INVENTION

In the field of signal processing, and in relation with the invention, one can quote the following references:

Reference 1. Richard G. Lyons "Understanding Digital Signal Processing" Third edition, 2011, Prentice Hall publisher, Reference 2. Jae S. Lim and Allan V. Oppenheim Editors "Advanced Topics in Signal Processing", Prentice Hall publisher, 1988 et 1989, and in particular chapter 6 <<Short Time Fourier Transform>>, (authors: Nawab et Quatieri)

Reference 3. The patent application PCT/BE2011/000052 filed on Aug. 12, 2011 <<Procédé d'Analyse de signaux fournissant des fréquences instantanées et des transformées de Fourier Glissantes et dispositif d'Analyse de signaux>>

Reference 4. Boualem Boashash "Estimating and Interpreting the Instantaneous Frequency of a Signal—Part 1: Fundamentals" Proceedings of the IEEE Vol 80, No 4, April 1992 Pages 520-538

Reference 5. Sylvain Marchand, Philippe Depaille "Generalization of the derivative analysis method to non-stationary sinusoidal modeling" Proceedings of the 11th conference of Digital Audio Effects (DAFx-08), September 2008

Reference 6. Sylvain Marchand "The simplest analysis method for non-stationary sinusoidal modeling" Proceedings of the 15th conference of Digital Audio Effects (DAFx-12), September 2012

Reference 7. François Auger, Eric Chassande Motin, Patrick Flandrin, "On Phase Magnitude Relationships in the Short Time Fourier Transform" IEEE Signal Processing Letters Vol 6, No 1, January 2012.

Reference 8. Lawrence Rabiner, Ronald Crochiere "A novel implementation for Narrow band FIR digital filters" IEEE Transactions on Acoustics, Speech and Signal Processing Vol ASSP-23, No 5, October 1975.

Reference 9. Wikipedia article "Pitch Detection Algorithm", last page update dated 24 Feb. 2014.

Reference 10. Thomas F. Quatieri, "Discrete Time Speech Signal Processing", Prentice Hall publisher, 2002.

Reference 11. Frederic J. Harris "On the use of Windows for Harmonic Analysis with the Discrete Fourier Transform" Proceedings of the IEEE Vol 66, No 1, January 1978 Pages 51-83.

Reference 12. Boualem Boashash "Estimating and Interpreting the Instantaneous Frequency of a Signal—Part 2: Algorithms and Applications" Proceedings of the IEEE Vol 80, No 4, April 1992 Pages 540-568

Reference 13. James B. Tsui "Digital techniques for wideband receivers" 2004 edition, 2011, SciTech Publishing éditeur, in particular sections 10.6 et 10.7

BRIEF DESCRIPTION OF THE DRAWINGS

Other characteristics and advantages of the invention will appear during the following description, given as a non-limitative example, in reference to attached figures in which.

DESCRIPTION OF SIGNALS USED AND PREVIOUS METHODS

Figure 1:
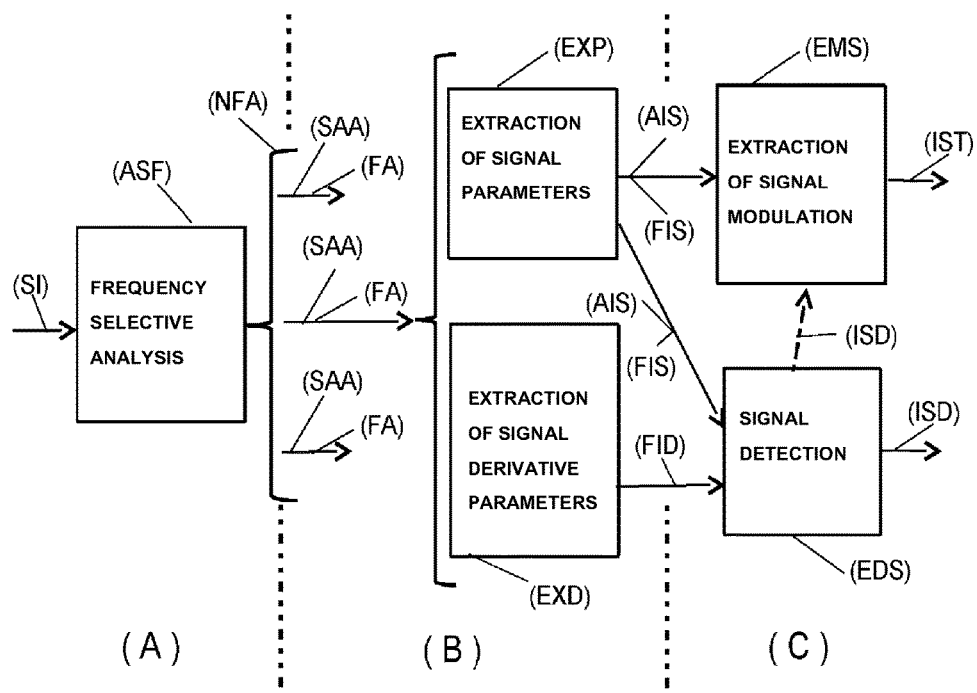
FIG. 1 shows an overview of the invention.

Concerning the electrical signal that the invention can process, one notes that audio signals are a particular case of electrical signals generated by a sensor (CA) and representative of a waves that propagate in a physical medium. As an example of such waves one can mention: acoustical waves, electromagnetic waves, seismic waves, ultrasound waves, sound waves in a medium other than air (water, human or animal body).

a) Limitations of Current Methods (Prior)

Traditional time-frequency analysis, such as the spectrogram traditionally associated to the windowed Fourier Transform, or Short Time Fourier Transform (TFG) frequently face limits in the processing of non-stationary signals: they allow to modelize well stationary signals, but face problems when processing transient parts. These limitations are stronger when the Signal to Noise ratio is unfavorable and the noise level important.

Standard Fourier transform, indeed, introduces limitations which make it not possible to have simultaneously a good resolution in time and a good resolution in frequency. For example, with a time window of 3 to 4 millisecond duration, frequency resolution is at best 300 Hz or 250 Hz respectively. One notes that time frequency views (generally called "spectrograms") lack clarity and accuracy.

In a general way, with usual time windows, time resolution is better when window duration is short and time resolution is better when window duration is long.

The same limitation exists with other techniques, and notably with wavelets.

As an example, a time window on the order of 20 milliseconds is often used for studying vocal signals because it represents a trade-off often acceptable between the various the different constraints regarding analysis and representation of signals. With a 8 KHz sampling frequency, corresponding to telephony grade voice, one uses a window on the order of 160 samples is used and each frequency channel of the Fourier Transform makes a narrow band analysis of speech signal.

b) Preferred Computing Platforms for the Invention

The present invention has especially as goal to allow to implement on particularly economic computation platforms (PC) particularly high-performance signal processing which necessitated until now computation platforms that were not very economical.

Computation platforms especially concerned by the present invention are the following:

a) Programmable logic components ("FPGA"), in particular but not exclusively low cost FPGA which operate with a clock frequency on the order of 100 MHz b) Dedicated integrated circuits ("ASICS")

One will note that these computation platforms allow to make autonomous and embedded systems, for example powered by batteries or rechargeable batteries.

In addition, these platforms have very high clock frequencies (clock frequencies of several tens of Mhz or more), but are not usually provided with means for floating point computations.

It is always possible to implement floating point computations on these platforms, but this type of computation consumes a lot of resources (in time or in circuit area used).

As a consequence, the solution usually used is to perform computations as fixed point ones. However, in most of the cases a significant loss of numeric accuracy follows.

The preceding list of platforms is indicative and other types of computing platforms can be used.

c) Main Types of Signals Concerned by the Invention

The invention allows in particular to process in a particularly advantageous way signals having several types of modulation (combined amplitude and frequency modulations) and time-varying modulations.

These signals thus include vocal or audio signals (which are sampled, depending on the applications, at frequencies varying typically from 8 KHz (telephony) to 96 KHz (professional audio high-fidelity)).

Signals of all types, coming for example from medical sensors (sounds relative to the body notably) or industrial sensors, the frequency of which is comparable or less than audio signals can advantageously be processed by the invention, as well as signals the frequency of which is higher than the frequency of audio signals (ultrasound signals notably).

The previous list of signals is given as an example and other types of signals will be able to be processed in the framework of the invention.

DETAILED DESCRIPTION OF THE INVENTION

On the different figures, the same references are used to designate identical or similar elements.

1) General Goal of the Invention

The method according to the invention has the objective of using a particular type of signals, analysis signals (SAA) or wideband analysis signals (SAL), in order to detect with a significant probability, presence or absence of a signal and of its different types of modulation (amplitude and frequency), with a good time resolution, with a good frequency resolution and in a manner resistant to noise.

Detection of information is significantly noisy medium classically raises the following problems:

P1) Best possible separation of useful signal on one side and of added noise on the other side P2) Best possible estimation of the level of noise that is present P3) Maximum avoidance of false positives (signal detected while it is absent), with if possible indicators representative at each moment of the probability of existence of a false positive P4) Same problem as P3 for the false negatives (absence of signal detection while it is present)

Technical descriptions which follow show the present invention answers these problems.

2) Overview of the Invention

FIG. 1 presents an overview of the invention. One notices 3 large parts named (A), (B) and (C). Initial signal (SI) processing is performed by successively going through parts named (A), (B) and (C).

Parts (B) and (C) allow to define two principal variants in the processing of initial signal (SI).

In all cases, first step (part (A)) is the frequency selective analysis (ASF) step, which provides as output a plurality (NFA) of analysis signals (SAA), of wideband monocomponent type and limited auto interference, with such a signal for each analysed frequency (FA) of said plurality (NFA).

These analysis signals (SAA), of wideband monocomponent type and limited auto interference, show, as will be seen later, several advantageous properties which significantly facilitate subsequent processing steps of the initial signal (SI).

Part (B) corresponds to the extraction of parameters of these analysis signals (SAA), these parameters being instantaneous phase and amplitude information computed for each sample of said analysis signals (SAA). Operations (EXP) of parameter extraction of signal (PAS) provide instantaneous Amplitude (AIS) and instantaneous Frequency (FIS) of analysis signals (SAA), and operations (EXD) of parameter extraction of time derivative of signal (PAD) provide in addition the instantaneous Frequency (FID) of derivative signal (SAD) equal to the time derivative of analysis signal (SAA).

There exist several methods to obtain instantaneous Amplitude (AIS) of a signal. However, to obtain this information from an analysis signal (SAA), it is particularly advantageous to use the method described in Reference 3. The patent application PCT/BE2011/000052 filed on Aug. 12, 2011 because its principle does not imply any additional filtering operation.

Part (C) corresponds to operations of detection of particular modulations present in the analysis signal (SAA), and to a more general operation of detection of presence of such an analysis signal (SAA).

Operations of estimation of signal modulation (EMS) each determine on an observation duration of (DOB) samples of the initial signal (SI) presence of specific modulation types de modulation:

a) An amplitude modulation of sinusoidal type can be detected by observing that two parameters coming from parameters extracted by operations (EXP) of parameter extraction of signal (PAS) of analysis signals (SAA) are in quadrature (a precise definition of this word will be given later)

b) An amplitude modulation of exponential type can be detected by observing that another parameter coming from the parameters extracted by operations (EXP) of parameter extraction of signal (PAS) of analysis signals (SAA) is constant c) The localization of the amplitude modulation peaks can be detected by observing the amplitude peaks of another parameter coming from parameters extracted by operations (EXP) of parameter extraction of signal (PAS) of analysis signals (SAA)

d) A frequency modulation can be detected by observing that another parameter coming from the parameters extracted by operations (EXP) of parameter extraction of signal (PAS) of analysis signals (SAA) varies in time e) A frequency modulation with constant amplitude can be detected by comparing another parameter coming from parameters extracted by operations (EXP) of parameter extraction of signal (PAS) with a parameter coming from parameters extracted by operations (EXD) of parameter extraction of time derivative of signal (PAD) of the derivative signal (SAD)

f) The presence or the absence of a signal a priori of any type can be detected by using in addition to parameters extracted by operations (EXP) of parameter extraction of signal (PAS) of analysis signals (SAA) a parameter extracted by operations (EXD) of parameter extraction of time derivative of signal (PAD) of the derivative signal (SAD), after having ascertained that the signal does not present an amplitude modulation of exponential type, including its limit cases, or is not an amplitude modulated signal with a constant amplitude (mathematical justifications will be provided later)

Previous indicators are available for each new sample (SAE) of an analysis signal (SAA) and are related to an observation duration of (DOB) samples of initial signal (SI). To improve reliability of observations, it can be advantageous to observe the evolution of previous indicators on a coherence checking duration (DMC), equal for example to 3 or 5 times the observation duration of (DOB) samples of the initial signal (SI), by observing in particular:

a) the time evolution of each indicator (on which duration the indicator stays roughly constant?)

b) the significant evolutions joint in time of several indicators (do some indicators present des significant variations at the same moment?)

Furthermore, and unless otherwise stated, within the framework of the invention:

a) Signals are complex signals, with time derivatives carried out independently on the real part and the imaginary part b) Parameters (amplitude and phase, as well as their time derivatives and their logarithms) are real quantities Initial signal (SI) can be real or complex. If it is real, any signal generated by frequency translation to the null frequency (F0) may, according to cases, be real or complex, any signal generated by frequency translation of this signal to another frequency will be complex. 3) Analysis signals (SAA), of wideband monocomponent type and limited auto interference It is customary to model a large range of physical signal, apart from transient periods, as a sum of sinusoidal signals having at the same time an amplitude modulation and a frequency modulation. With this perspective, one can thus consider that the useful signal (SU) is composed of elementary signals (SEL) with a central frequency identical or close to an analysed frequency (FA) and having an effective bandwidth (SEB), corresponding for example to the bandwidth that contains 90% of the energy of elementary signal (SEL).

An analysis signal (SAA), of wideband monocomponent type and limited auto interference, presents the following characteristics particularly advantageous for the analysis of an useful signal (SU) composed as a sum of elementary signals (SEL) having an effective bandwidth (SEB):

(SAA1): it is essentially monocomponent that is modelisable as a single sinusoid potentially modulated in time and in frequency. As such its instantaneous frequency is always of the same sign. In practice, it will be enough that in the frequency spectrum of an analysis signal (SAA), (SAA2): it is wideband, that is its spectrum fills an important part (more than a third and possibly plus than half) of the whole available spectrum after the processing which allowed to generate the analysis signal (SAA). As such, instantaneous phase and frequency information have a large dynamic, which in particular allow to be well brought out from the added noise (BRA) that can exist and be large (SAA3): it is of limited auto interference, that is during its elaboration starting from the initial signal (SI), it has little interfered with itself, and in particular it was not subjected to long averages or filtering operations (that is concerning an important number of samples), except if they are followed by an operation that allows to <<break>> this interference with itself, for example a subsampling operation.

The features (SAA1) and (SAA2) guarantee within the framework of the invention instantaneous phase and frequency information that are particularly simple to process and interpret. The features (SAA3) guarantee that these instantaneous phase and frequency information will be representative of those of the initial signal (SI) in the frequency band around analysed frequency (FA).

Alternatively, as a consequence of previous points, one can also say that the processing that allows to go from the initial signal (SI) to an analysis signal (SAA) corresponding to an analysed frequency (FA) should not increase, or very little increase, the auto-correlation duration expressed as number of samples of the analysis signal (SAA), that is as a number of samples after subsampling operations.

Price to be paid for the use of subsampling operations is a reduction of temporal accuracy. Depending on the application that is considered this reduction might present disadvantages, but it can also present advantages. It will be seen in particular in the observations on a vocal signal that this reduction presents advantages in an application the practical importance of which is recognized.

One can thus summarize in the following way and in qualitative terms, the effect of the processing that convert the initial signal (SI) into a plurality (NFA) of analysis signals (SAA):

On one side one loses in temporal accuracy

On the other one converts an initial signal (SI), sum of elementary signals (SEL) not known, into a plurality of analysis signals (SAA), easy to analyze and relatively resistant to noise (because of the wideband), and whose temporal structure (with the reduced temporal accuracy) is very close to the one of the corresponding elementary signal (SEL) (because of the limited auto interference)

Instantaneous frequency information is known to present difficulties of interpretation (see for example Reference 4. Boualem Boashash "Estimating and Interpreting the Instantaneous Frequency of a Signal—Part 1: Fundamentals"). Furthermore, practically it seems somehow contradictory to define an instantaneous value, of frequency or other, for a signal that is itself a long average or a long filtering of another signal.

4) Observation Duration (DOB)

Observation duration (DOB) will be on the order of 100 samples of the initial signal (SI), typically between 100 and 200 samples of this initial signal (SI), duration which is relevant in various applications. In some applications, as it will be seen later, this duration can be larger.

In the framework of the study of the vocal signal, one knows that it is interesting to study this signal in synchronization with the fundamental frequency (see Reference 10. Thomas F. Quatieri, "Discrete Time Speech Signal Processing", Prentice Hall publisher, 2002) and this fundamental frequency is on the order of 100 Hz for a man, 200 Hz for a woman and up to 350 Hz for a child. With a sampling frequency of 8.000 Hz in telephony (application for which the one seeks the lowest possible sampling frequency), one finds again this value of 100 samples if one wants to process all types of voices. If the sampling frequency is higher than 8.000 Hz, as in hi-fi audio where it is larger than 40.000 Hz, one can increase this observation duration (DOB) and/or undersample the initial signal (SI).

For electronic counter-measures, one has less than 5 microseconds (2 to 3 typically) to identify the received radio signal. Assuming an intermediary frequency of 100 Mhz, one finds also again this observation duration (DOB) of 100 to 200 samples to study in detail the received signal.

Furthermore, this observation duration (DOB) of 100 to 200 samples is compatible with typical numerical modulations for studying in detail the modulated signal.

5) Classical Sliding Fourier Transform (TFG) and the Analysis Signals (SAA)

An important point to notice is that a Sliding Fourier Transform (TFG) cannot be used to generate analysis signals (SAA), of wideband monocomponent type and limited auto interference, if it has a length that is typically used (a few tens samples to a few hundred samples, for example from 64 to 256 samples, possibly from 32 to 1024 samples).

Indeed, in the time domain, the impulse response of a Sliding Fourier Transform (TFG) with a rectangular window has a duration equal to the length of this one Sliding Fourier Transform (TFG) (see for example FIG. 13-48 of Reference 1. Richard G. Lyons "Understanding Digital Signal Processing" Third edition, 2011). It can be considered shorter if the window is not rectangular since the time window has values close to zero at its beginning and at its end. However examination of numerous usual time windows (see in particular Reference 11. Frederic J. Harris "On the use of Windows for Harmonic Analysis with the Discrete Fourier Transform" shows that usual time windows have significant values on at least 50% of the duration of the corresponding rectangular window.

In addition, in the frequency domain, the output signal of Sliding Fourier Transform (TFG) is typically narrowband because Sliding Fourier Transform (TFG) habitually used have a typical time duration of 60 to 256 samples, which sometimes goes up to 1024 samples or more. These durations are contradictory with constraint of limited auto interference, and the observations that will be made will confirm this point.

6) The Use of Sliding Fourier Transform (TFG) to Generate Analysis Signals (SAA)

A method, presented in Reference 1 under the name of de <<Zoom FFT>> (see Section 13.19 <<The Zoom FFT>>) consists of carrying out the following series of operations, applied here to the initial signal (SI):

ZF1) Frequency Translation of the initial signal (SI) to the null frequency (F0), in order to generate a complex signal ZF2) Low pass filtering ZF3) Undersampling of signal thus obtained ZF4) Carrying out Fourier Transform One notes that this method is well adapted to generating analysis signals (SAA) under the condition that the Fourier Transform of step ZF4 previously be of a sufficiently reduced to be adapted to be used within the invention (one notes that there is no mention of a constraint on the length of the Fourier Transform in the above mentioned reference).

In the context of the invention, step ZF1 of Frequency Translation will be done towards an operating frequency (FTR) which can a priori be any frequency, but which is advantageously, for simplicity of computation reasons, either the null frequency (F0), or the frequency (F4) equal to a quarter of the sampling frequency (FE). The interest of frequency (F4) is documented in a Reference 3 and will be detailed later. One will also note that it is very simple to go from the null frequency (F0) to the frequency (F4) equal to a quarter of the sampling frequency (FE) and conversely since it is enough to multiply the signal by the successive powers of the square root of −1 (j) or of −j.

In the case of a frequency translation to frequency (F4) equal to a quarter of the sampling frequency (FE), the above series of operations can become ZF1a) Frequency Translation (TF) of initial signal (SI) towards frequency (F4) equal to a quarter of the sampling frequency (FE), to generate a complex signal ZF2a) Passband filtering around said frequency (F4)
ZF3) Undersampling of signal thus obtained
ZF4) Carrying out Fourier Transform according to Reference 3.

Note: Reference 2. Jae S. Lim et Allan V. Oppenheim Editors "Advanced Topics in Signal Processing" (Chapter 6 <<Short Time Fourier Transform>>; Section 6.1.2 <<Filtering View>>, FIG. 6.6; Section 6.2.3 <<The Filter Bank Approach>>, FIG. 6.14) indicates that a Sliding Fourier transform (TFG) carried out on an initial signal (SI) can be seen as the result of a plurality (NFA) of filtering operations, each carried out for an analysed frequency (FA) using the following sequence of operations:

TF1) A complex Frequency Translation from analysed frequency (FA) towards null frequency (F0) carried out on the initial signal (SI)
TF2) A lowpass filtering of the signal thus obtained and the reconstruction of initial signal (SI) being carried out by the following sequence of operations (Section 6.3 <<Short Time Fourier Synthesis>>, Section 6.3.1 <<The filter Bank Summation Method>>):
TF3) A plurality (NFA) of complex Frequency Translations from the null frequency (F0) towards the analysed frequency (FA) carried out on the plurality (NFA) of signals obtained as outputs of step TF2 described above
TF4) A summation of the plurality (NFA) of the signals obtained as output of the TF3 step described above As such, the <<Zoom FFT>> operation described above can be considered as the sequence of the following operations:
ZG1) A first Sliding Fourier Transform (TFG)
ZG2) An undersampling operation of the signal thus obtained
ZG3) A second Sliding Fourier Transform (TFG) carried out on the undersampled signal As such also, the Fourier transform according to Reference 3 can be seen as a Sliding Fourier Transform (TFG) carried out by the means of operations TF1 to TF4 above, by replacing the null frequency by the frequency (F4) equal to a quarter of the sampling frequency (FE). Operations TF1 to TF4 become then respectively the following operations:

TF41) A complex Frequency Translation from analysed frequency (FA) towards frequency (F4) equal to a quarter of the sampling frequency (FE) carried out on the initial signal (SI)
TF42) A passband filtering of the signal thus obtained around frequency (F4) equal to a quarter of the sampling frequency (FE)
TF43) A plurality (NFA) of complex Frequency Translations from frequency (F4) equal to a quarter of the sampling frequency (FE) towards analysed frequency (FA) carried out on the plurality (NFA) of signals obtained as outputs of step TF42 described above
TF44) A summation of the plurality (NFA) of signals obtained as outputs of step TF43 described above.

Figure 2:
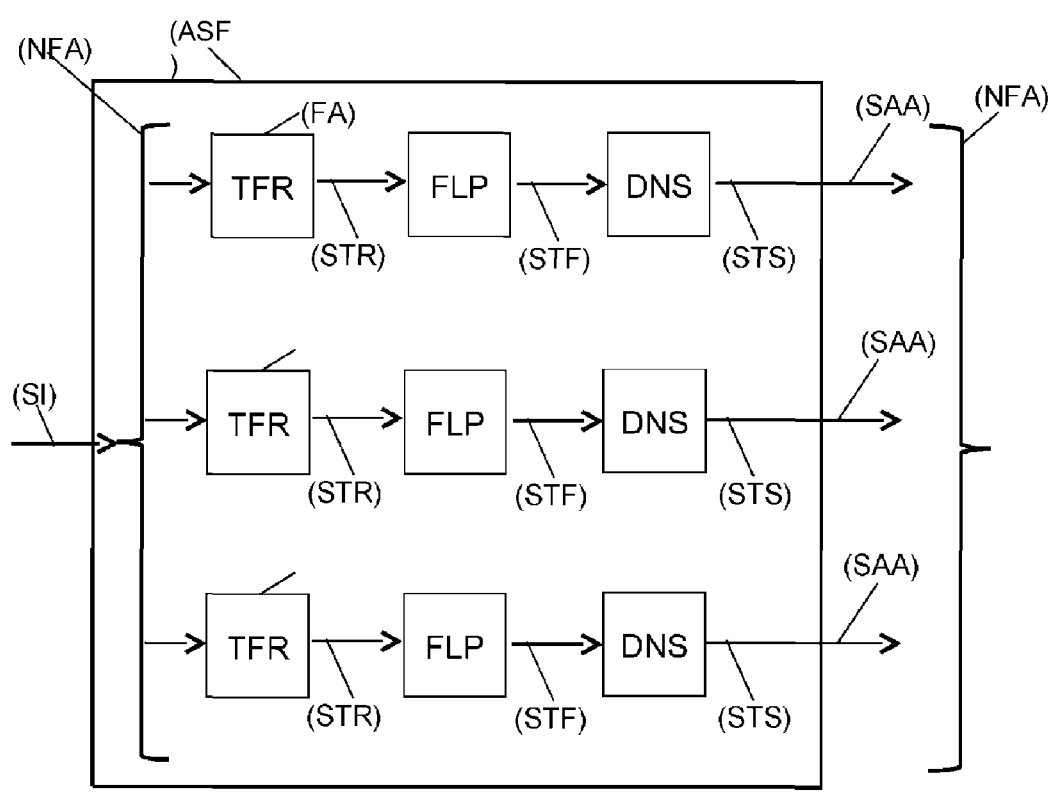
FIGS. 2 to 6 show block diagrams describing various aspects of the working of the invention.
Figure 3:
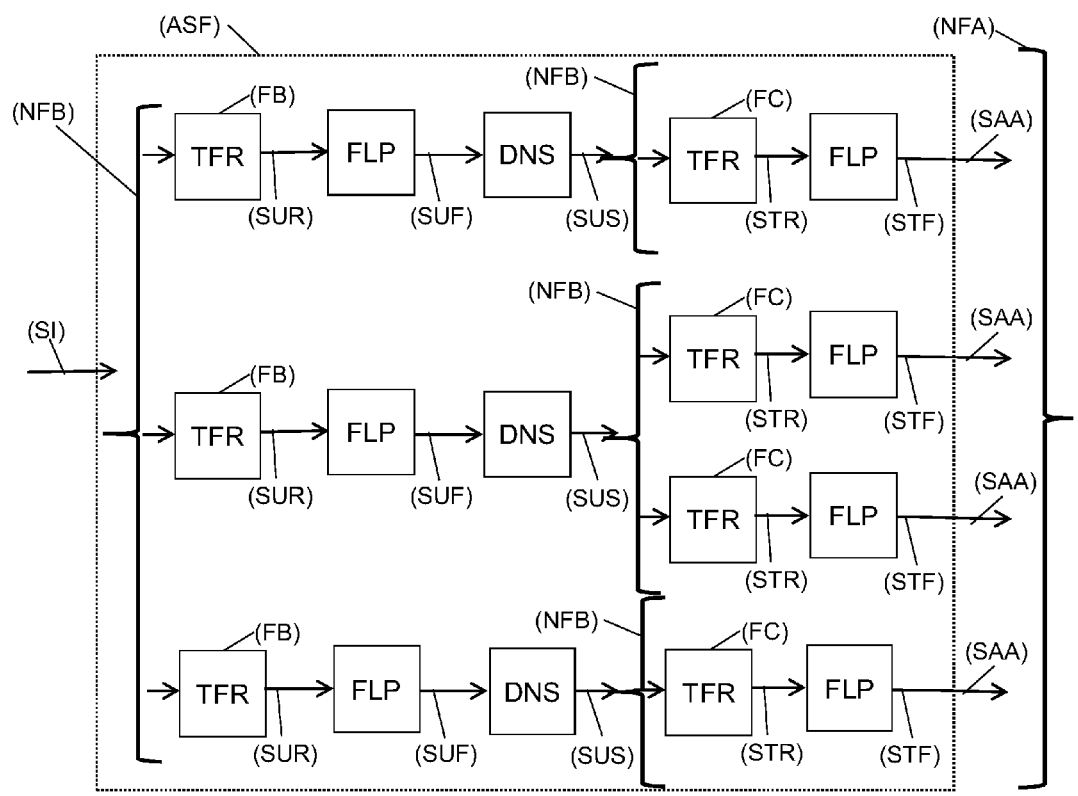

7) Other Possibilities for Generating Analysis Signals (SAA)
Reference 8. Lawrence Rabiner, Ronald Crochiere "A novel implementation for Narrow band FIR digital filters" indicates a method for obtaining a narrowband frequency filtering (and thus a priori carried out with a long filter) with the following series of operations (for a lowpass filter):
ND1) an alternation of following operations:
ND11) lowpass filtering (with a filter short most of the times)
ND12) Undersampling
ND2) an alternation of following operations:
ND21) Oversampling by a factor equal to the undersampling factor in the corresponding step in the alternation ZD1
ND22) Lowpass filtering (with a filter short most of the times)
(See in particular FIGS. 2 and 5 of said reference)

One notes that the signal obtained at the end of sequence ND1 defined above can be an analysis signal (SAA). One notes also that the series of steps described above can be used jointly with Frequency Translations, and the latter can be positioned freely in the ND1 sequence of operations.

In particular, one notes that if one uses as lowpass filters iterated short averages (averages on 2 to 6 samples for examples), one obtains as output of the sequence ND1 an analysis signal (SAA), and that the frequency response of the filter thus obtained is Gaussian. 8) Common points between the different possibilities for generating analysis signals (SAA)

In the preceding points, one notes the following points:
a) Reference 2 indicates that the constitutive elements of a Sliding Fourier Transform (TFG) are a complex Frequency Translation (TF) and a lowpass filtering
b) Reference 8 indicates that it is possible to carry out a narrowband lowpass filter by the means of a sequence of alternations of elementary lowpass filtering and undersampling operations, followed by a symmetrical alternation of oversampling operations followed elementary lowpass filterings
c) Within the framework of the invention, in order to generate analysis signals (SAA) of wideband monocomponent type and limited auto interference one can:
c1) either carry out a Sliding Fourier Transform (TFG) followed by a subsampling operation followed by a second short Sliding Fourier Transform (TFG)
c2) either make a series of alternations of lowpass elementary filterings and subsampling operations, within which one carries out complex Frequency Translations (TF)
According to previous observations, these two embodiments are equivalent, and other embodiments will also be able to be equivalent.

One can thus unify and summarize in the following way the principle of step (ASF) of frequency selective analysis:
AS1) a series of undersampling operations, each composed of a lowpass or bandpass frequency filtering and a corresponding suppression of samples
AS2) zero or more lowpass or bandpass frequency filtering not followed by a corresponding suppression of samples
AS3) at least one complex Frequency Translation (TF) which brings the analysed frequency (FA) to an operating frequency (FTA) adapted to compute instantaneous Amplitude (AIS) and to an operating frequency (FTP) adapted to compute instantaneous Phase (PIS) and instantaneous Frequency (FIS) of the analysis signal (SAA)
such as the combined effect of sub-steps AS1) and AS2) is that, apart from transient periods, each analysis signal (SAA) contains at most one elementary signal (SEL) of dominant amplitude, and this elementary signal (SEL) of dominant amplitude fills at least 30% of the spectrum of analysis signal (SAA)
Indeed:
SA1) One or more complex Frequency Translation (TF) are invertible operations and do not change the bandwidth of a signal or the relative amplitudes of two signals SA2) The effect of one undersampling operation, composed of a lowpass or bandpass frequency filtering and a corresponding suppression of samples is to widen the frequency spectrum (expressed in normalized frequencies) of a signal that was presaved following the lowpass or bandpass frequency filtering SA3) Transient periods are a particular case during which any signal shows a high instantaneous amplitude in a very wide frequency band, larger than the one it has in stationary state SA4) In order to have an analysis signal (SAA) that can be easily interpreted and which presents (except frequency translation towards the null frequency (F0) or an adjacent frequency) an instantaneous frequency that is always of the same sign, it is important that a single elementary signal (SEL) is in practice involved in the computation of this instantaneous frequency. For this reason an elementary signal (SEL) from initial signal (SI) must be dominant in the frequency spectrum of the analysis signal (SAA). In practice, one notes that a 20 dB dominance is enough, and that a 10-15 dB dominance is often enough SA4) A signal that fills at least 30% of the spectrum of possible frequencies is generally considered a wideband signal.

SA5) The interest of such a wideband signal within the framework of the invention is double:

in the frequency domain, the dynamics of instantaneous frequency and phase information is as high as possible in the time domain, by virtue of the principle of duality between time and frequency, the auto-correlation of the studied signal can be very low Within this context, Reference 8 and Reference 2 indicate what are the conditions to allow a reconstruction of the initial signal (SI) starting from the plurality (NFA) of analysis signals (SAA) corresponding each to one of the analysed frequencies (FA) of said plurality (NFA).

9) Extraction of Parameters of Analysis Signals (SAA)

One wishes to extract instantaneous amplitude, instantaneous phase information from an analysis signal (SAA). On notices that in order to generate such analysis signals (SAA) starting from the initial signal (SI), undersampling operations may have been carried out. As such, it is thus important to have this information for each sample of the analysis signal (SAA). This makes not very advantageous the computation of a Fourier transform by algorithm of the type of <<FFT>> (Fast Fourier Transform).

In addition, due to the nature itself of analysis signals (SAA), it is important to avoid any long filtering operation that is not followed by an undersampling operation.

Previous elements make thus not very advantageous the classical methods for computing the instantaneous values by the means of the analytical signal, this analytical signal being computed by Fourier Transform or by a time domain filter which carries out a Hilbert Transform, and the performance of which is all the better when the filter is long.

In those conditions, computation of these instantaneous values by the methods of Reference 3. The patent application PCT/BE2011/000052 filed on Aug. 12, 2011 <<Procédé d'Analyse de signaux fournissant des fréquences instantanées et des transformées de Fourier Glissantes et dispositif d'Analyse de signaux>> turn out to be particularly advantageous because these values can be easily computed for each sample of the signal, and no additional filtering is necessary in the context of a frequency selective analysis.

Reference 6. Sylvain Marchand "The simplest analysis method for non-stationary sinusoidal modeling", which evaluates the performances of a comparable method, indicates that the performances of this method in terms of detection of modulations that are present in a signal is comparable to the best methods known.

Figure 4:
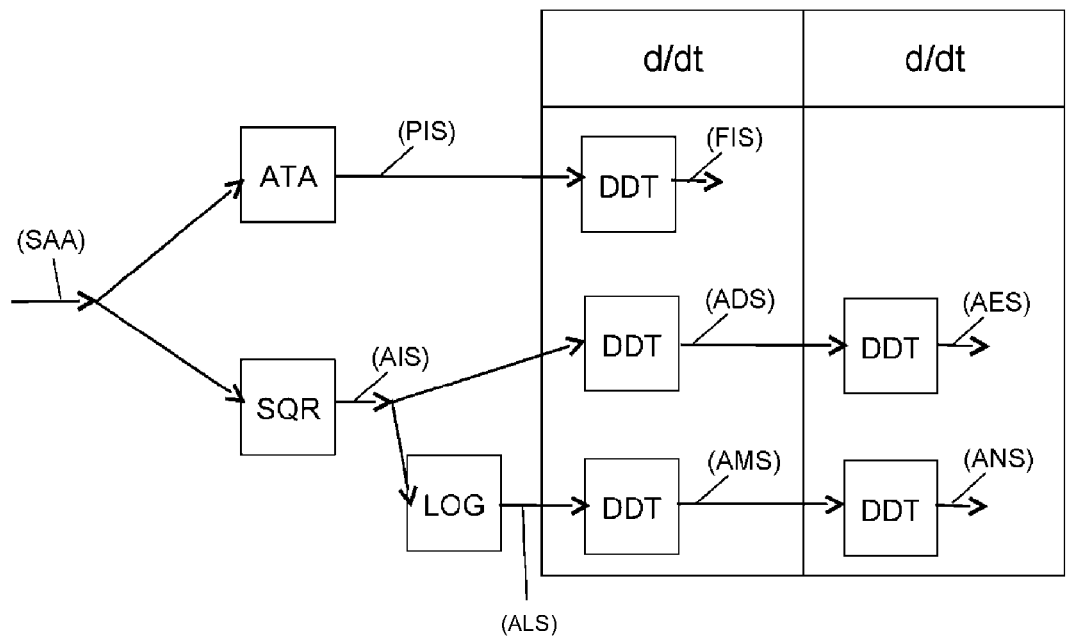
Figure 5:
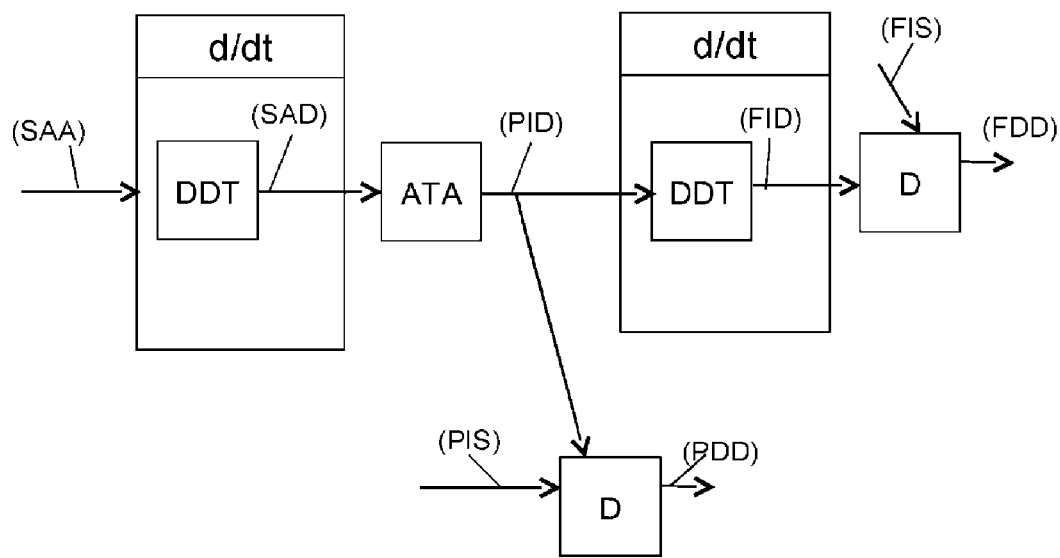
Figure 6:
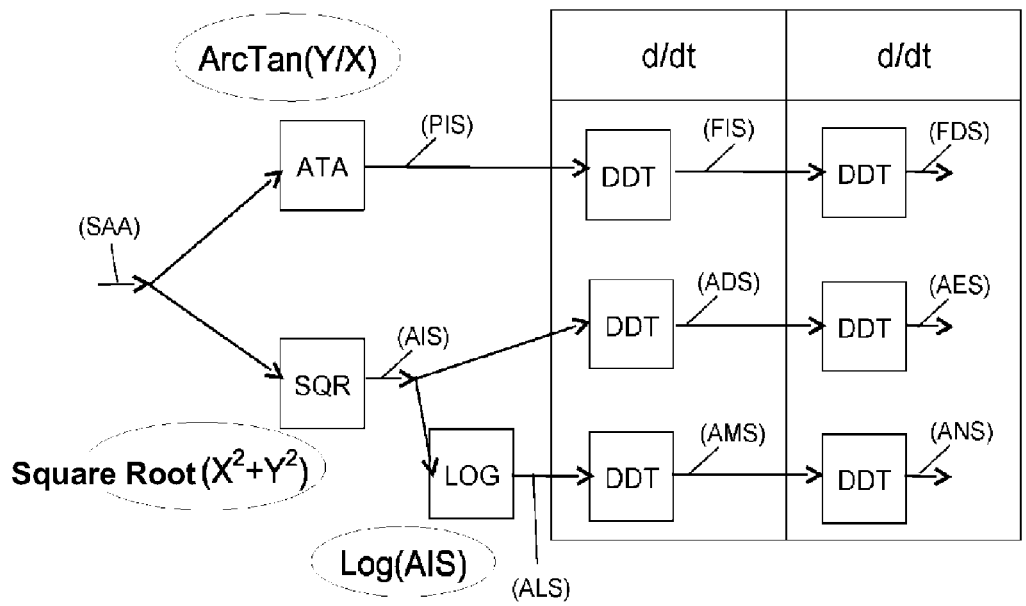

FIGS. 4, 5 and 6 describe the sequence of operations that result in the extraction and in the computation of the set of parameters and information that will be used later to detect the presence of a modulation or of a signal.

The computation of the information coming from instantaneous Phase (PIS) of the analysis signal (SAA) or instantaneous Phase (PID) of the derivative signal (SAD) can be done at any frequency, but is carried out more easily at the null frequency (F0) or at frequency (F4) equal to one quarter of the sampling frequency (FE).

Reference 12. Boualem Boashash "Estimating and Interpreting the Instantaneous Frequency of a Signal—Part 2: Algorithms and Applications" indicates various methods to compute an instantaneous Frequency, other than the ones described in Reference 3. In the sequence of this document, it will be supposed for simplicity that the instantaneous Frequency is computed as the time derivative of instantaneous Phase.

For the computation of instantaneous Amplitude within the invention, the method of Reference 3 is particularly adapted because of its simplicity and the absence of required additional filtering. It is often enough to compute Square Root of $X^2+Y^2$, X and Y being the real and imaginary parts of complex signal of frequency close to frequency (F4) equal to one quarter of the sampling frequency (FE). If the instantaneous frequency of the signal moves away from said frequency (F4), the result is all the less accurate as one goes away from said frequency (F4). Within the framework of the invention, this limit does not pose a problem because the accuracy remains enough for the signals considered and the computation of indicators.

In the sequence of the document, one will compute the instantaneous Amplitude with the method of Reference 3 that is as the square root of the sum of the squares of the coordinates of the complex signal.

Notations:

d/dt and DDT operation mean time differentiation of the input signal operation D means difference between the two input signals operation LOG means logarithm of the input signal (an instantaneous Amplitude, which is thus positive or null, with a specific processing for the null values of instantaneous Amplitude Instantanée, as will be seen later)

operation ATA means Arc Tangent of complex signal in input (ArcTangent(Y/X))

operation SQR means Module of the complex signal in input (Square root of $X^2+Y^2$)

10) Interest of the Parameters Coming from the Time Derivative of Analysis Signals (SAA)

The computation hereunder shows that the following parameters are linked by a simple relation and independent of signal S(t), supposed to be differentiable and with amplitude greater than zero on a time interval:

a) the instantaneous Frequency (FIS) of the analysis signal (SAA), which is the time derivative of the instantaneous phase (PIS) of the analysis signal (SAA)

b) the time derivative (ADS) of the logarithm of the instantaneous Amplitude of the signal (AIS) of analysis signal (SAA)

c) the phase difference (PDD) between instantaneous phase (PIS) of analysis signal (SAA) on one side and the instantaneous phase (PID) of the derivative signal (SAD) on the other Relation between instantaneous Frequency and the variation of the instantaneous Amplitude of a signal:

$$S(t)=A(t)\cdot\exp(j\cdot P(t)) \text{ with } A(t)>=0$$

$$dS(t)/dt=\exp(j\cdot P(t))\cdot[dA(t)/dt+j\cdot A(t)\cdot dP(t)/dt]$$

with $A(t)>=0$

With a change of notation to simplify the writing of the derivatives, one obtains:

$$S'(t)=\exp(j\cdot P(t))\cdot[A'(t)+j\cdot A(t)\cdot P'(t)]$$

with $A(t)>=0$

If $A(t)>0$, one can write:

$$S'(t)=S(t)\cdot[(A'(t)/A(t))+j\cdot P'(t)] \text{ with } A(t)>0$$

One defines: $LA(t)=Log(A(t))$, then:

$$S'(t)=S(t)\cdot[LA'(t)+j\cdot P'(t)] \text{ with } A(t)>0$$

One can deduce that:

$$\text{Phase}(S'(T))=\text{Phase}(S(T))+\text{Phase}[LA'(t)+j\cdot P'(t)]$$

One defines:

$$D\text{Phase}(t)=\text{Phase}(S'(T))-\text{Phase}(S(T))$$

Then:

$$D\text{Phase}(t) = \text{Phase}[LA'(t) + j\cdot P'(t)] = \text{ArcTan}(P'(t)/LA'(t))$$

Thus the following relation (RPA):

$$P'(t)/LA'(t)=\text{Tangent}(D\text{Phase}(t))$$

Notations: j is the square root of −1, exp( ) represents the exponential function, and F'(t) represents the time derivative of function F(t)

Relations between a complex signal and its time derivative are known, and the two following references deal with these relations:

Reference 5. Sylvain Marchand, Philippe Depaille "Generalization of the derivative analysis method to non-stationary sinusoidal modeling" Proceedings of the 11th conference of Digital Audio Effects (DAFx-08), September 2008

Reference 7. François Auger, Eric Chassande Motin, Patrick Flandrin, "On Phase Magnitude Relationships in the Short Time Fourier Transform" IEEE Signal Processing Letters Vol 6, No 1, January 2012

An important point is that, in the present invention, and contrary to the two quoted references (and to numerous others), no quotient or no division of any kind of quantities linked to signals are computed, only differences of instantaneous phase and/or frequency between a signal and its derivative are computed, which changes the nature of computations that are carried out.

In particular, the time derivative of the signal generally is only involved in through its instantaneous phase or its instantaneous frequency. One notes also that the very definition of the analysis signals (SAA) makes the phase information, and thus the information which are derived from it, particularly interesting and easy to use.

The phase amplitude relation (RPA) defined in the above computation will be used within the framework of the invention to define in which condition the phase difference (PDD) between the instantaneous phase (PIS) of the analysis signal (SAA) on one side and on the other side the instantaneous phase (PID) of the derivative signal (SAD), is constant in time, that is when the instantaneous Frequency (FIS) of the analysis signal (SAA) is equal to the instantaneous Frequency (FID) of the derivative signal (SAD).

Particular cases of the phase amplitude relation (RPA) in relation with the invention in which DPhase(t) is constant:
A) Tangent(DPhase(t))=0=>
   P'(t)=0=> P(t) is constant: Impossible
B) Tangent(DPhase(t))=plus or minus infinite=>
   DPhase(t)=+PI/2 ou −PI/2
   LA'(t)=0=> A(t) is constant and P(t) arbitrary=>
   Frequency Modulation with constant Amplitude
   Signal and its time derivative are in quadrature
C) P'(t)=constant=> Signal with linear Phase
   LA'(t)=constant=> $A(t)=\exp(K\cdot t)$ or $\exp(-K\cdot t)$
   Exponential Amplitude (can in the limit be constant)
   Signal with limited duration (except at the limit when amplitude is constant)
D) P'(t)=proportional to time=> Signal with quadratic Phase
   LA'(t)=proportional to time
   $A(t)=\exp(K\cdot t^2)$ or $\exp(-K\cdot t^2)$
   Amplitude with a variation more than exponential
   Impulse like Signal or constant signal constant ou gaussian type signal 11) Detailed Computation of the Modulation and Presence Indicators 11.1) General Principles and Observation Durations The indicators are available for each new sample (SAE) of an analysis signal (SAA) and are relative to an observation duration of (DOB) samples of the initial signal (SI).

In order to increase the reliability of observations, it might be advantageous to observe the evolution of previous indicators on a coherence checking duration (DMC), equal for example to 3 or 5 times the observation duration of (DOB) samples of the initial signal (SI), by observing in particular:

a) the temporal evolution of each indicator (on which duration the indicator stays roughly constant?)

b) the significant temporally joint evolutions of several indicators (do some indicators show significant variations at the same time instant?)

c) the degree of coherence of the information provided by the various indicators In the following of the description, one will be mainly interested by the observations made on observation duration of (DOB) samples of the initial signal (SI), by indicating if applicable what improvements can be brought by a longer observation duration.

11.2) Common Points Among the Computations of the Various Indicators

Most of the indicators compare a value or a difference to a constant value (zero or +−PI/2 which can be reduced to a comparison with zero). In all cases the proximity relative to zero must be computed as the ratio (expressed for example as a percentage) between an instantaneous value on one side and an average observed on a period equal to or greater than the observation period of (DOB) samples of the initial signal (SI), and which can advantageously be the coherence checking duration (DMC), equal for example to 3 or 5 times the observation duration of (DOB) samples of the initial signal (SI).

Except particular cases, one will consider that an instantaneous value is close to zero if, in magnitude, it is less than 5% or 10% of the previously defined average.

One will notice that the general shape of the indicators (levels of ripple and noise especially) depends on many factors such as: nature of the useful signal (SU) observed, level of added noise (BRA), type of lowpass or bandpass filtering carried out without corresponding sample suppression (for example in the observations previously described the nature of the Sliding Fourier Transform (TFG) carried out after the operations of sample suppression has an important impact on the noise observed in the indicators). Within that perspective, it will be advantageous to define the detail of the computation of the indicators in a context of typical observations.

11.3) Logical Relations Between the Computations of the Various Indicators

In a general way, the indicators can be computed and interpreted independently one from the other. The exceptions to this principle are the following:

a) The indicator of non-significant signal (INS) makes the other indicators invalid when it is set to true because of the low value of the instantaneous Amplitude (AIS) of the analysis signal (SAA)

b) The indicator of non-significant signal (INS) is set to true by the other indicators if an incoherence is observed on these indicators (see the observations made on the chirp for such an example of incoherence)

c) The joint observation of indicators on the coherence checking duration (DMC) allows to increase the reliability granted to an indicator because of its constant behavior during this period, or on the contrary to consider that it is a transient phenomenon if for example the indicator has a constant value during this period except at an isolated instant.

11.4) Computation of the Indicator of Non-Significant Signal (INS)

This indicator is false by default, and true if one of the following conditions is met:

either instantaneous Amplitude (AIS) has, on the observation duration of (DOB) samples of the initial signal (SI) an average value less than a first limit (AS1) defined in advance or a minimal instantaneous value less than a second limit (AS2) defined in advance or other observed indicators have a contradictory behavior Points 11.2 and 11.3 above explain the computation of this indicator in the two mentioned cases. One will note that, in most applications, a maximum amplitude level is in general known or at least anticipated. It is indeed the case when there exists an automatic gain control (CAG) which regulates the maximum amplitude.

11.5) Computation of Sinusoidal Amplitude Modulation Indicator (IAS)

This indicator indicates to which extent the first time derivative (ADS) of instantaneous Amplitude (AIS) on one side and on the other the second time derivative of instantaneous Amplitude (AIS) are in quadrature.

Within the framework of the invention, one will state that two signals are in quadrature if the following conditions are met:

Q1) The local maxima, local minima and passages by zero of each signal are presented as the following repetitive form: extremum local of one sign (local maximum positive or local minimum negative)/passage by zero/ local extremum of the other sign (local minimum negative or local maximum positive)/passage by zero/ . . . .

Q2) The passages by zero of each signal correspond to the maxima and to the minima of the other The goal is to detect signals that are comparable to a sinus and a cosinus, and it is known that:

a) a sinus and a cosinus of a same variable present these characteristics; and b) the time derivative of a sinus is a cosinus, and conversely.

These conditions Q1 and Q2 allow to define four sub-indicators which respectively measure respect of Q1 condition Q1 and the respect of condition Q2, and this for each of the two signals. The global indicator can then be composed with the four sub-indicators.

When one of the signals is the time derivative of the other, one must take into account a time shift of one sample.

11.6) Computation of the Exponential Amplitude Modulation Indicator (IAE)

This indicator indicates to which extent the first time derivative (ADL) of the Logarithm of the instantaneous Amplitude (AIS) is constant.

Points 11.2 and 11.3 above explain the computation of this indicator.

11.7) Computation of Detection of Peaks of Amplitude Modulation Indicator (IPA)

This indicator indicates to which extent the second time derivative (AEL) of the Logarithm of the instantaneous Amplitude (AIS) presents an amplitude peak that is important and limited in time.

Detection of an isolated amplitude peak is a well-known problem. Here one may study the shape of the last 4 or 5 samples and deduct if there is a peak or not.

The possible periodicity of the observed peaks gives typically an important information.

11.8) Computation of the Frequency Modulation Indicator (IFM)

This indicator indicates to which extent the first time derivative (FDS) of the instantaneous Frequency (FIS) of the analysis signal (SAA), which is itself the first time derivative of the instantaneous Phase (PIS) of the analysis signal (SAA), is constant.

Points 11.2 et 11.3 above explain the computation of this indicator.

11.9) Computation of the Probability of Presence of a Signal Indicator (IPS)

This indicator indicates to which extent the difference (FDD) of instantaneous frequencies between the instantaneous Frequency (FIS) of the analysis signal (SAA) on one side and on the other the instantaneous Frequency (FID) of the derivative signal (SAD) is different from zero.

Points 11.2 et 11.3 above explain the computation of this indicator.

11.10) Computation of Frequency Modulation with Constant Amplitude Indicator (IMD)

This indicator indicates to which extent the difference between instantaneous Phase (PIS) of analysis signal (SAA) on one side and on the other the instantaneous Phase (PID) of the derivative signal (SAD) is sensibly equal to +PI/2 or −PI/2.

Points 11.2 et 11.3 above explain the computation of this indicator.

11.11) Computation of Signal Presence Indicator (ISP)

This indicator is computed in the following way when the indicator of non-significant signal (INS) is false:

4.1) if the exponential modulation indicator (IAE) indicates the presence of an exponential amplitude modulation, then the signal presence indicator (ISP) is true 4.2) if the probability of presence of a signal indicator (IPS) is different from zero, then the signal presence indicator (ISP) is true 4.3) if the frequency modulation with constant amplitude indicator (IMD) indicates such a modulation, then the signal presence indicator (ISP) is true 4.4) in the other cases the signal presence indicator (ISP) is false This indicator results from the application of logic tests to previously defined indicators.

12) Observations Made and Results Noticed 12.1) Processing Done

The observations were relative (unless otherwise stated) to information generated by the following processing, with a sampling frequency of 8.000 Hz:

TR1) Complex Frequency Translation to null frequency (F0)

TR2) Lowpass filtering and temporal decimation by a factor 10

TR3) Sliding Fourier Transform (TFG) of length 12 with a Hann window, the analysed frequency (FA) being the frequency (F4) equal to a quarter of the sampling frequency (FE)

One will note that the Sliding Fourier Transform (TFG) of length 12 with a Hann window presents an attenuation of less than de 5 dB on 50% of the frequency spectrum, which allows to have as output a wideband signal, while significantly reducing the noise that can be observed in the indicators.

The dotted line curve on top of FIGS. 10 to 15 represents the added noise (BRA).

12.2) Presentation of Results

Figure 10:
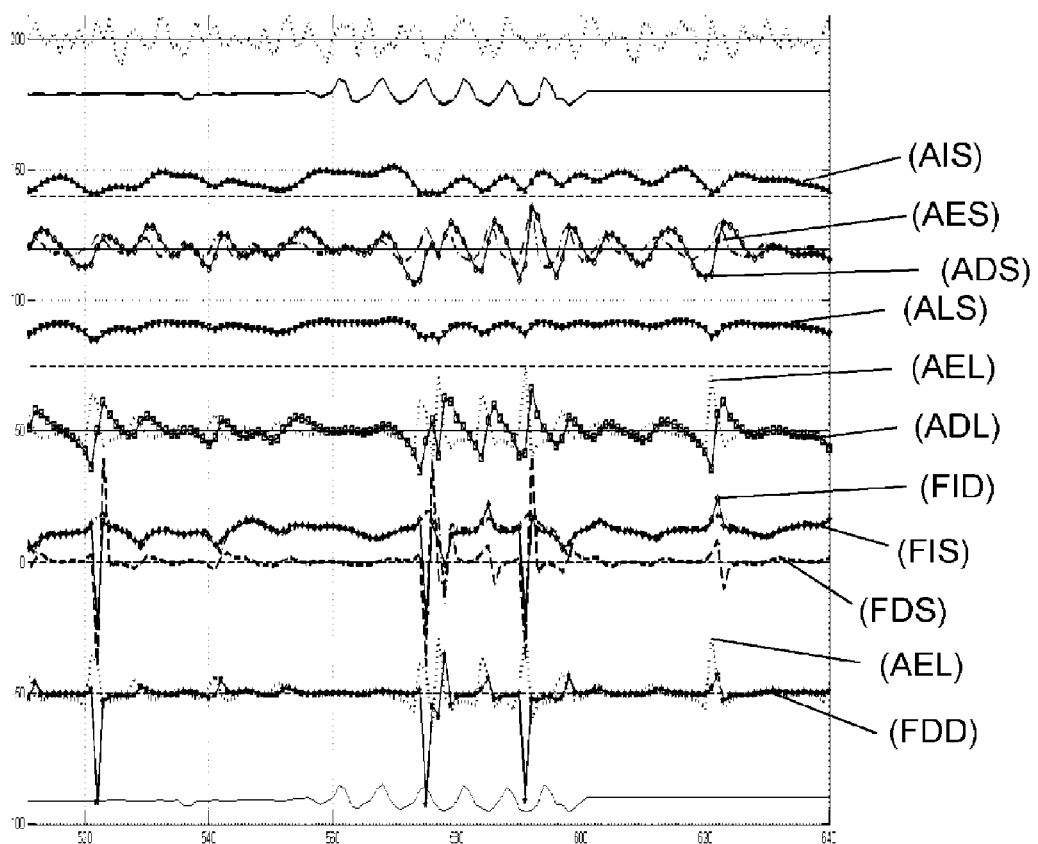
FIG. 10 show how the studied signals and parameters are displayed, with the designation of said parameters in correspondence.

FIG. 10 shows the various curves representing the observations that were made, with the designation of the names of the corresponding information:

The horizontal axis is the time axis (figures correspond to the sample numbers within a sequence of 6.000 samples)

The studied signals are represented on the following curves:

Between +150 and +200 the useful signal (SU) with no noise

At +200 the added noise (BRA)

At −100, the useful signal (SU) with no noise is repeated

The following curves describe the parameters that allow the computation of the indicators:

At +140, the instantaneous Amplitude (AIS) of analysis signal (SAA), as a continuous line with triangles having their tip on top At +120, the first time derivative (ADS) of the instantaneous Amplitude (AIS), as a continuous line with circles as markers At +120 also, the second time derivative (AES) of the instantaneous Amplitude (AIS), as a dashed line with no markers At +95, the logarithm (ALS) of the instantaneous Amplitude (AIS), as a continuous line with triangles with their tip at the bottom At +50, the first time derivative (ADL) of the logarithm (ALS) of the instantaneous Amplitude (AIS), as a continuous line with squares as markers At +50 also, the second time derivative (AEL) of the logarithm (ALS) of the instantaneous Amplitude (AIS), as a dotted line without markers At 0, the instantaneous Frequency (FIS) of the analysis Signal (SAA), as a continuous line with diamonds as markers At 0 also, the instantaneous Frequency (FID) of the derivative signal (SAD), as a dashed-dotted without marker At 0 finally, the time derivative (FDS) of the instantaneous Frequency (FIS) of the analysis Signal (SAA) as a dotted line At −50, repetition as dotted line without markers of the second time derivative (AES) of the logarithm (ALS) of the instantaneous Amplitude (AIS)

At −50, as a continuous line with pentagrams as markers, the difference (FDD) of instantaneous Frequencies between:

Instantaneous Frequency (FIS) of the analysis Signal (SAA)

Instantaneous Frequency (FID) of the derivative signal (SAD)

12.3) Observations on a Linear <<Chirp>> Type Signal

Figure 11:
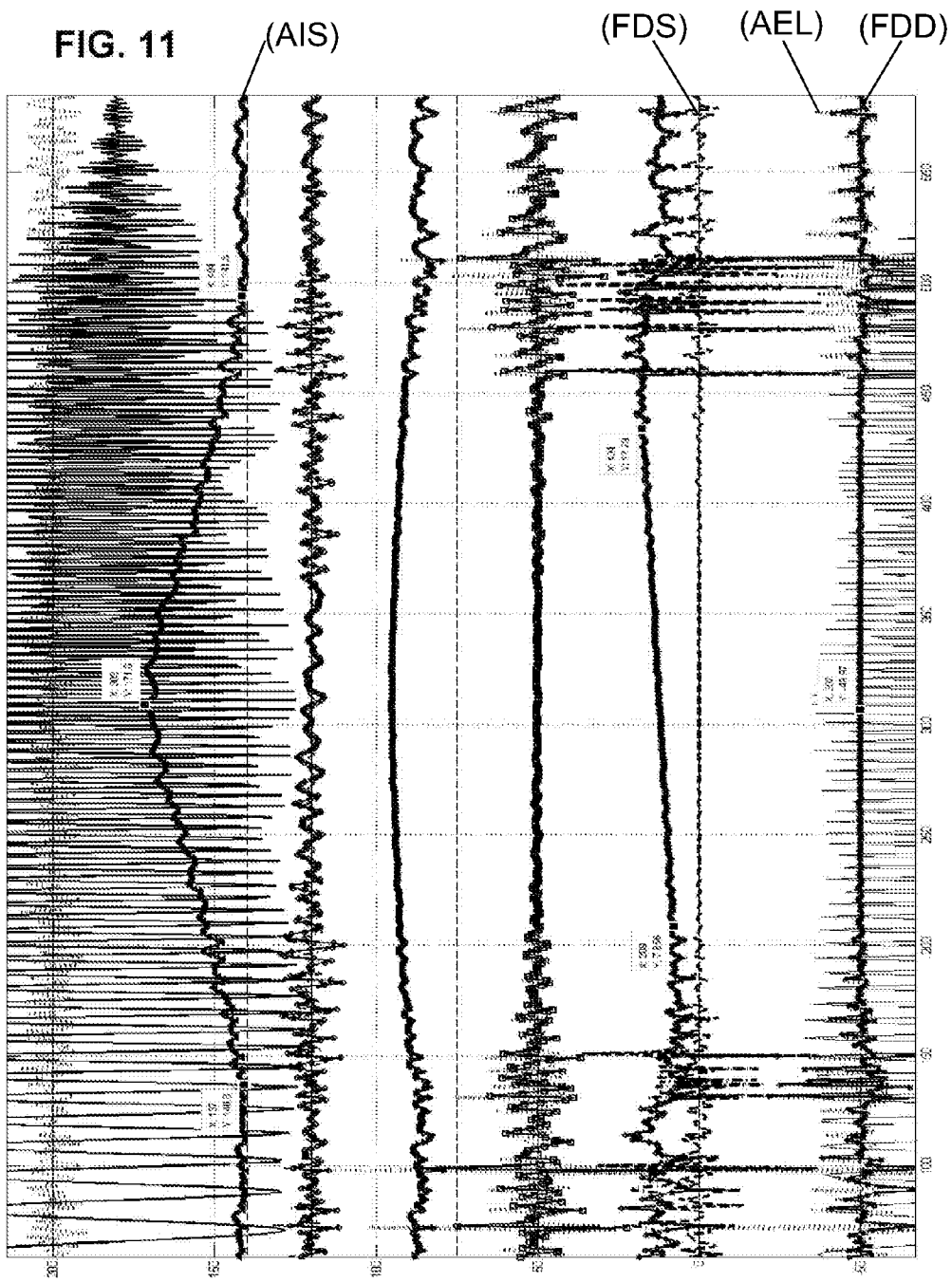
FIG. 11 show observations made with an input signal that is of constant amplitude and linearly frequency modulated (linear chirp).
Figure 12:
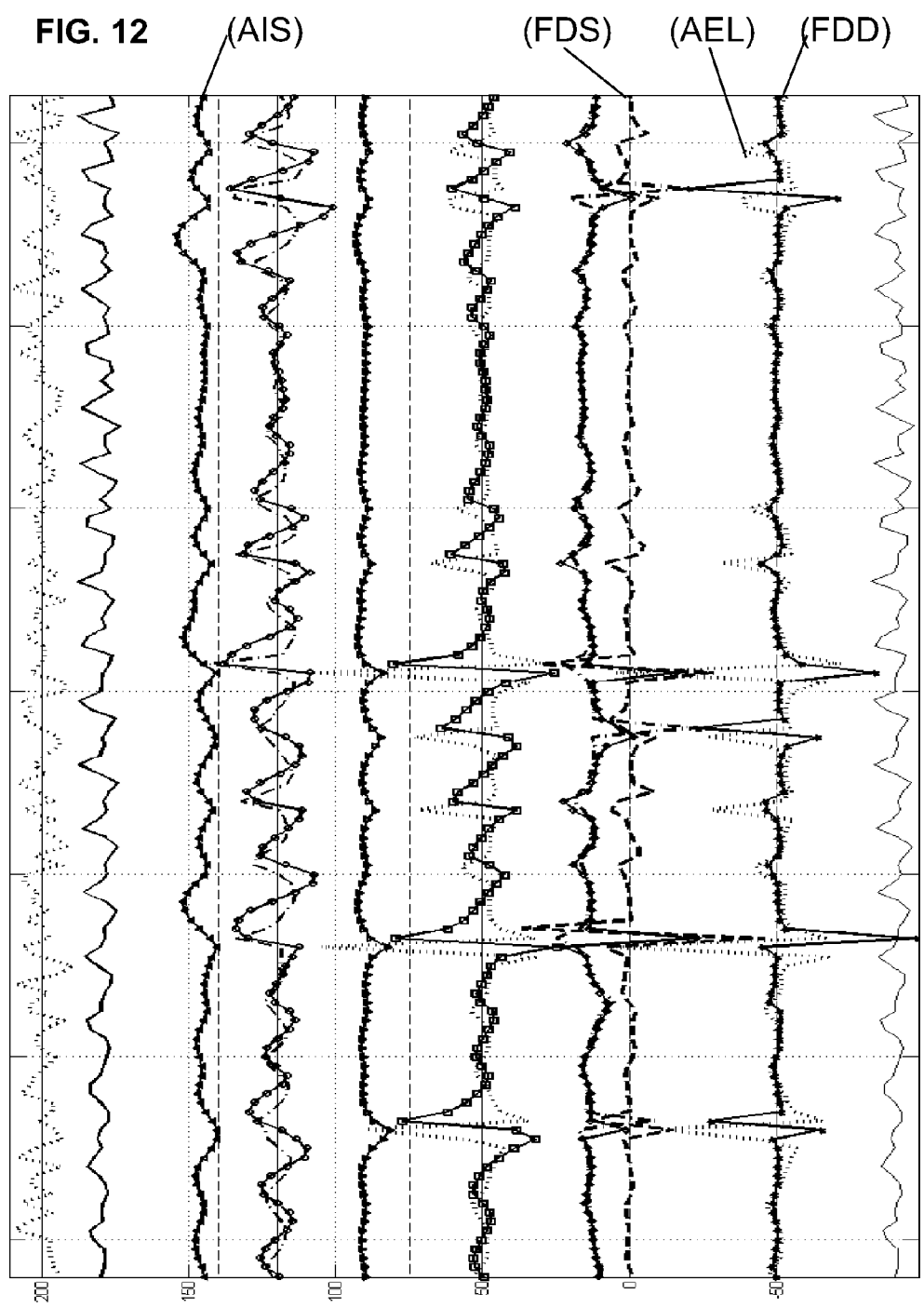
FIGS. 12 to 15 show observations made with the invention on the signal presented on FIGS. 7 and 8.
Figure 13:
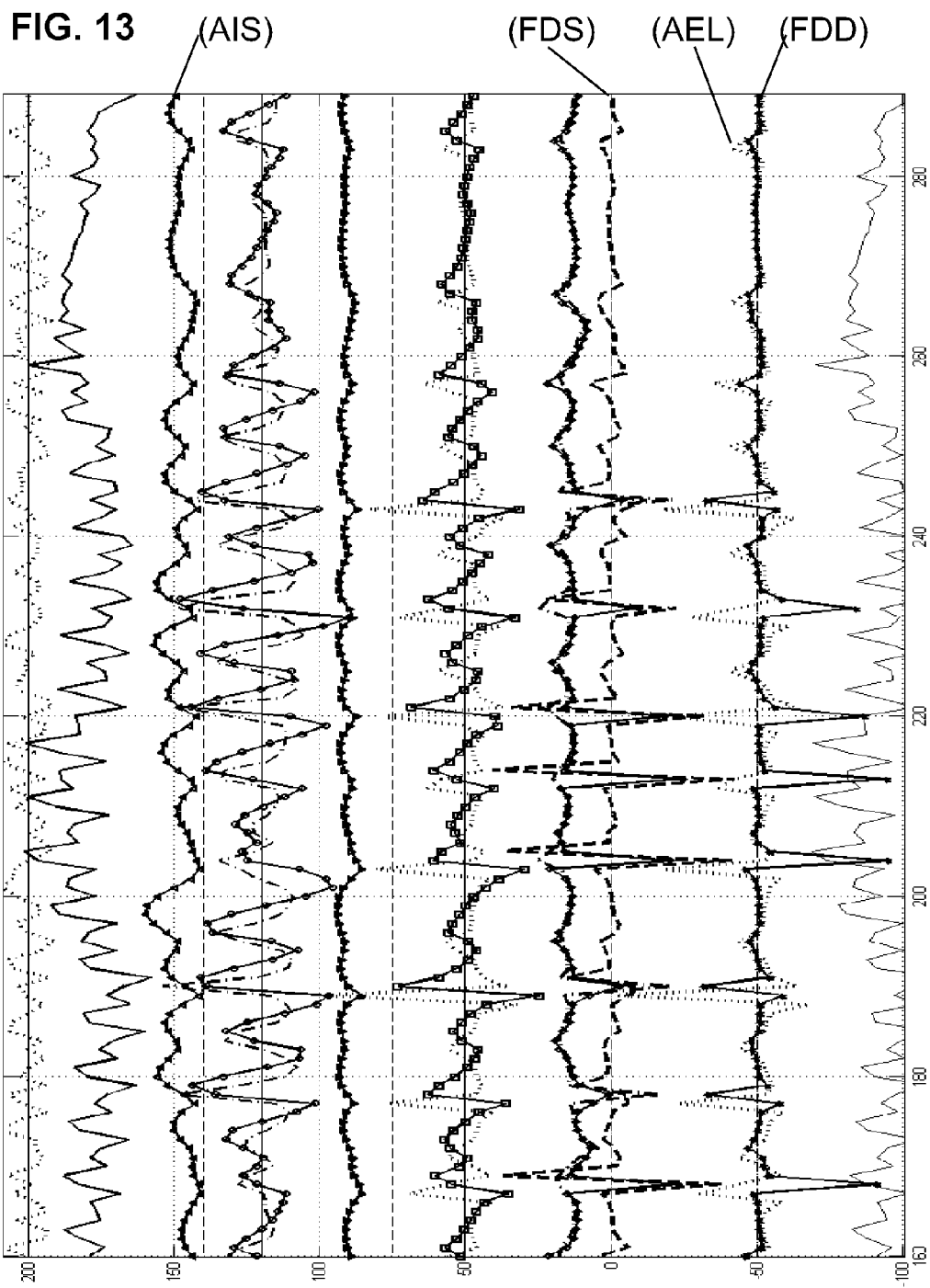
Figure 14:
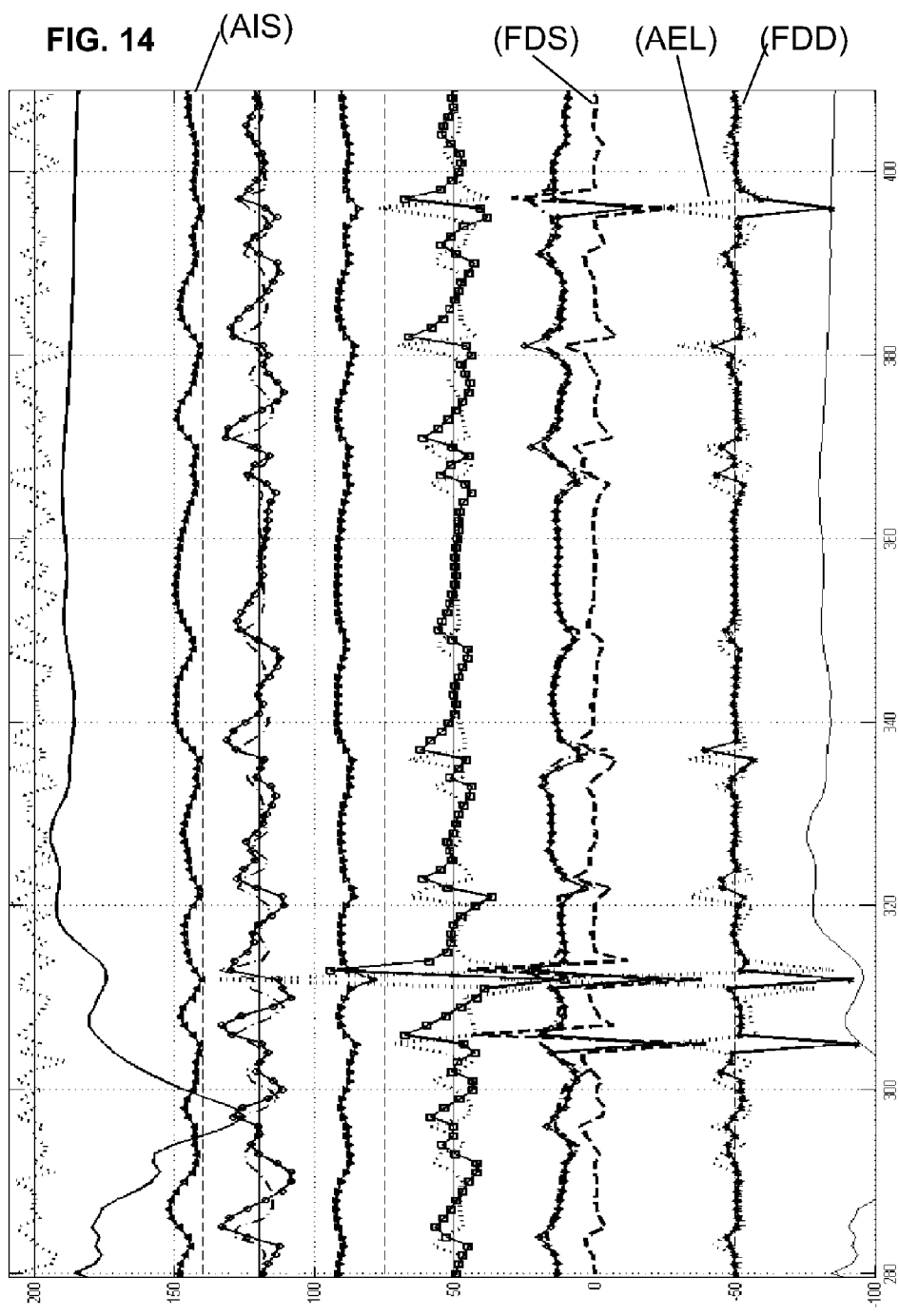
Figure 15:
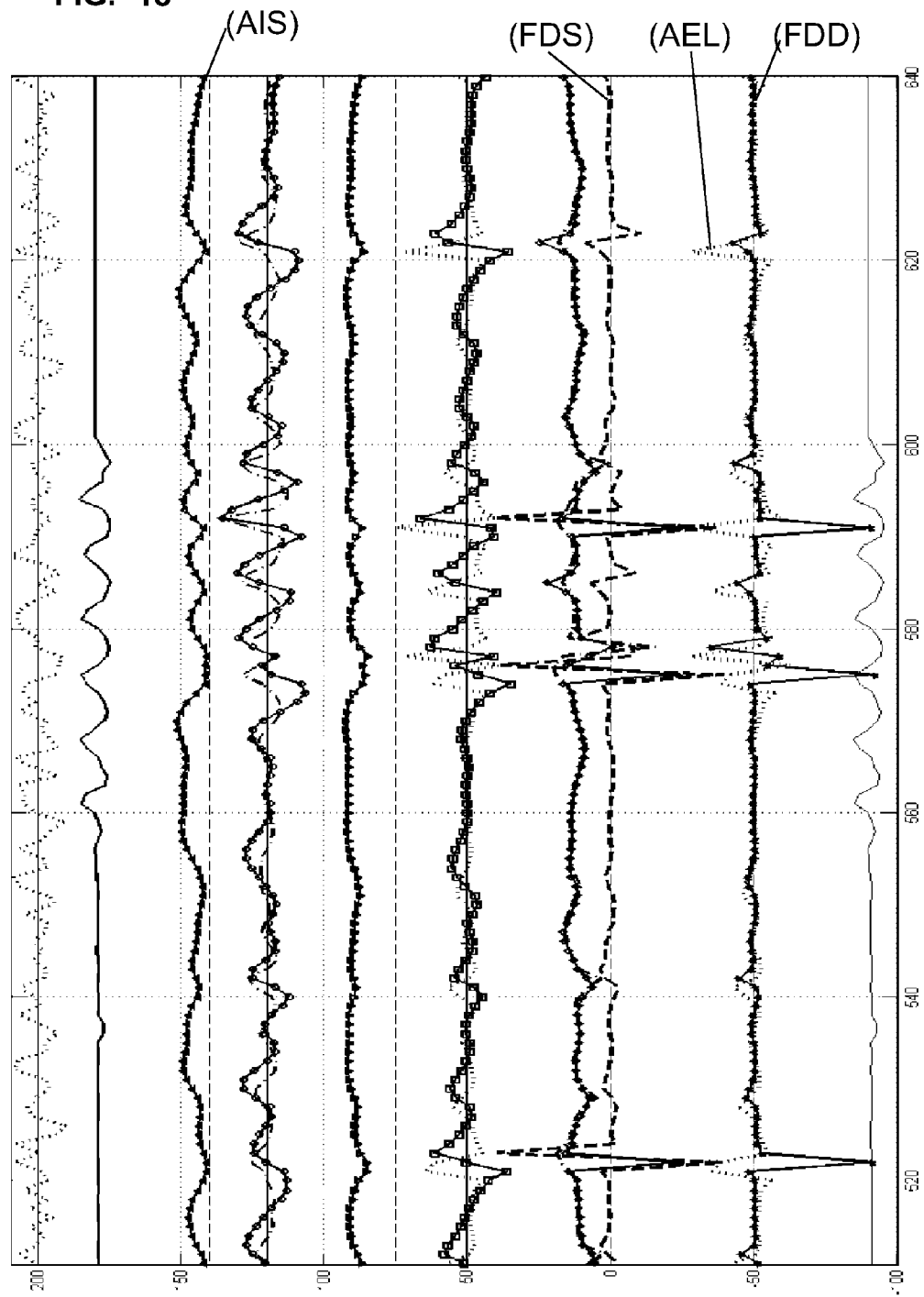

FIG. 11 shows observations made with a constant amplitude signal and linearly modulated in frequency from 0 to 400 Hz (linear chirp). One can notice the following points:

CH1) There exists two zones of very low amplitude before and after the amplitude peak (in the center of the figure). In those zones, indicators have values that do not represent reality CH2) One notices the indicators corresponding to the time derivatives of the logarithm of the instantaneous Amplitude (AIS) present strong variations and showing a structure, while the indicators relative to the time derivatives of instantaneous Amplitude (AIS) show variations which are less strong and little structured. These two types of variation are not compatible, except if one considers that the studied signal has a very low amplitude CH3) In the same way instantaneous Frequency variations less strong than the variations of the indicators relative to the time derivatives of the logarithm of the instantaneous Amplitude (AIS), which is not very likely if the instantaneous Frequencies (FIS) and (FID) of the analysis signal (SAA) and of the derivative signal (SAD) respectively stay roughly constant CH4) One has therefore an example of indicators with contradictory behaviors, which reinforce the probability that the instantaneous amplitude (AIS) is not enough for the other indicators to be valid.

Figure 7:
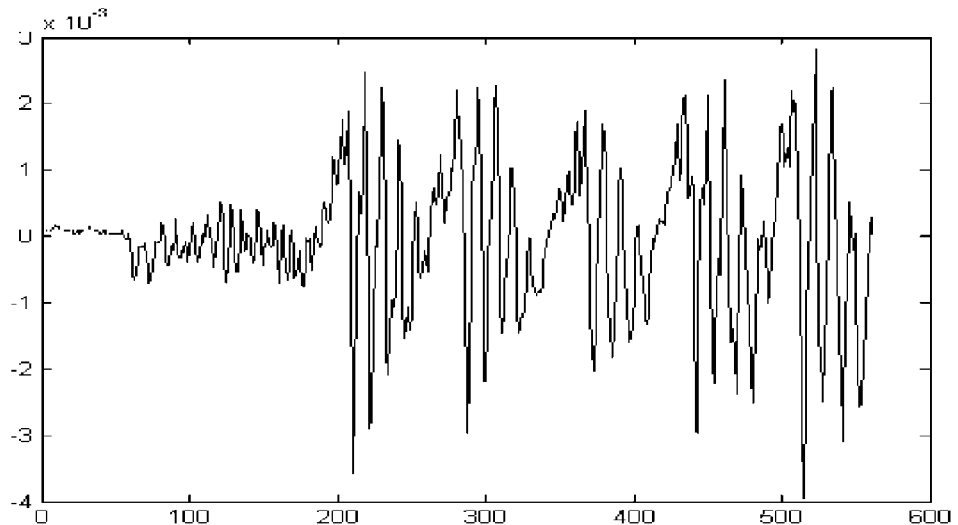
FIG. 7 shows the signal which is studied as an example, before any subsampling operation.
Figure 8:
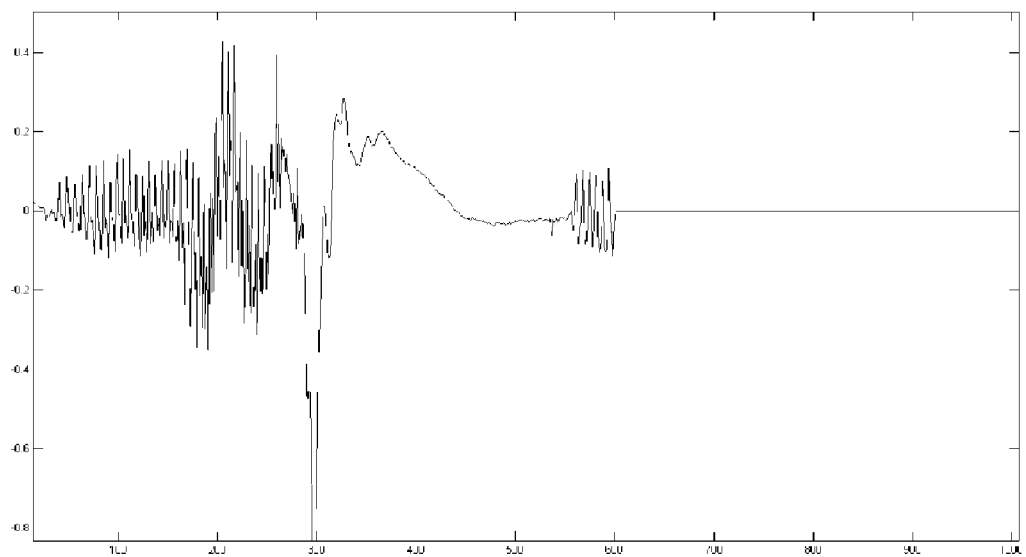
FIG. 8 shows the signal which is studied as an example, with no added noise, after subsampling.
Figure 9:
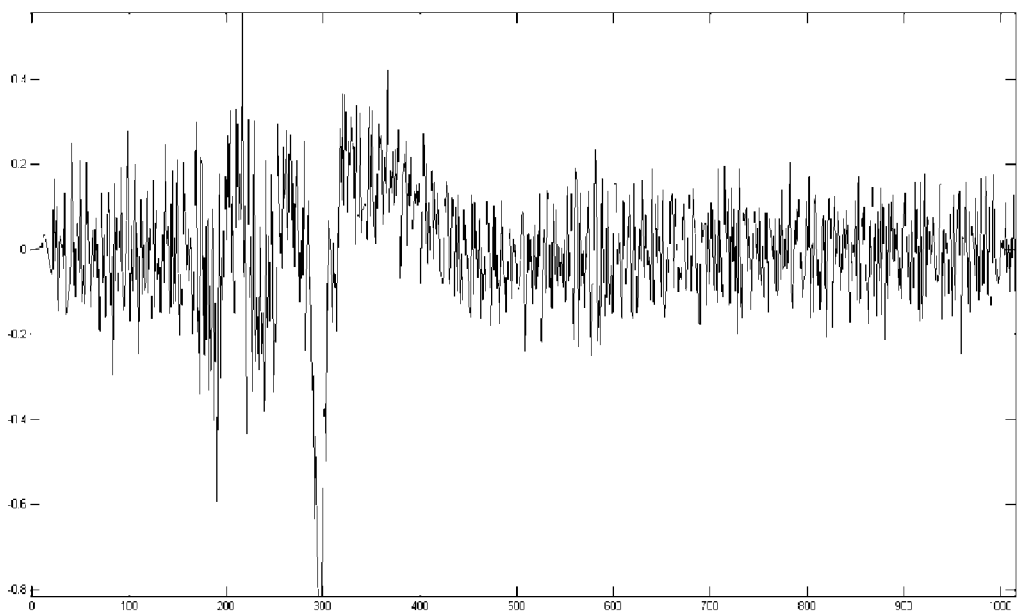
FIG. 9 show the signal studied as an example, with added noise, after sub sampling.

CH5) One finally observes that:

the instantaneous Frequency indicators have effectively a linear increase in part of the signal which has a sufficient amplitude for the indicators to be significant the probability of presence of a signal indicator, which corresponds to the difference of instantaneous Frequencies (FIS) and (FID) of the analysis signal (SAA) and of the derivative signal (SAD), indicates, as forecasted, a probable absence of signal since the studied signal is one of the exceptions (frequency modulation with constant amplitude) for this indicator, which necessitate the examination of other indicators to confirm the absence of signal 12.4) Observations on a Vocal Signal FIGS. 12 to 15 show observations made with the invention on the signal presented in FIGS. 7 and 8. One can notice the following points:

VO1) (FIGS. 12 and 13) At +120 and around sample 100, one an example of 2 indicators that are weakly in quadrature, but on a duration of 30 samples. These same indicators are more clearly in quadrature around sample 220

VO2) (FIG. 13) Between sample 200 and sample 220 one sees a concordance of several indicators for following the fundamental frequency of speech. One notices that the accuracy is not absolute and that the amplitude peak in 205 of speech signal is less well detected that the other peaks VO3) (FIG. 14) One sees that the absence of speech signal globally well detected by the signal presence indicator which presents only a few parasitic peaks, not very believable in the type of the concerned application VO4) (FIG. 15) One sees that the signal with amplitude comparable to the noise (see curve on top of figure) is globally detected. One will note that the amplitude peak of the speech signal in 568 is very difficult to detect because the noise and the speech signal are at this precise moment in antiphase.

VO5) One also notices a concordance between several indicators which all contribute to indicate the presence of a structured signal between samples 575 and 600:

the sinusoidal amplitude modulation indicator which detects signals in quadrature the indicators concerning the time derivatives of the du logarithm of the instantaneous Amplitude (AIS)

the instantaneous frequency indicators

One sees clearly in this example that uncertainty on the detection (and especially on the instant where a signal begins to be detected) would be less good.

13) Application to the Study of the Speech Signal

FIG. 7 is an extract of a speech signal digitized with a sampling frequency (FE) of 8.000 Hz.

One notices a complex structure, which makes notoriously difficult the detection of the fundamental frequency of the signal; this fundamental frequency is called <<pitch>>.

By comparison, the speech signal after lowpass filtering and suppression of samples which is represented on top and at the bottom of FIGS. 12 to 15 is much simpler, even if it has a lower time accuracy. The important point for the application of detection of the fundamental frequency of speech is that a peak of amplitude modulation is effectively present in the two representations of the speech signal (FIG. 7 and FIG. 8).

One can observe that the fundamental frequency is followed well by the indicators the peaks of which correspond to a position that is more or less constant relative to the amplitude peak of the speech signal represented on top and at the bottom of FIGS. 12 to 15.

The Reference 9. Wikipedia Article "Pitch Detection Algorithm", inventories the known methods to carry out this research of fundamental frequency. The Reference 10. Thomas F. Quatieri, "Discrete Time Speech Signal Processing", Prentice Hall publisher, 2002 details numerous aspects of digital processing of speech signal.

It is thus possible to detect the fundamental frequency of a speech signal by detecting the following elements:

VA) The significant amplitude peaks of at least one of the following indicators:

V1) the detection of amplitude modulation peaks indicator (ITA)

V2) the probability of presence of a signal indicator (IPS)

V3) the frequency modulation indicator (IFM)

VB) the concordance in time of the appearance of the amplitude peaks of the previous indicators The elements of the invention presented above thus describe a method for processing an initial signal (SI) by the means of a plurality (NFA) of analysed frequencies (FA) in said initial signal (SI), composed of a useful signal (SU) composed by a sum of elementary signals (SEL), representing a wave that propagates in a physical medium, to which an added noise (BRA) can be added, said method being carried out on a sequence of samples (SE), sampled at a constant sampling frequency (FE), obtained from an initial signal (SI)

said method comprising a frequency selective analysis step (ASF) providing starting from the initial signal (SI) a plurality (NFA) of analysis signals (SAA) of wideband monocomponent type and limited auto interference, each analysis signal (SAA) corresponding to one of the analysed frequencies (FA), said step comprising the following sub-steps:

AS1) a sequence of undersampling operations, composed each of a lowpass or bandpass frequency filtering and a corresponding suppression of samples AS2) zero or more lowpass or bandpass filtering operation not followed by a corresponding suppression of samples AS3) at least one complex frequency Translation (TF) which brings the analysed frequency (FA) to an operating frequency (FTA) adapted to compute the instantaneous Amplitude (AIS) and to an operating frequency (FTP) adapted to compute the instantaneous Phase (PIS) and the instantaneous Frequency (FIS) of the analysis signal (SAA)

such as that the combined effect of sub-steps AS1) and AS2) is that, apart from transient periods, each analysis signal (SAA) contains at most an elementary signal (SEL) of dominant amplitude, and this elementary signal (SEL) of dominant amplitude fills at least 30% of the spectrum of the analysis signal (SAA)

According to one aspect of the method, the operating frequency (FTA) adapted to compute the instantaneous Amplitude (AIS) is equal to frequency (F4) equal to a quarter of the sampling frequency (FE)

According to one aspect of the method, the operating frequency (FTP) adapted to compute the instantaneous Phase (PIS) and the instantaneous Frequency (FIS) of the analysis signal (SAA) is equal to either the null frequency (F0), or to frequency (F4) equal to a quarter of the sampling frequency (FE)

The elements of the invention presented above also describe a method for analysis of an initial signal (SI) by the means of a plurality (NFA) of analysed frequencies (FA) in said initial signal (SI), comprising a useful signal (SU) comprising a sum of elementary signals (SEL), representing a wave that propagates in a physical medium, to which an added noise (BRA) can be added, to provide presence parameters and a description of the modulations of each of the analysed frequencies (FA) of the plurality (NFA) of analysed frequencies, said method being implemented on a sequence of samples (SE), sampled at a constant sampling frequency (FE), obtained from an initial signal (SI), said method comprising following sequence of steps:

1.1) A frequency selective analysis (ASF) step providing starting from the initial signal (SI) a plurality of analysis signals (SAA) of wideband monocomponent type and limited auto interference, each analysis signal (SAA) corresponding to one of the analysed frequencies (FA), 1.2) A plurality (NFA) of operations (EXP) of extraction of parameters (PAS) of the analysis signals (SAA) for each sample (EAA) of the plurality (NFA) of analysis signals (SAA), these parameters comprising at least the following signals:

a) Instantaneous Amplitude (AIS) of the analysis signal (SAA)
b) Instantaneous Phase (PIS) of the analysis signal (SAA)

1.3) A plurality (NFA) of operations for estimation of the modulation of the signal (EMS) which each one determine for each sample (EAA) of the plurality (NFA) of analysis signals (SAA), and for a duration of (DOB) samples of initial signal (SI) the following indicator:
   a) an indicator of non-significant signal (INS), which is false by default and true either if the Instantaneous Amplitude (AIS) is, during the observation duration of (DOB) samples of the initial signal (SI) an average value lower than a first limit (AS1) defined in advance or an instantaneous value lower than a second limit (AS2) defined in advance or if other observed indicators have a contradictory behavior and at least one of the other following indicators:
   b1) a sinusoidal amplitude modulation indicator (IAS) which indicates to what extent the first time derivative (ADS) of instantaneous Amplitude (AIS) on one side and on the other side the second time derivative of instantaneous Amplitude (AIS) are in quadrature
   b2) an exponential amplitude modulation indicator (IAE) which indicates to what extent the first time derivative (ADL) of the logarithm of the instantaneous Amplitude (AIS) is constant
   b3) a detection of peaks of amplitude modulation indicator (IPA) which indicates to what extent the second time derivative (AEL) of the logarithm of the instantaneous Amplitude (AIS) has a large and limited in time peak
   b4) a frequency modulation indicator (IFM) which indicates to what extent the first time derivative (FDS) of the instantaneous Frequency (FIS) of the analysis signal (SAA), which itself is the first time derivative of the instantaneous Phase (PIS) of the analysis signal (SAA), is constant According to one aspect of the invention, Step 1.1 (ASF) of frequency selective analysis is implemented in the following way:
   AS1) a series of undersampling operations, each made of a lowpass or bandpass frequency filtering and a corresponding suppression of samples
   AS2) zero or more lowpass or bandpass frequency filtering operations,
   AS3) at least one complex Frequency Translation which brings the analysed frequency (FA) to an operating frequency (FTA) adapted to compute the instantaneous Amplitude (AIS) and to an operating frequency (FTP) adapted to compute the instantaneous Phase (PIS) and the instantaneous Frequency (FIS) of the analysis signal (SAA)
   such as that the combined effect of sub-steps AS1) and AS2) is that, apart from transient periods, each analysis signal (SAA) contains at most an elementary signal (SEL) of dominant amplitude, and this elementary signal (SEL) of dominant amplitude fills at least 30% of the spectrum of the analysis signal (SAA)

According to one aspect of the method, the operating frequency (FTA) adapted to compute the instantaneous Amplitude (AIS) is equal to frequency (F4) equal to a quarter of the sampling frequency (FE)

According to one aspect of the method, the operating frequency (FTP) adapted to compute the instantaneous Phase (PIS) and the instantaneous Frequency (FIS) of the analysis signal (SAA) is equal to either the null frequency (F0), or to frequency (F4) equal to a quarter of the sampling frequency (FE)

According to one aspect of the method, operations (EXP) of extraction of parameters (PAS) of the analysis signals (SAA) for each sample (EAA) of the plurality (NFA) of analysis signals (SAA), provide in addition the two following signals: parameters comprising at least the following signals:
   c) Instantaneous Phase (PID) of the time derivative signal (SAD) equal to the time derivative of an analysis signal (SAA),
   d) Instantaneous Frequency (FID), equal to the time derivative of said instantaneous Phase (PID) of the time derivative signal (SAD)

the operations for estimation of the modulation of the signal (EMS) determining at least of the other two following indicators:
   b5) an indicator (IPS) de probability of presence of a signal which indicates to which extent the difference (FDD) of instantaneous frequencies between the instantaneous Frequency (FIS) of the analysis signal (SAA) on one side and on the other the instantaneous Frequency (FID) of the derivative signal (SAD) is different from zero
   b6) an indicator (IMD) of frequency modulation with constant amplitude which indicates to which extent the difference between instantaneous Phase (PIS) of analysis signal (SAA) on one side and on the other the instantaneous Phase (PID) of the derivative signal (SAD) is sensibly equal to +PI/2 or −PI/2.

According to one aspect of the invention, a signal presence indicator (ISP) is computed in the following way when the indicator of non-significant signal (INS) is false:
   4.1) if the exponential modulation indicator l'indicateur (IAE) indicates the presence of an exponential amplitude modulation, then the signal presence indicator (ISP) is true
   4.2) if the probability of presence of a signal indicator (IPS) is different from zero, then the signal presence indicator (ISP) is true
   4.3) if the frequency modulation with constant amplitude indicator (IMD) indicates such a modulation, then the signal presence indicator (ISP) is true
   4.4) in the other cases the signal presence indicator (ISP) is false According to one aspect of the invention, the observation duration of (DOB) samples of the initial signal (SI) is on the order of 100 to 200 samples of the initial signal (SI).

According to one aspect of the invention, Step 1.1 (ASF) of frequency selective analysis providing starting from the initial signal (SI) a plurality (NFA) of analysis signals (SAA), comprises at least the following steps:
   11.1) A frequency translation operation (TFR), adapted to bring each analysed frequency (FA) to an operating frequency (FTR)
   11.2) A band pass frequency filtering operation (FFP), carried out by a bandpass filter (FPB), with central frequency equal to the operating frequency (FTR) and with effective bandwidth (FBW) equal to a fraction (FBP) of the sampling frequency (FE)
   11.3) An undersampling operation (DNS) with an undersampling factor (IDN) equal to or less than the fraction (FBP) of the sampling frequency (FE) filled by the effective bandwidth (FBW) of the bandpass filter (FPB), providing an undersampled signal (SAS)

According to one aspect of the invention, Step 1.1 (ASF) of frequency selective analysis providing starting from the initial signal (SI) a plurality (NFA) of analysis signals (SAA), comprises, for each analysis signal (SAA), in addition the following step:

12.4) A Sliding Fourier Transform (TFG) the length of which (TFN) expressed as a number of samples of the undersampled signal (SAS) is less than or equal to two times the undersampling factor (IDN) of the undersampling operation (DNS)

According to one aspect of the invention, Step 1.1 (ASF) of frequency selective analysis providing starting from the initial signal (SI) a plurality (NFA) of analysis signals (SAA), is made of the repetition of the sequence of operations 11.1), 11.2) and 11.3) from claim 11

According to one aspect of the invention, used for processing voice signals, allowing to detect the fundamental frequency (FFV) of the signal by detecting the following elements:

VA) significant amplitude peaks of at least one of the following indicators:
  V1) the detection of peaks of amplitude modulation indicator (ITA)
  V2) the indicator of signal presence probability (IPS)
  V3) the frequency modulation indicator (IFM)
VB) the time concordance for the appearance of amplitude peaks of previous indicators According to one aspect of the invention, all the operations are performed at a speed adapted to process continuously all analysed frequencies (FA) from the plurality of analysed frequencies (NFA).

The elements of the invention presented above also describe an analysis device that implements the previous method.

14) Presentation of the Continuation of the Document

The continuation of the present document will present successively:

Explanations concerning the elements presented above

Additional elements allowing to complete or improve the elements presented above 15) (Explanations) Comparison of the Invention with Other Techniques One will compare here the invention as it is described above, which can be considered as Wideband Sliding Fourier Transform (<<TFG BL>>), with two other techniques:
  1/ The technique described in section 13.9 of Reference 1, known as <<Zoom FFT>>
  2/ The technique described in Reference 4, which can be designated as Sliding Fourier Transform centered on F4, that is <<TFG F4>>

Table 1 and Table 2 hereafter summarize for the invention on one side and for each of the two techniques the sequence of operations that are carried out.

Table 1 lists the operations until the subsampling operation, Table 2 the following operations.

TABLE 1

| SEQUENCE OF OPERATIONS | Wide Band TFG (invention) | Zoom FFT | TFG F4 |
|---|---|---|---|
| TF Initial -> F0 | | X | |
| TF Initial -> F4 | | | X |
| TF Initial -> Fx | X | | |
| FREQUENCY FILTERING | | X | |
| EXTRACTION INSTANTANE. AMPLITUDE AND FREQUENCY | | | X |
| UNDERSAMPLING | | X | |

The invention (<<TFG BL>>) and the <<Zoom FFT>> comprise a subsampling operation. On the contrary, <<TFG F4>> does not comprise a subsampling operation. As a consequence, the invention (<<TFG BL>>) and <<TFG F4>> are thus different methods.

TABLE 2

| SEQUENCE OF OPERATIONS | Wide Band TFG (invention) | Zoom FFT | TFG F4 |
|---|---|---|---|
| DFT MAXIMUM 3 SIGNIFICANT CHANNELS (Wide Band) | X | | |
| PARAMETER EXTRACTION (INSTANTANEOUS AMPLITUDE & FREQUENCY) | X | | |
| FOURIER TRANSFORM NOT SPECIFIED (DFT or FFT; no claim of a low number of significant channels) | | X | |
| EXTRACTION OF AMPLITUDE AND FREQUENCY PARAMETER (UNSPECIFIED PARAMETERS) | | | X |

One notes that the Zoom FFT technique is described as a general principle, but is far from being completely specified since it is a signal pre processing which feeds a Fourier Transform or a fast Fourier Transform (FFT).

The three following sections explain:
  1/ The special features of the invention relative to a processing of the Zoom FFT type such as typically carried out by a skilled man, as described in Reference 1.
  2/ The notion of correspondence between indicators and its specificity in the invention
  3/ The surprising effects noticed with the invention 16) (Explanations) the Special Features of the Invention 17.1) Wideband Operating The special features of the invention are relative to:
  1/ The important differences of bandwidth and rise time properties for the indicators that it is possible to compute with each of the three techniques studied above.

Table 3 hereunder (<<Properties>>) summarizes for the invention on one side and on the other side for each of the two techniques mentioned above these differences 2/ The Sliding Fourier Transform (TFG) carried out in the invention after the undersampling operation, operation that would not bring added value within the framework of a classical <<Zoom FFT>>.

This last point will be dealt with later section 18) <<The surprising effects of the invention>> and will not be developed in this section.

17.2) Wideband Processing

An important point of the invention is the following:

If one normalizes maximum amplitude to a value of 2·Pi (which does not bring any loss of generality)

Then the evolutions of the indicators computed on one side starting from instantaneous amplitude (AIS) of a signal and on the other side starting from instantaneous frequency (FIS) of this same signal are directly comparable because both the possible values and variation speeds of the indicators are comparable Table 3 hereunder lists the properties of the amplitude and frequency as they result from specifications or lack of specifications for each of the three techniques studied above.

TABLE 3

| SEQUENCE OF OPERATIONS | Wide Band TFG (invention) | Zoom FFT | TFG F4 |
|---|---|---|---|
| POSSIBLE VARIATION INSTANTANEOUS AMPLITUDE | | SAME | |
| POSSIBLE RATE OF CHANGE INSTANTANEOUS AMPLITUDE | HIGH | NOT SPECIFIED a priori | WEAK |
| POSSIBLE VARIATION INSTANTANEOUS FREQUENCY | HIGH | NOT SPECIFIED a priori | WEAK |
| POSSIBLE RATE OF CHANGE INSTANTANEOUS FREQUENCY | HIGH | NOT SPECIFIED a priori | WEAK |
| UNDERSAMPLING | YES (BY DEFINITION) | NOT SPECIFIED a priori | WEAK |

Figure 17:
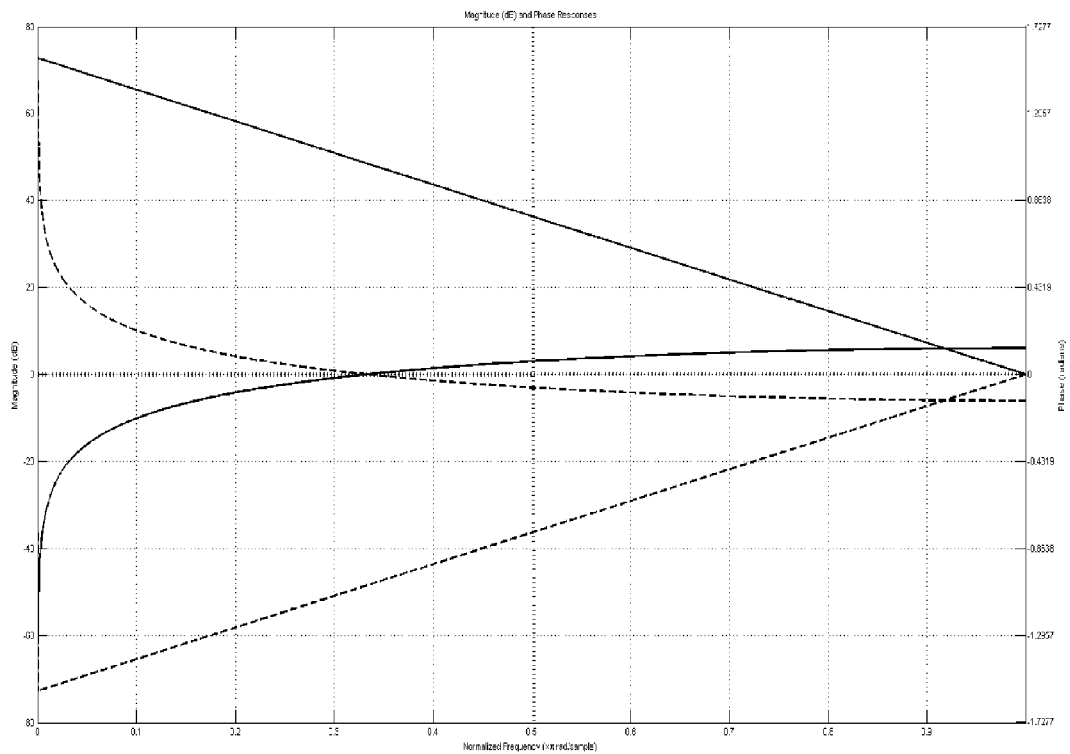
FIG. 17 shows the frequency response of a differentiating filter and of an integrating filter used in the invention

Indeed:
1/ Instantaneous amplitude (AIS) can vary between 0 and 2·Pi, and typically the instantaneous amplitude (AIS) has a value comprised between 0 and 60% of maximum value
2/ It has be seen above that the useful duration (DUF) of a Sliding Fourier Transform (TFG) with a Hann window of length 12, considered as a frequency filter, is on the order of 8 samples, that is a rise time between an instantaneous amplitude (AIS) significantly different from zero and the maximum value of this amplitude on the order of 4 samples
3/ Instantaneous frequency (FIS) when it is expressed in the same units as in FIG. 17, can vary between −Pi and +Pi, and fills by construction at least 30% of this interval of variation. Variations of instantaneous frequency (FIS) on the order of 15% of the spectrum are thus possible and are also indeed observed.

This property of direct comparison is not considered in the literature. It can be obtained as was seen above only by a wideband operating.

As a consequence, in the previous description of the invention, the most important point of the analysis signals (SAA) of wideband monocomponent type is the fact that they are wideband that is wideband analysis signals (SAL).

The fact that they are with limited auto-interference comes mechanically from the following two elements:
1/ They are wideband (which is allowed by the undersampling operation of step (AS1))
2/ The fact that the lowpass or bandpass frequency filtering operation not followed by a corresponding suppression of samples (step (AS2)) is carried out with a filter whose duration in number of samples is very short (for example and advantageously a Sliding Fourier Transform (TFG) with such a Hann window of length 12, as was previously mentioned)

The fact that they are monocomponent can be obtained by choosing the analysed frequencies (FA) and the bandwidth around the analysed frequencies (FA) such as it results from the successive steps of processing.

In what follows, one will suppose that the generation of the wideband analysis signals (SAL) is carried out with above described means for the generation of the analysis signals (SAA) of wideband monocomponent type.

One can see that the invention makes possible the direct comparison and thus concordance measures among indicators of different nature:

1/ indicators coming from processing done on the instantaneous amplitude (AIS) information
2/ indicators coming from processing done on the instantaneous phase (PIS) or instantaneous frequency (FIS) information As a consequence, one can talk within the framework of the invention of indicators (INC), directly comparable both for possible values and for rate of change 17) (Explanations) the Notion of Concordance Between Indicators 17.1) The Notion of Concordance and the Link with Wide Bandwidth Processing The notion of concordance between indicators is a time concordance of the compared value or of the compared time evolution of various indicators at a given time instant or the neighborhood of a given time, typically in a neighborhood of +−2 à 5 samples centered around a given time instant.

This supposes that time concordances can be computed with an accuracy on the order of +−1 samples, which requires:
1/ Wide bandwidth processing (see above <<The specificity of the invention>>).
2/ Use of an adapted undersampling factor (IDN)

Section 3) <<Analysis signals (SAA), of wideband monocomponent type and with limited auto-interference>> describes some effects of undersampling. Here, one will first notice according to signal theory (see Reference 1 for example), in an undersampling operation (DNS):
the undersampling factor (IDN) (that is the ratio between the number of samples remaining after undersampling and the initial number of samples)
must be equal to or less than the part of the spectrum filled by the effective bandwidth (FBW) of the passband filter (FPB) which precedes the suppression of samples operation In order to obtain an optimal wideband processing within the framework of the invention, one will place itself in the rest of the document in the case where the undersampling factor (IDN) is equal to the part of the spectrum filled by the effective bandwidth (FBW) of the passband filter (FPB) which precedes the suppression of samples operation (for example, if one keeps only one sample out of 10, the effective bandwidth (FBW) of the passband filter (FPB) which precedes the suppression of samples operation is $1/10^{th}$ of the width of the spectrum).

With the previous condition, each sample of an indicator can be considered as significant.

Adaptations of the invention to other situations are possible, but will not be described here.

As a consequence, in this context, it can be more advantageous to specify the observation duration of (DOB) samples, as a number of samples of the wideband analysis signal. With an undersampling factor (IDN) of $1/10^{th}$ as it was seen above, a duration of the order of 100 to 200 samples of the initial signal (SI) is equivalent to a duration of 10 to 20 samples of the wideband analysis signal (SAL). Such a duration will be used in the rest of the document. Observations or computations may otherwise be done with time windows of 5 to 7 samples of the wideband analysis signal (SAL), within this observation duration of (DOB) samples.

17.2) Elements which the Concordance can Concern

Elements which the concordance can concern are the following:
Co1) (for any indicator) Instants of appearance of significant events (EVS), such as maximum, minimum, passage by zero or fast transitions (measured on 1, 2 or 3 successive samples)

Co2) (for indicators for which it has been found or for which it has been observed a mathematical relation between the values) Compared values (VCI) at a given time instant Co3) (for any indicator) Compared evolutions (ECO) on a typical duration of 5 to 7 samples of the variation curves of the indicators In this last case Co3), the important points for establishing this concordance between two or more indicators are:
1/ first: a strong correlation (positive or negative) between the shapes of the curves of these indicators, locally around a given time instant, each sample obtained after subsampling being considered as significant
2/ second: the fact that at successive time instants the correlation between these indicators is always in the same direction (positive or negative)

One will be interested primarily by compared evolutions of indicator curves in the vicinity of events that can be identified with a high time accuracy, on the order of one sample or two.

The fact that, at a given time instant, a given correlation is positive or negative has, a priori, no specific meaning.

The fact that a transition of an indicator at a given time is significant is to appreciate relative to the average value and to its average variance on a comparison duration (DCO) which is advantageously 5 to 15 preceding samples.

18) (Explanations) Surprising Effects Observed with the Invention

There are six surprising effects. Four effects concern the indicators obtained by putting into practice the invention:
1/ The relevance of an indicator (AEL) computed as the second time derivative of the logarithm (ALS) of the instantaneous amplitude of the signal (AIS) for determining the presence or not of a signal inside a high level of noise.
2/ The relevance of an indicator (FDS) computed as the first time derivative of the instantaneous Frequency (FIS) of the analysis signal (SAA), which itself is the first time derivative of the instantaneous Phase (PIS) of the analysis signal (SAA) for determining the presence or not of a signal inside a high level of noise.
3/ The relevance of an indicator (FDD) computed as the difference of the instantaneous Frequencies between the instantaneous Frequency (FIS) of the analysis signal (SAA) on one side and on the other instantaneous Frequency (FID) of the derivative signal (SAD) for determining the presence or not of a signal inside a high level of noise
4/ The very good correspondence (in fact the quasi superposition) between these three indicators FIGS. 12 to 15 show various indicators, with the same disposition of signals and indicators as FIG. 10, indicators computed on an analysed frequency (FA) and on samples 40 to 400 (FIGS. 12 to 14) and 510 to 640 (FIG. 15) of a same vocal signal.

One indeed notes that:
1/ when there exists a signal (samples 40 to 260 et 570 to 600) these 3 indicators, computed with very different algorithms show locally very significant positive or negative temporal correlations
2/ when there does not exist a signal either these indicators remain at zero or often have a less good temporal correlation (for example around samples 295, 338, 366, 542

Nota: samples 564 à 576 are an unavoidable particular case, because noise (dotted curve at +200) and the signal (continuous curve at +180) are in this interval in antiphase, and thus neutralise each other. It is thus very difficult to detect a signal, whatever computing method is used.

One also notes that each of these indicators, once again computed with very different methods, show, by the means of quasi-periodic impulses or of similar transitions, the presence of a periodic signal, and in the presence of noise do show such impulses only at isolated locations.

The fifth effect concerns the Sliding Fourier Transform of length 12 with a Hann window carried out after the subsampling operation (section 12.1, Step TR3).

Figure 16:
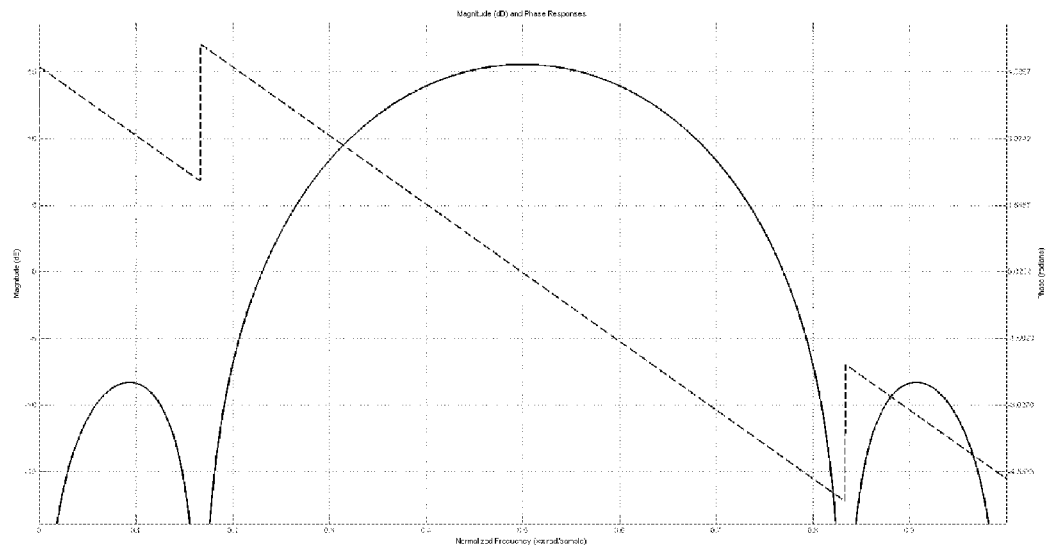
FIG. 16 shows the frequency response of a Fourier transform which is important for the invention, considered as a frequency filter

FIG. 16 shows the amplitude response (curve) and the phase response (straight line) Sliding Fourier Transform (TFG) a Hann window of length 12 considered as a frequency filter.

Figure 18:
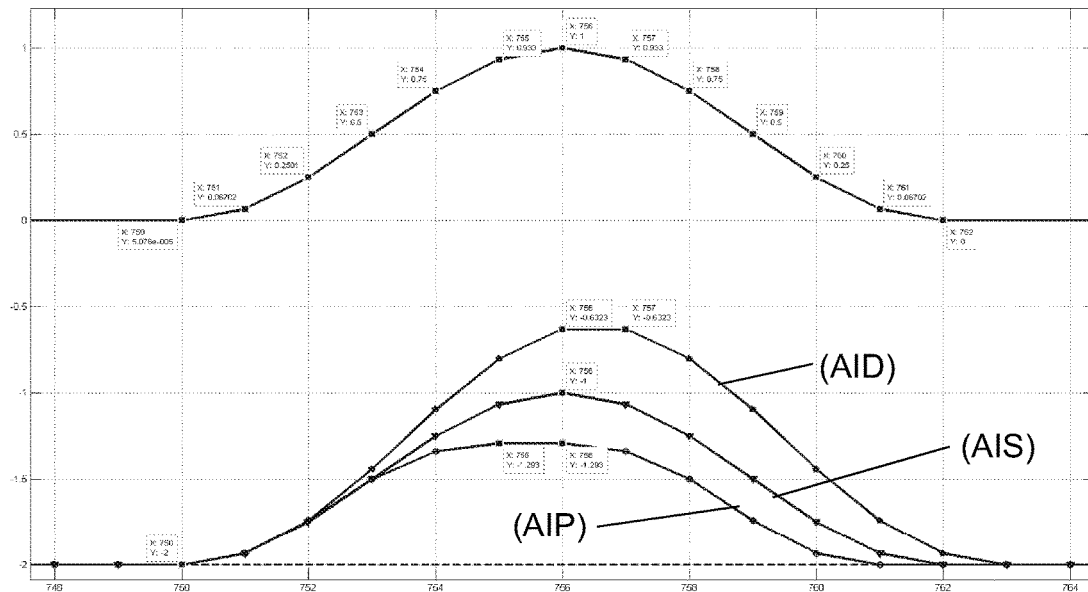
FIG. 18 shows the impulse response of the filter described in FIG. 16, and used with a differentiating filter and an integrating filter

Moreover, if one examines the impulse response of such a filter (see FIG. 18 shown hereafter), one observes that if its nominal duration is 12 samples, its useful duration (DUF) is on the order of 8 samples because only 7 to 9 samples centered on the amplitude peak of the impulse response have a significant amplitude (on the order of 10% or 25% respectively of the maximal amplitude, which corresponds to 1% or 6.25% of the maximum energy measured by the amplitude).

One observes indeed that:
1/ The frequency response (see FIG. 16), indicates a weak effect, because amplitude attenuation is weak on around 50% of the frequency spectrum (from 0.25 to 0.75 for a frequency spectrum extending from 0 to 1).
2/ Such a frequency response is unusual for a Sliding Fourier Transform (TFG) in that the number of frequency channels of this Sliding Fourier Transform (TFG) having a frequency content significantly different from the other channels is very much lower than the length of the Sliding Fourier Transform (from 1 to 3 frequency channels significatively distinct for a length 12)
3/ Such a response curve is of very little use in a processing of the Zoom FFT type because one is interested in having as output a high number of frequency channels having distinct information Such a Sliding Fourier Transform (TFG) of length 12 with a Hann window is thus both uncommon and resource consuming for a result a priori less than attractive.

However, one observes that the use of a Sliding Fourier Transform (TFG) with such a Hann window, compared to the use of a Sliding Fourier Transform (TFG) using a rectangular window, increases in a very significant way the immunity of the invention to noise, and thus represents for the invention:
An important element for noise immunity
A significant element of differentiation relative a classical processing of the <<Zoom FFT>> type The sixth and last effect will be examined at the end of the document. Indeed, sections 22 to 24 describe indicators measured after processing of an amplitude modulated sinusoid and of a constant amplitude sinusoid linearly frequency modulated, in the absence and in the presence of large added noise, as well as the same indicators after processing of pure noise, without any other signal.

It will then appear that the degree of temporal correlation between:
on one side, an indicator computed from instantaneous amplitude information
on the other, several instantaneous frequency indicators
Will provide an indicator of presence of a detectable signal and of estimation of the signal to noise ratio 19) (Explanations) Reformulation of the Processing Method of the Invention Considering the previous elements the processing method according to the invention can be reformulated in the following way, in seeking to be as general as possible and noticing that any complex Frequency Translation (TFR) is an reversible operation, and which thus does not change the information content of a signal:

Method for processing an initial signal (SI) by the means of a plurality (NFA) of analysed frequencies (FA) in said initial signal (SI), comprising a useful signal (SU) comprising a sum of elementary signals (SEL), representative of a wave that propagates in a physical medium, to which added noise (BRA) can be added, said method being implemented on a sequence of samples (SE), sampled at a constant sampling frequency (FE), obtained from an initial signal (SI), said method comprising a frequency selective analysis step (ASF), providing starting from the initial signal (SI) a plurality (NFA) of wideband analysis signals (SAL), each wideband analysis signals (SAL) corresponding to one of the analysed frequencies (FA), said step comprising the following sub-steps:

AS1) a series of undersampling operations, comprising each a lowpass or bandpass frequency filtering, and a corresponding suppression of samples AS2) at least one lowpass or bandpass frequency filtering operation not followed by a corresponding suppression of samples AS3) zero or more complex frequency translation operation which brings the analysed frequency to a first operating frequency (FTA) adapted to compute instantaneous Amplitude and to second operating frequency (FTP) adapted to compute Instantaneous Phase and Instantaneous Frequency of analysis signal.

Moreover, it is particularly advantageous that frequency filtering operation of step AS2) be implemented with a frequency filter the useful duration (DUF) of which expressed as a number of samples is less than or equal to 12, and advantageously equal to 8, and which bandwidth fills at least 30% of the spectrum of output signal of step AS1)

Often, in practical situations that are rather general, the following processing, especially simple, can be very advantageous:

AS10) a series of undersampling operations, each made of a frequency filtering lowpass around null frequency (F0) or bandpass around frequency (F4) equal to one quarter of sampling frequency (FE), and a corresponding suppression of samples AS20) at least one frequency filtering operation lowpass around null frequency (F0) or bandpass around frequency (F4) equal to one quarter of sampling frequency (FE), not followed by a corresponding suppression of samples, implemented with a frequency filter whose useful duration (DUF) expressed as a number of samples is less than or equal to 12, and advantageously equal to 8, and whose bandwidth fills at least 30% of the spectrum of the output signal of step AS1)

AS30) zero or more complex Frequency Translation which brings the analysed frequency to a frequency (F4) equal to the quarter of the sampling frequency (FE), adapted to compute the instantaneous Amplitude, the instantaneous Phase and the instantaneous Frequency of the analysis signal.

Finally, again advantageously, the previous step AS20) can be implemented, around frequency (F4) equal to one quarter of sampling frequency (FE), in the following manner, and step AS30) in this case may not necessitate a complex Frequency Translation:

AS200) A bandpass frequency filtering operation with center frequency the frequency (F4) equal to one quarter of the sampling frequency (FE), not followed by a corresponding sample suppression, implemented by a Sliding Fourier Transform (TFG) of length 12 with a Hann window, restricted to the frequency channel centered on the frequency (F4) equal to one quarter of the sampling frequency (FE)

(see FIG. 16 for the frequency response of this Sliding Fourier Transform (TFG))

It is thus possible and advantageous in terms of ease of computation to implement the invention with a method using the only two steps AS10) and AS200). In this case, one will also note that:

1/ It is usual and advantageous in terms of ease of computation to perform subsampling operations (frequency filtering+sample suppression) around null frequency (F0), if necessary after complex Frequency Translation in order to bring the central frequency of the signal to the null frequency (F0)

2/ Translation from null frequency (F0) to the frequency (F4) equal to a quarter of the sampling frequency (FE) does not imply an effective complex translation frequency (TFR), because it does not need any multiplications by numbers other than 0, +1 or −1. The method thus implies, in this implementation, only one effective complex translation frequency (TFR), and these two frequencies can in practice be considered as equivalent for frequency filtering operations.

There exists however a large diversity of ways for combining frequency translation and subsampling operations, which can each be advantageous in particular situations. Reference 1 describes several methods to this end.

20) (Explanations) Constraints and Advantages of Using the Time Derivative of the Signal 20.1) Properties and Implementation of the Time Derivative FIG. 17 (continuous curves) shows the amplitude response (curve) and the phase response (straight line) of the numerical filter which is the first time difference (value of a sample at time instant N minus value of the sample at time instant N−1), with a logarithmic scale on the ordinate, and a linear scale in abscissa (normalized frequency varying between +Pi and −Pi).

This filter is a possible and simple implementation of a differentiating filter. For a complex signal, this filter is applied independently to the X component and to the Y component.

The dotted vertical line represents frequency F4 equal to a quarter of the sampling frequency, and the dotted horizontal line a gain of 1 in amplitude and a phase delay of zero.

One notices that:
1/ phase response is linear
2/ filter has a zero at frequency zero
3/ filter is roughly linear in amplitude in the vicinity of frequency F4 equal to a quarter of the sampling frequency It is thus necessary that the signal to be differentiated contains as little as possible frequencies close to the null frequency (F0). One notices for example that the response of this simple differentiator to a signal with bandwidth centered on frequency F4 equal to a quarter of the sampling frequency (0.5 on FIG. 17) can have a bandwidth extending from frequency 0.3 to frequency 0.7 (that is 40% of the possible spectrum) will be linear phase and with an amplitude gain which varies in a significantly linear mode.

20.2) Use of Time Derivative

The invention thus makes possible the direct comparison, and thus the concordance measurements previously defined between indicators of instantaneous amplitude (AIS), instantaneous phase (PIS) or instantaneous frequency (FIS) coming from:

1/ on one side, processing carried out on a wideband analysis signal (SAL)

2/ on the other, processing carried out on a time derivative signal (SAD) of this wideband analysis signal (SAL)

Nota: Reference 1 (section 7.1.1 <<Simple Differentiators>> indicates the group delay of the first difference filter is ½ samples. This delay must be taken into account, especially when one computes the difference between, for example, on one side the instantaneous amplitude, phase or frequency of wideband analysis signal (SAL) and on the other the same information for the time derivative signal (SAD) of this wideband analysis signal (SAL).

21) (Additional) Use of the Time Integral of the Signal and its Properties 21.1) Definition and Embodiment of the Time Integral It was seen previously that the comparison of the signal and its time derivative provided information and indicators relevant for the detection and analysis of a signal, in particular a sinusoidal signal, with a large noise added. In particular, phase difference between the signal and its time derivative (which corresponds to the phase of the quotient of the signal and its time derivative) was examined in detail.

The comparison between the signal and its time integral provides other information and indicators relevant in the same field.

In the same manner as the time derivative operator was implemented by the first difference operator (difference between the value of the signal at time instant N and its value at time instant N−1, differences carried out independently for the X and Y components of a complex signal, the time integral operator is implemented by the cumulated sum of the signal between time instants 0 and N, sum carried out independently for the X and Y components of a complex signal.

On notices that these two operators (difference and cumulated sum) are inverse one of the other: applying one of the two and then the other gives back the initial signal.

21.2) Properties of the Time Integral

Properties of the cumulated sum considered a frequency filter are given by the dashed line curves of FIG. 17 (the curve is the amplitude response and the straight line is the phase response). One observes in particular that the properties of the filters are the inverse of the properties of the difference filter.

One especially notices that the cumulated sum operator has:

At frequency (F4) equal to a quarter of the sampling frequency (FE), an amplitude gain similar to the one of the difference operator At the null frequency (F0), an infinite gain (pole)

As a consequence the cumulated sum operator will have to operate on signals not presenting any frequency component at null frequency (F0), that is no DC component, and operating on signals centered on the frequency (F4) equal to a quarter of the sampling frequency (FE) proves to be particularly advantageous.

The interest of the cumulated sum operator will be better appreciated when examining its impulse response and mainly its response to a step of a signal not presenting any DC component.

21.3) Impulse Response

FIG. 18 shows the response at the output of the invention that is at the output of the Sliding Fourier Transform (TFG) located at the output of the undersampling operation (here of length 12 with a Hann window) to an impulse at the output of the undersampling operation and before use of a time derivative or a time integral filter:

1/ The top curve (starting at zero) shows the evolution of the instantaneous amplitude (AIS) of the wideband analysis signal (SAL) following an impulse starting at sample 750 (value as output of the undersampling operation)

2/ The 3 lower curves (stating at −2) are respectively:

2.a/ The middle curve, with triangles as markers, is the same as the curve starting at zero (instantaneous amplitude (AIS) of the wideband analysis signal (SAL))

2.b/ The upper curve, with squares as markers, is the curve of the instantaneous amplitude (AID) of the time derivative signal (SAD) of the wideband analysis signal (SAL)

2.c/ The lower curve, with circles as markers, is the curve of the instantaneous amplitude (AIP) of the time integral signal (SAP) of the wideband analysis signal (SAL)

On notices the following points:

1/ The curve starting at zero shows the values allowing to compute the useful duration of the filter (DUF) for the Sliding Fourier Transform (TFG) of length 12 with a Hann window 2/ The three curves starting at −2 have the same general shape, and similar durations but differing by +−1 relative to the curve of the instantaneous amplitude (AIS) of the wideband analysis signal (SAL)

As a consequence, responses of following signals:

wideband analysis signal (SAL)

time derivative signal (SAD) of the wideband analysis signal (SAL)

time integral signal (SAP) of the wideband analysis signal (SAL)

to an impulse as input of the method that constitutes the invention are qualitatively the same.

21.4) Step Response

Figure 19:
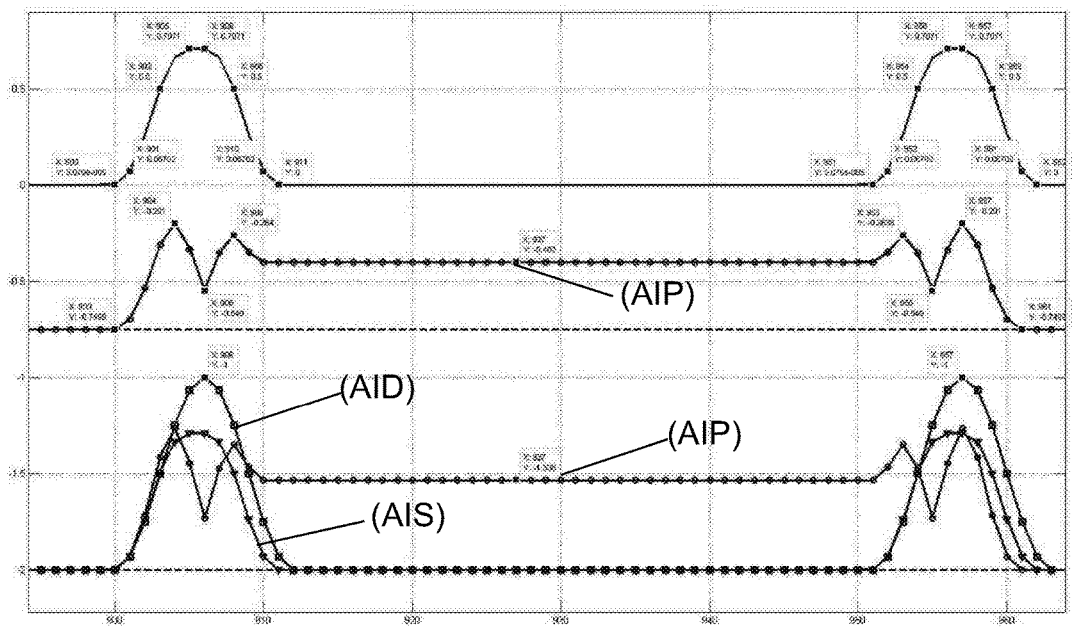
FIG. 19 shows the step response of the filter described in FIG. 16, used with a differentiating filter and an integrating filter
Figure 20:
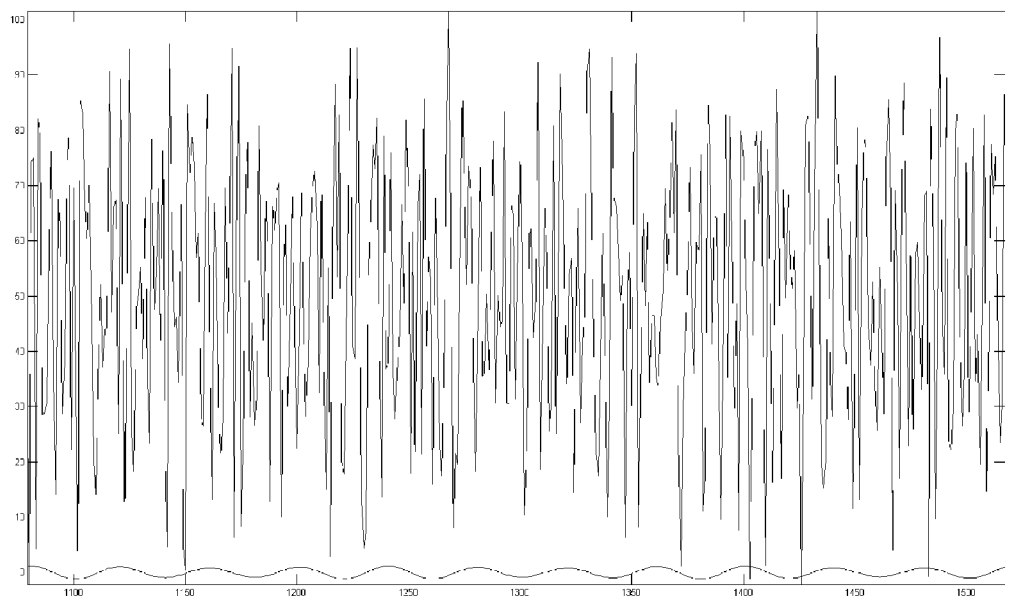
FIG. 20 shows the compared amplitudes of a sinusoidal signal and a noise signal as inputs of the method

FIG. 19 shows (with the same layout as FIG. 18 plus one curve in the middle) the response as output of the invention, that is at the output of Sliding Fourier Transform (TFG) located at the output of the undersampling operation (here of length 12 with a Hann window) to an step at the output of the undersampling operation and before use of a time derivative of a time integral filter:

1/ The top curve (starting at zero) shows the evolution of the instantaneous amplitude (AIS) of the wideband analysis signal (SAL) following a step starting at sample 900 and terminating at sample 950 (value as output of the undersampling operation)

2/ The 3 lower curves (stating at −2) are respectively:

2.a/ The middle curve, with triangles as markers, is the same as the curve starting at zero (instantaneous amplitude (AIS) of the wideband analysis signal (SAL))

2.b/ The upper curve, with squares as markers, is the curve of the instantaneous amplitude (AID) of the time derivative signal (SAD) of the wideband analysis signal (SAL)

2.c/ The lower curve, with circles as markers, is the curve of the instantaneous amplitude (AIP) of the time integral signal (SAP) of the wideband analysis signal (SAL)

The curve starting at −0.75 is a copy of the curve of the instantaneous amplitude (AIP) of the time integral signal (SAP) of the wideband analysis signal (SAL) in order to highlight its specific shape.

Nota: the intuitive description of the signal and the processing used to obtain these responses is the following:
  a) One starts from, at the output of the subsampling operation and before use of a time derivative of a time integral filter, a DC component (thus with null frequency (F0)) of zero amplitude and then constant amplitude and then again zero amplitude
  b) One then applies a complex frequency translation in order to bring the null frequency (F0) towards frequency (F4) equal to a quarter of the sampling frequency (FE)
  c) One then applies the Sliding Fourier Transform (TFG), limited to the frequency channel centered on the frequency (F4) equal to a quarter of the sampling frequency (FE)

If one uses a pulse or a step as initial signal (SI) as an input of the method that constitutes the invention, one obtains an impulse response with a very similar shape, with a very similar duration and a step response of very similar duration, with also two peaks at the beginning and at the end, and a plateau of amplitude greater than the first or last peak.

One notices the following points:
  1/ The curve of the instantaneous amplitude (AIS) of the wideband analysis signal (SAL) and the curve of the instantaneous amplitude (AID) of time derivative signal (SAD) of the wideband analysis signal (SAL) show two peaks corresponding to the beginning impulse of the step and then the end impulse of the step
  2/ The curve of the instantaneous amplitude (AIP) of time integral signal (SAP) of the wideband analysis signal (SAL) has a particular and qualitatively different shape:
    2.1/ Within the duration of the impulse response of the Sliding Fourier Transform (TFG) of length 12 with a Hann window (nominal length of 12 samples) the response shows an ascending step and oscillations
    2.2/ Outside the duration of the impulse response of the Sliding Fourier Transform (TFG) of length 12 with a Hann window but within the duration of the step (samples 910 to 950) the instantaneous amplitude (AIP) of time integral signal (SAP) of the wideband analysis signal (SAL) is constant but has a value different than zero (presence of a plateau)

21.5) The Use of the Time Integral

As a consequence, responses of the following signals:
wideband analysis signal (SAL)
time derivative signal (SAD) of the wideband analysis signal (SAL)
to a step as an input to the method constituting the invention are qualitatively the same, because the amplitude shows two regular peaks at the beginning and at the end of the step and goes to zero inside the step.

To the contrary, the response of the time integral signal (SAP) of the wideband analysis signal (SAL) is qualitatively different and demonstrates the two specific features 2.1/ and 2.2/ above which will be useful for developing new indicators One thus sees that the invention makes possible the comparison and thus concordance measures between:

1/ On one side instantaneous amplitude (AIS), instantaneous phase (PIS) or instantaneous frequency (FIS) indicators resulting from processing carried upon a wideband analysis signal (SAL)

2/ On the other side instantaneous amplitude (AIS), instantaneous phase (PIS) or instantaneous frequency (FIS) indicators resulting from processing carried upon the time integral (SAP) of this wideband analysis signal (SAL)

Nota: FIG. 17 shows that the frequency response curves of the first difference and the cumulated sum are inverse or opposite of each other. As a consequence, the cumulated sum digital filter has a group delay of ½ sample, of sign opposite to the one of the first difference numerical filter. This delay must also be taken into account, especially when one computes the difference between, for example, on one side the instantaneous amplitude, phase of frequency of wideband analysis signal (SAL) and on the other the same information for the time integral signal (SAP) of this wideband analysis signal (SAL).

21.6) Specific Features of the Time Integral Operator

The time integral operator presents in its principle an important difference relative to the time derivative operator:

With the time derivative operator it is possible, as seen before, to obtain in the general case explicit mathematical relations between a signal and its time derivative With the time integral operator it is not possible, to obtain in the general case explicit mathematical relations between a signal and its time derivative Implementation of the time integral operator by a cumulated sum presents also an important qualitative difference relative to the implementation of the time derivative by a first difference:

A first difference is a filter with a finite response time and has a very short memory A cumulated sum is a filter with a potentially infinite response time and has a memory of significant duration. Behaviors of the oscillatory type are thus possible 22) (Explanations & Complements) Processing of an Amplitude Modulated Sinusoid According to the Invention 22.1) The Useful Signal (SU)

Useful signal (SU) of the initial signal (SI) se is composed of:

1/ a sinusoid of constant amplitude 1 and of frequency one tenth ($\frac{1}{10}^{th}$) of frequency (F4) equal to a quarter of the sampling frequency (FE) (see later), called carrier frequency (FPO)

2/ multiplied (amplitude modulation operation) by the following signal, called amplitude modulating signal (SMA):

(1+(linear ramp)×(sinusoid))

In which:
the linear ramp is equal to zero at the beginning and 1 at the end
the sinusoid, called amplitude modulating frequency (FMA), is of constant frequency equal to a one thirty-fifth ($\frac{1}{35}^{th}$) of frequency (F4) equal to a quarter of the sampling frequency (FE)

The corresponding sequence of samples (SE) is made of 6.000 samples, sampled at a sampling frequency (FE) of 8.000 Hertz.

Figure 21:
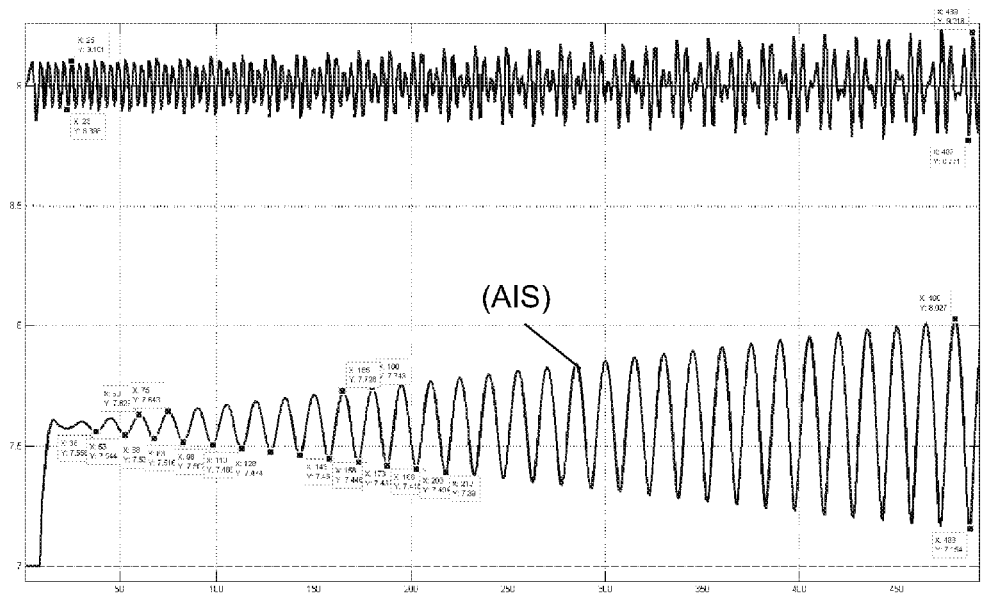
FIGS. 21 to 30 show the responses of the method according to the invention to various input signals

FIG. 21 shows:
(upper curve) signal after subsampling by a factor 10 (signal is then made of 600 samples)
(lower curve) instantaneous amplitude (AIS) of the wideband analysis signal (SAL)

One sees that this instantaneous amplitude (AIS) has two components:

1/ a constant amplitude component, which represents the carrier frequency (FPO)

2/ a variable component which adds to or subtracts from the previous component and which represents the amplitude modulating signal (SMA), which is in the present case a sinusoid with increasing amplitude 22.2) Added Noise (BRA)

Added noise (BRA) which will be added or not is obtained with a random number generator, frequency limited to 10% and 90% of half the sampling frequency (FE), and normalized such that the peak value is lesser or equal to 64.

One will examine the processing according to the invention of the useful signal (SU) alone then of the sum of the useful signal (SU) and the added noise (BRA).

22.3) The Signal to Noise Ratio (SNR)

In the initial signal (SI), the useful signal (SU) varies at the maximum between +−2, and the added noise varies between +−64, that is a signal to noise ratio (SNR) of 32, that is $2^5$, that is 30 db.

However, as FIG. 21 shows, at the beginning of the signal, the useful signal (SU) varies between +−1, which means that the signal to noise ratio (SNR) is 32, that is 36 db, and this value corresponds to the signal to noise ratio (SNR) of the frequency carrier (FPO). For the amplitude modulating signal (SMA), the signal to noise ratio (SNR) is more unfavorable, because this amplitude modulating (SMA) is very weak at the beginning of the signal. If one considers that this amplitude modulating signal (SMA) is 8 times weaker that the carrier frequency (FPO) at the beginning of the signal, the signal to noise ratio (SNR) relative to the amplitude modulating signal (SMA) is 36 db+18 db=54 db.

22.4) Observed Information

Figure 22:
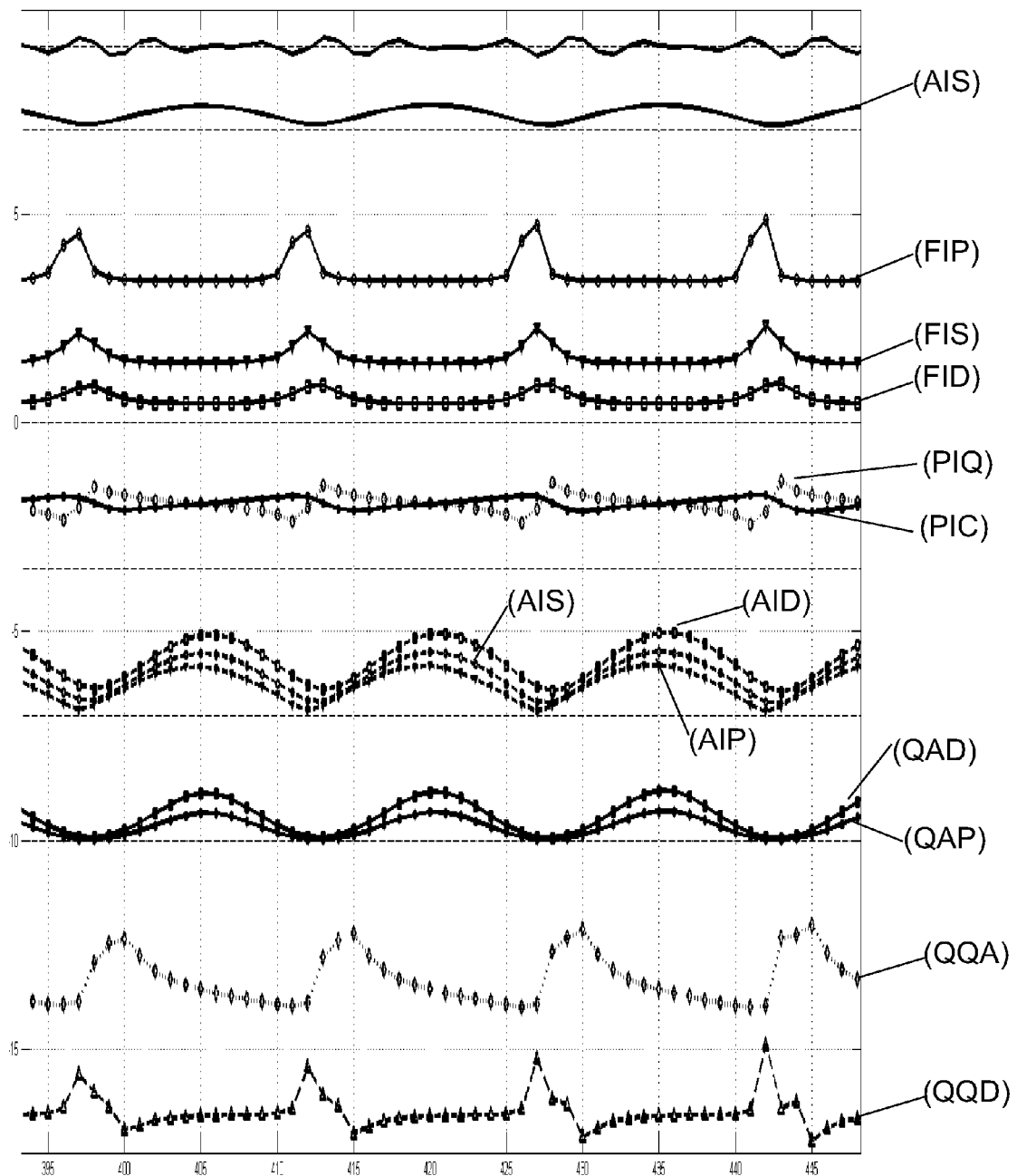

FIG. 22 shows the observed information relative to the wideband analysis signal, with a linear time scale in abscissa, and a linear scale in ordinate. The information is the following, from top to bottom:

O1/ Useful signal (SU) after subsampling operation, carried out at null frequency (F0)

O2/ Instantaneous amplitude (AIS)

O3/ Three instantaneous frequencies:

O31/ Instantaneous Frequency of the time integral of the signal (FIP), with round markers O32/ Instantaneous Frequency of the signal (FIS), with triangle markers O33/ Instantaneous Frequency of the time derivative of the signal (FID), with square markers O4/ Two differences of instantaneous phase:

O41/ Instantaneous phase difference (PIC) between on one side the instantaneous phase of the time derivative of the signal (PID) and on the other the instantaneous phase of signal (PIS)

O42/ Instantaneous phase difference (PIQ) between one side the instantaneous phase of the time integral of the signal (PIP) and on the other the instantaneous phase of signal (PIS)

O5/ Three instantaneous amplitudes:

O51/ Instantaneous amplitude (AIP) of the time integral (SAP) of the wideband analysis signal (SAL), with round markers O52/ Instantaneous amplitude (AIS) of the wideband analysis signal (SAL), with triangle markers O53/ Instantaneous amplitude (AID) of the time derivative (SAD) of the wideband analysis signal (SAL), with square markers O6/ Two quotients relative to these three instantaneous amplitudes:

O61/ Quotient (QAD) between instantaneous amplitudes of the time derivative of the signal (AID) on one side and of the signal (AIS) on the other, with square markers O62/ Quotient (QAP) between instantaneous amplitudes of the signal (AIS) on one side and the time integral of the signal (AIP), with round markers O7/ Quotient (QQA) of the two amplitude quotients, defined in O61/ and in O62/

O8/ The time derivative (QQD) of quotient (QQA) of the amplitude quotients

Nota: Comparisons between instantaneous amplitudes of the signal, of its time derivative and of its time integral have been presented above in the form of quotients. It is important to notice that these comparisons can be done, in a mathematically equivalent way, under the form of differences of logarithms of these instantaneous amplitudes, in the same manner as the comparisons between instantaneous phases or instantaneous frequencies are made by difference.

22.5) Observed Results in the Absence of Noise

Figure 23:
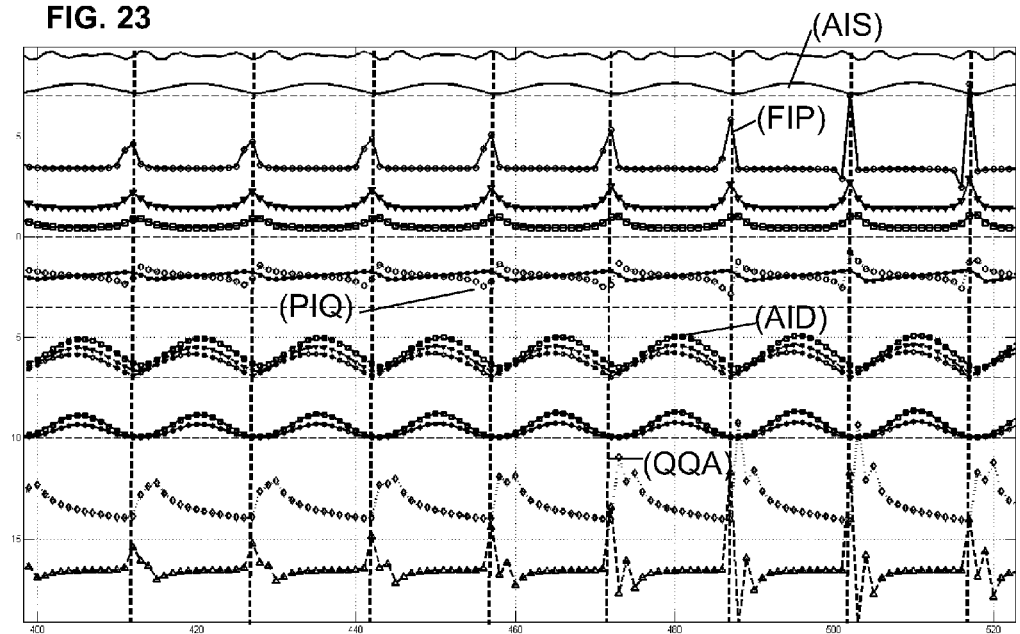
Figure 24:
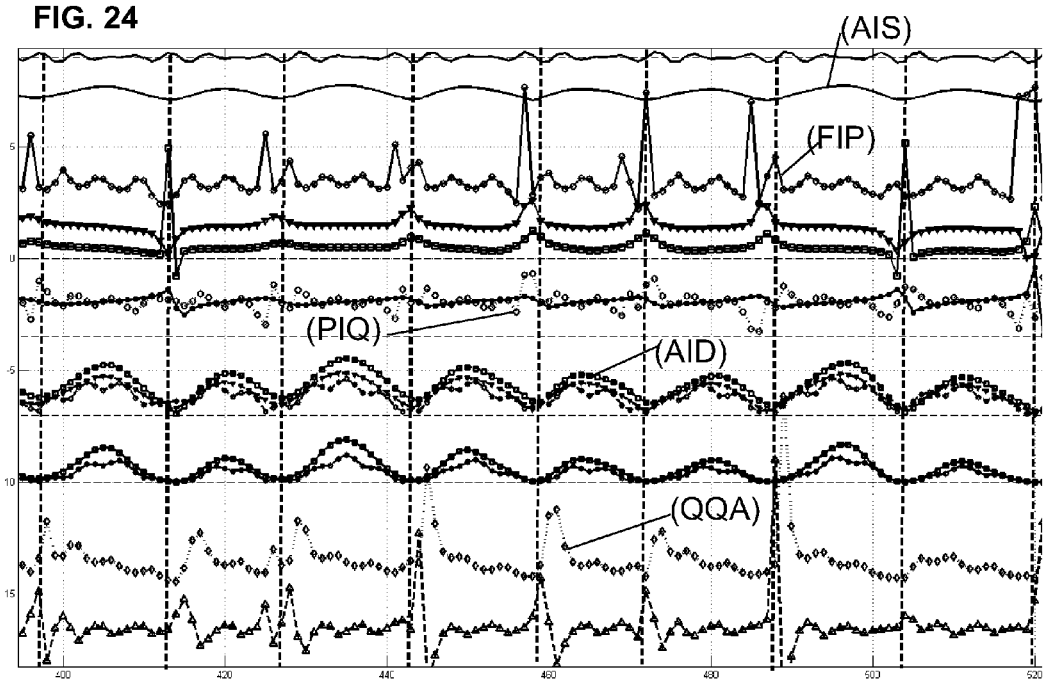
Figure 25:
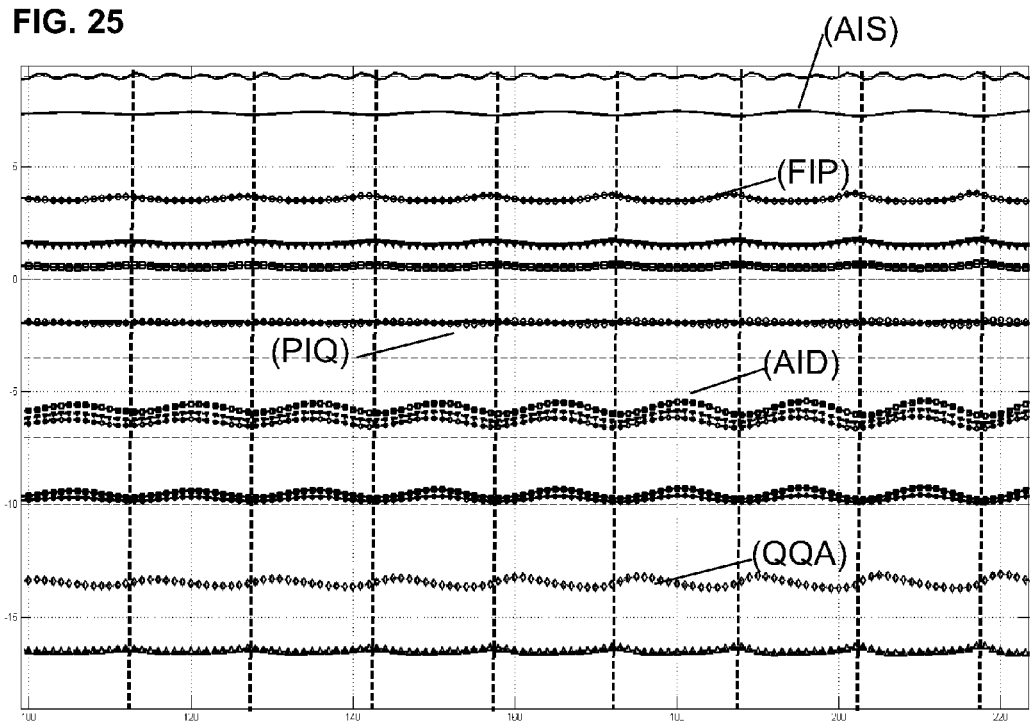
Figure 26:
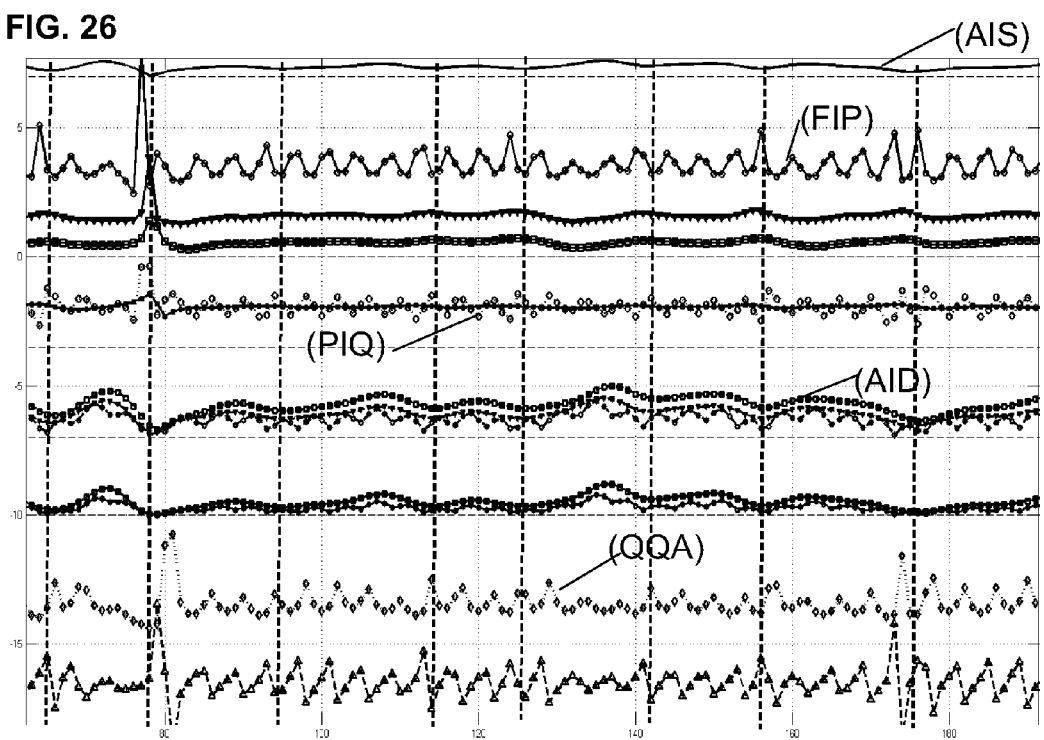

FIGS. 23 and 25 show the observations made with the useful signal (SU) described above with no added noise, at the end of the signal and at the beginning of the signal respectively (the sample numbers of FIGS. 23 to 26 match).

One especially notices:

RA1/ the very good concordance between the indicators, highlighted by dotted vertical lines RA2/ very significant variations among observations when the amplitude modulation is strong (FIG. 23) and less significant amplitude modulation is weak (FIG. 25)

RA3/ impulses with increasing heights for the instantaneous frequency (FIP) of the time integral of the signal (FIP), with round markers RA4/ impulses with increasing heights for the time derivative (QQD) of the quotient (QQA) of the two amplitude quotients (last curve starting from the top), RA5/ the fact that the time derivative (QQD) of the quotient (QQA) of the two amplitude quotients shows impulses the height of which varies in parallel with the instantaneous frequency of the time integral of the signal (FIP)

RA6/ An identical shape for the three instantaneous amplitudes curves

RA7/ A low variance for the differences of instantaneous phase (corresponding differences of instantaneous frequencies are zero or very weak)

Nota: Observed peaks on the instantaneous frequencies curves, and in particular the instantaneous frequency (FIP) of the time primitive of the signal (FIP), are typical of the observation of instantaneous frequency which comprises two frequencies (see especially Reference 13, sections 10.6 and 10.7).

22.6) Observed Results in the Presence of Noise

FIG. 24 shows the observations made with the useful signal (SU) described above with added noise, in a case in which this large added noise (see FIG. 20) brings little modifications (samples observed are same as in FIG. 23, and correspond to a strong amplitude modulation, see FIG. 21).

One especially notices:

RAB1/ The less good (but real) concordance between the indicators, evidenced by the vertical dotted lines RAB2/ The rather good concordance between the indicators (vertical dotted lines) and the effective frequency of the amplitude modulating signal (SMA)

RAB3/ A curve of the instantaneous amplitude (AIP) of the time integral (SAP) of the wideband analysis signal (SAL) which shows a modulation with a frequency different from the one of the amplitude modulating signal (SMA) (bottom curve)

RAB4/ The two other instantaneous amplitude curves are a lightly deformed version of the version without noise, with no new modulation RAB5/ A difference of variance between the two differences of instantaneous phase (the one involving the time integral is high, the other one remains low); the same remark could be done for the corresponding differences of instantaneous frequencies FIG. 25 shows observations made with the useful signal (SU) described above with added noise, in a case where this large added noise (see FIG. 20) brings important modifications (observed samples are not the same as in FIG. 23, and correspond to a low amplitude modulation, see FIG. 21).

One especially notices:

RAB3/ The less good concordance between the indicators, evidenced by the vertical dotted lines RAB4/ The less good (detectable, but not accurate) concordance between the indicators, evidenced by the vertical dotted lines RAB5/ The less good concordance between the indicators, (vertical dotted lines) and the effective frequency of the amplitude modulating signal (SMA)

RAB6/ A curve of the instantaneous amplitude (AIP) of the time integral (SAP) of the wideband analysis signal (SAL) which shows a modulation with a frequency different from the one of the amplitude modulating signal (SMA) (bottom curve)

RAB7/ The two other instantaneous amplitude curves are a noticeably deformed version of the version without noise, with no new modulation (see RAB4/)

RAB8/ A difference of variance between the two differences of instantaneous phase (the one involving the time integral is high, the other one remains low); the same remark could be done for the corresponding differences of instantaneous frequencies (see RAB5/)

23) (Additional) Processing of a Linearly Frequency Modulated Sinusoid (Linear Chirp) According to the Invention 23.1) Useful Signal (SU)

Useful signal (SU) is a sinusoid of 6.000 samples, of constant amplitude, the frequency of which varies linearly from 0 to 240 Hz.

23.2) Added Noise (BRA)

Added noise (BRA) is the same as above for the sinusoidal signal.

23.3) Signal to Noise Ratio (SNR)

Signal to noise ratio (SNR) changes as a result of the evolution of the signal frequency, which is initially less than the frequency of the frequency filters, the equal to, then more than the frequency of the frequency filters.

Signal to noise ratio (SNR) is thus very unfavorable in the beginning and the end of the signal (when the instantaneous amplitudes are low or very low) and then less unfavorable a little after the middle of the signal (when the instantaneous amplitude is maximum).

23.4) Observed Information

Observed information is the same as for the preceding signal and is displayed in FIG. 22.

23.5) Observed Results in the Absence of Noise

Figure 27:
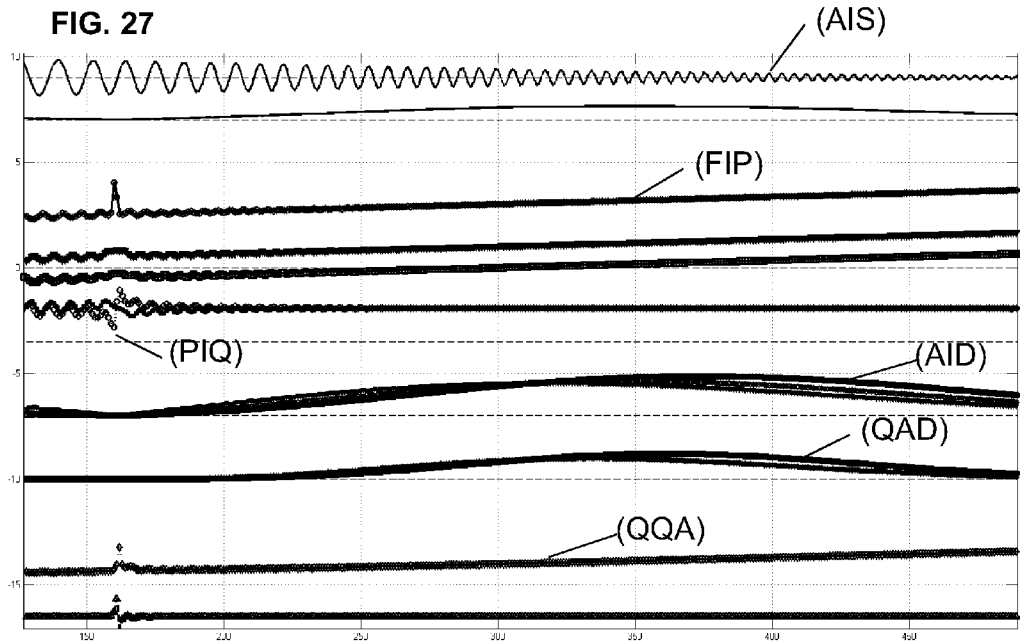

FIG. 27 shows an overview of the observations made with the above useful signal (SU) described above without added noise.

One especially notices:

RC1/ the very good concordance between the three instantaneous frequency indicators, the curves of which are parallel RC2/ the behavior of the curve of indicator (QQA) of amplitude quotients, which is parallel to the three instantaneous frequency indicators curves, whereas this indicator is computed exclusively from instantaneous amplitude information RC3/ Similar shapes but a time lag between the curves of the three instantaneous amplitude indicators RC4/ A very low variance for the two instantaneous phase differences (corresponding differences for instantaneous frequencies are zero or very low)

23.6) Observed Results in the Presence of Noise

Figure 28:
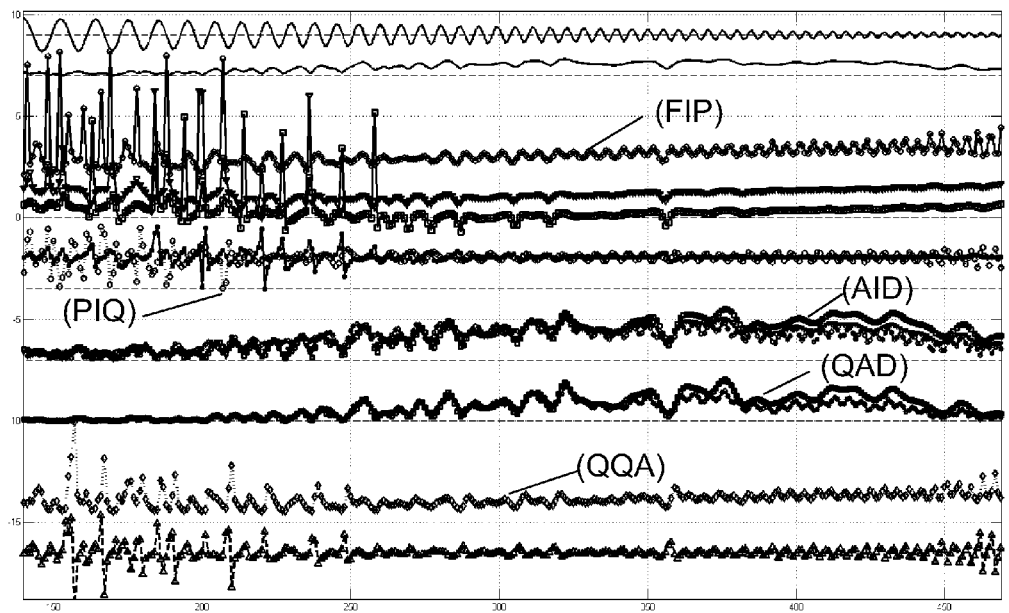
Figure 29:
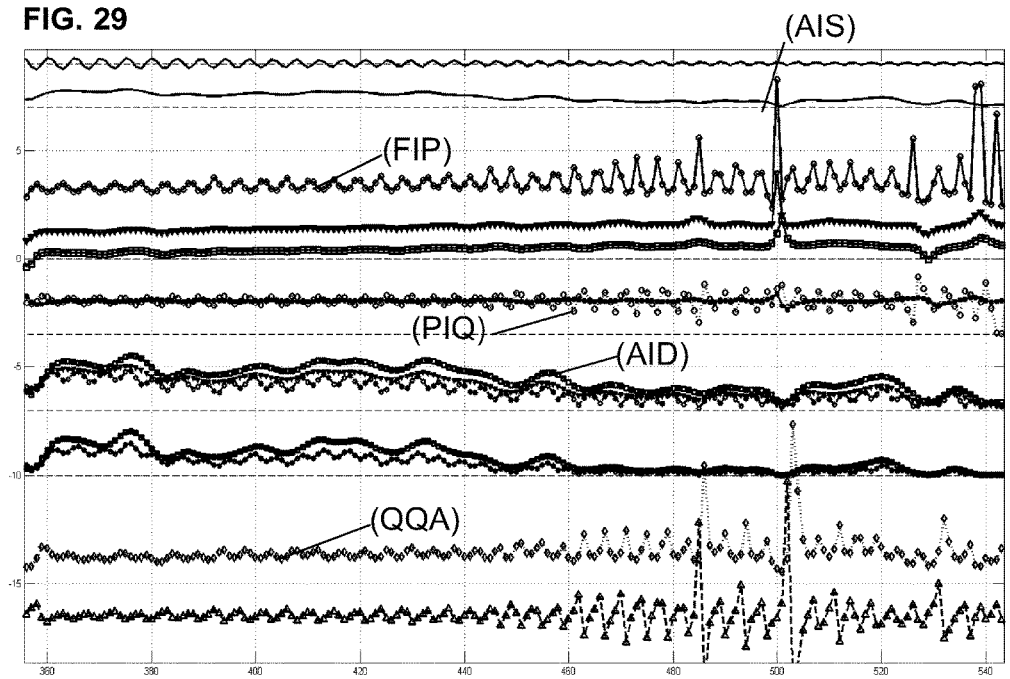

FIGS. 28 and 29 show the observations made with the useful signal (SU) described above with added noise, in a case where this added noise is large (see FIG. 20), in the beginning and the end of the signal (sample numbers in FIGS. 27, 28 and 29 correspond).

One especially notices:

RCB1/ A strong variance of several indicators at the beginning of the signal, when the signal to noise ratio (SNR) is particularly unfavorable:

Instantaneous frequency indicators

Phase difference indicators

Quotient of amplitude quotients (QQA) and its time derivative (QQD) indicators

RCB2/ Lowering of the variance of these same indicators towards the middle of the signal (when the signal to noise ratio (SNR) is less unfavorable) then increasing of the variance of these same indicators towards the end of the signal (when the signal to noise ratio (SNR) becomes again less favorable)

RCB3/ Peak values of these same indicators very similar at each time instant (by measuring for example the peak value in a window of 5 successive samples)

RCB4/ Variance of the instantaneous amplitude signals higher in the middle of the signal than at the beginning or at the end RCB5/ A curve of the instantaneous amplitude (AIP) of the time integral (SAP) of the wideband analysis signal (SAL) which shows a modulation without any visible reason (bottom curve)

RCB6/ The curves of the quotient of amplitude quotients (QQA) and its time derivative (QQD) show the same modulation without any apparent reason 24) (Additional) Processing of a Pure Noise Signal 24.1) The Useful Signal (SU)

The useful signal (SU) does not exist.

24.2) Added Noise (BRA)

Added noise (BRA) is the same as the sinusoidal signal above.

24.3) Signal to Noise Ratio (SNR)

The signal to noise ratio (SNR) is infinite since there is no useful signal (SU).

24.4) Observed Information

Observed information is the same as for the previous signal and is displayed in FIG. 22.

24.5) Observed Results

Figure 30:
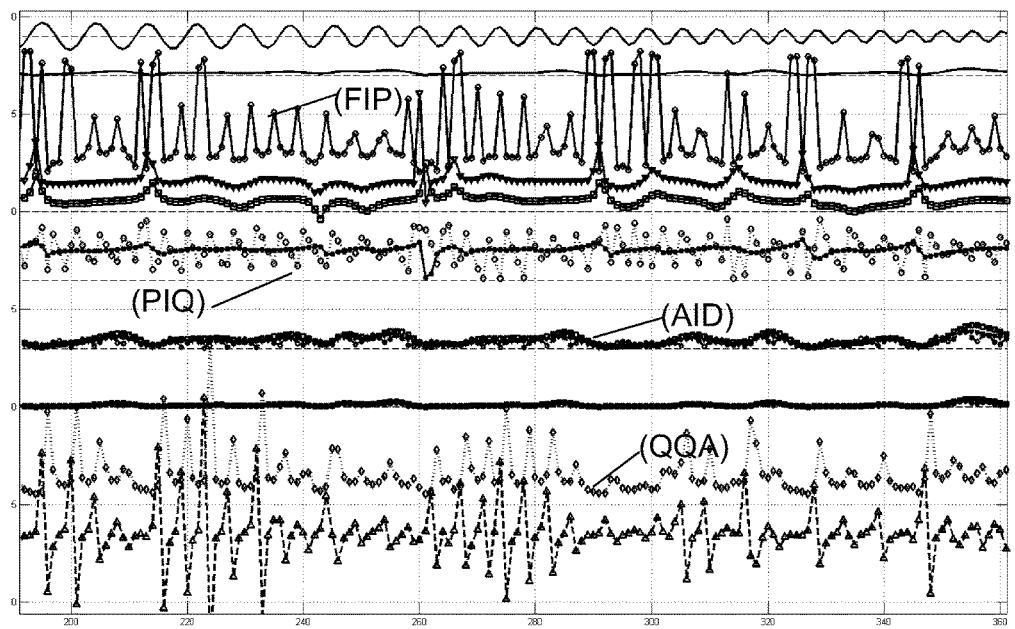

FIG. 30 shows the observations made.

One especially notices:

RB1/ A strong variance of the instantaneous frequency (FIP) of the signal time integral (SAP) of the wideband analysis signal (SAL), has a behavior of oscillatory type RB2/ A low variance of the instantaneous frequency (FID) of the signal time derivative (SAD) of the wideband analysis signal (SAL), and of the instantaneous frequency (FIS) of the wideband analysis signal (SAL)

RB3/ A strong variance of the instantaneous phase difference (PIQ) between on one side the instantaneous phase of the time integral of the signal (PIP) and on the other the instantaneous phase of the signal (PIS)

RB4/ A low variance of the instantaneous phase difference (PIC) between on one side the instantaneous phase of the time derivative of the signal (PID) and on the other the instantaneous phase of the signal (PIS)

RB5/ The bad temporal concordance between the evolutions of the following indicators:

instantaneous frequency (FIP) of the time integral of the signal (SAP) of the wideband analysis signal (SAL)

quotient of amplitude quotients (QQA) and its time derivative (QQD)

RB6/ A curve of the instantaneous amplitude (AIP) of the time integral of the signal (SAP) of the wideband analysis signal (SAL) which shows a modulation with no apparent reason (bottom curve), whereas the two other instantaneous amplitude curves do not show such a modulation RB7/ Low value and low variance for the two instantaneous amplitude curves that do not show the modulation with no apparent reason 25) (Explanations & Additional) New Indicators Made Possible within the Framework of the Invention and their Computation 25.1) The Use of the Information of the Time Integral It was observed in the three above examples that in the presence of noise, the instantaneous amplitude, phase and frequency of the signal (SAP) time integral of the wideband analysis signal (SAL).

One can thus define the 3 following indicators:

b5) a first noise indicator (IBA) computed as the instantaneous amplitude (AIP) of the signal (SAP) time integral of the wideband analysis signal (SAL), which shows rapid oscillations in the presence of significant noise b6) a second noise indicator (IBP) computed as the instantaneous phase (PIP) of the signal (SAP) time integral of the wideband analysis signal (SAL), which shows rapid oscillations in the presence of significant noise b7) a third noise indicator (IBP) computed as the instantaneous frequency (FIP) of the signal (SAP) time integral of the wideband analysis signal (SAL), which shows rapid oscillations in the presence of significant noise In the above examples, frequency of these oscillations is close to frequency (F4) equal to a quarter of the sampling frequency (FE), which has been used on operating frequency for the extraction of parameters. Adaptations are possible if using other operating frequencies.

25.1) Use of Time Integral Information with Other Information

One can also notice in the three examples above that more accurate indicators can be obtained by comparing instantaneous information from the time integral signal to instantaneous information from the of the wideband analysis signal (SAL) and/or its time derivative. Indeed one can define the three following indicators of signal presence and estimation of the signal to noise ratio.

b8) A first indicator of signal presence and estimation of the signal to noise ratio (ISP), equal to the variance during the observation duration of (DOB) samples of the wideband analysis signal (SAL) of the instantaneous phase difference between, on one side, the instantaneous phase (PIP) of the signal (SAP) time integral of the wideband analysis signal (SAL) and, on the other, the instantaneous phase of the signal (PIS)

b9) A second indicator of signal presence and estimation of the signal to noise ratio (ISF), equal to the variance during the observation duration of (DOB) samples of the wideband analysis signal (SAL) of the instantaneous phase difference between, on one side, the instantaneous frequency (FIP) of the signal (SAP) time integral of the wideband analysis signal (SAL) and, on the other, the instantaneous frequency of the signal (FIS)

These two indicators only use phase or frequency information, and the second indicator is in practice a consequence of the first.

The third indicator, in a surprising way, compares and uses at the same time instantaneous amplitude information on one side and instantaneous frequency information on the other:

b.10) A third indicator of signal presence and estimation of the signal to noise ratio (ISA), computed as the quotient (QQA) of the following amplitude quotients:

The quotient (QAD) between instantaneous amplitudes of the time derivative of the signal (AID) and of the signal (AIS)

The quotient (QAP) between instantaneous amplitudes of the signal (AIS) and the time integral of the signal (AIP)

And the degree of temporal correlation with the two following signals:

b.10.a) the instantaneous frequency (FIP) of signal (SAP) time integral of the wideband analysis signal (SAL), b.10.b) one of the following signals:

the instantaneous frequency (FIS) of the wideband analysis signal (SAL)

the instantaneous frequency (FID) of signal (SAD) time derivative of the wideband analysis signal (SAL) provides an indication of presence of the detectable signal and of the signal to noise ratio (SNR) of a wideband analysis signal (SAL) thanks to its following features:

b.10.1) in the absence of a detectable signal, the quotient (QQA) of the amplitude quotients is not correlated to any of the instantaneous frequency signals mentioned above in b.10.a) or b.10.b)

b.10.2) in the presence of a detectable signal and in the absence of significant noise, the quotient (QQA) of the amplitude quotients is correlated to the three instantaneous frequency signals mentioned above in b.10.a) or b.10.b)

b.10.3) in the presence of a detectable signal and in the presence of significant noise, the quotient (QQA) of the amplitude quotients is correlated to the instantaneous frequency (FIP) of signal (SAP) time integral of the wideband analysis signal (SAL) mentioned above in b.10.a), but not to the two other instantaneous frequency signals mentioned above in b.10.b)

26) (Additional) Generalisation to Several Dimensions

When a multidimensional initial signal (SIM), with a number (NDI), of dimensions can be decomposed into a number (NSD) of elementary signals (SLM) at least 1 of which has dimension 1, the method object of the present invention applies to each of the at least one elementary signals (SLM) of dimension 1.

Example: Images, with a Cartesian Decomposition into X and Y or a Polar One (Distance from the Origin and Angle Relative to an Axis)

In this case, the method according to one of the previous modalities, applied to each of at least one elementary signal (SLM) of dimension 1, resulting from the decomposition a multidimensional initial signal (SIM), with a number (NDI), of dimensions into a number (NSD) of elementary signals (SLM) at least 1 of which has dimension 1.

The invention claimed is:

1. A method for analyzing an initial signal comprising a useful signal that includes a sum of elementary signals and an added noise, said initial signal being representative of a wave that propagates in a physical medium, said method including analyzing a plurality of analysed frequencies from the initial signal;

said method comprising a sequence of steps including:
- 1.1) a first step including providing a plurality of wideband analysis signals generated from the initial signal, wherein each of the plurality of wideband analysis signals corresponds to a one of the plurality of analysed frequencies,
- 1.2) a second step including performing a plurality of operations of extraction of a plurality of sets of parameters from the plurality of wideband analysis signals, wherein each of the sets of parameters corresponds to a different one of the plurality of wideband analysis signals and wherein each set of parameters includes:
  - a) a first parameter representing an instantaneous amplitude of a wideband analysis signal, and
  - b) a second parameter representing an instantaneous phase of the wideband analysis signal,
- 1.3) a third step including performing a plurality of operations for estimation of a modulation of the plurality of wideband analysis signals to determine a plurality of sets of indicators for the plurality of wideband analysis signals, wherein each of the sets of indicators (i) corresponds to a different one of the plurality of wideband analysis signals and (ii) is calculated based on a different one of the plurality of sets of parameters, wherein each of the sets of indicators includes:
- a) a first indicator that represents a non-significant signal and that, when a value of the first indicator is true, indicates that the useful signal cannot be detected in the initial signal, wherein the value of the first indicator is false by default and true when at least one of the three conditions is satisfied:
  - a.1) a first condition wherein the instantaneous amplitude has, during an observation duration of samples (i) an average value lower than a first limit defined in advance, or (ii) an instantaneous value lower than a second limit defined in advance;
  - a.2) a second condition wherein at least three observed indicators show a lack of temporal concordance regarding the apparition of significant events, wherein the significant events may include maximum, minimum, or fast transitions; and
  - a.3) a third condition wherein a signal absence or noise is indicated by a set of signal noise indicators including at least one of (i) an indicator of a useful signal presence, and (ii) an indicator of a signal to noise ratio estimation; and
- b) at least two other indicators that represent modulations, wherein an estimation of content carried by the useful signal in the initial signal is based on the at least two other indicators wherein the at least two other indicators that are derived from:
  - 1) at least one of the at least two other indicators is derived from instantaneous amplitude information, and
  - 2) at least one of the at least two other indicators is derived from instantaneous phase or frequency information.

2. The method according to claim 1, wherein each set of parameters in the plurality of sets of parameters includes at least two among the six following parameters:
- c) a third parameter representing an instantaneous phase of a derivative signal equal to a time derivative of a wideband analysis signal associated with the first parameter,
- d) a fourth parameter representing an instantaneous frequency of the derivative signal, equal to a time derivative of said Instantaneous Phase of the derivative signal,
- e) a fifth parameter representing an instantaneous phase of a signal time integral of the wideband analysis signal associated with the first parameter,
- f) a sixth parameter representing an instantaneous frequency time derivative of said instantaneous Phase of the time integral signal,
- g) a seventh parameter representing an instantaneous amplitude of the derivative signal, and
- h) an eighth parameter representing an instantaneous amplitude of the time integral signal.

3. The method according to claim 1, wherein:
at least one of the two other indicators is derived from a time derivative signal or a time integral signal of the wideband analysis signal.

4. The method according to claim 1, wherein the at least two other indicators includes a third indicator, wherein at least one of the at least two other indicators is:
derived directly from the wideband analysis signal,
derived from a time derivative of the wideband analysis signal, or
derived from a time integral (SAP) of the wideband analysis signal.

5. The method according to claim 1, wherein the at least two other indicators includes at least one of the following indicators:
- b1) a second indicator representing a sinusoidal amplitude modulation indicating to what extent the following are in quadrature: (i) a first time derivative of instantaneous amplitude on one side and (ii) on the other side a second time derivative of instantaneous amplitude,
- b2) a third indicator representing an exponential amplitude modulation indicating to what extent the first time derivative of the logarithm of the instantaneous amplitude is constant,
- b3) a fourth indicator representing a detection of peaks of amplitude modulation indicating to what extent the second time derivative of the logarithm of the instantaneous amplitude of the wideband analysis signal has a large and limited in time peak,
- b4) a fifth indicator representing a frequency modulation indicating to what extent the first time derivative of the instantaneous frequency of the wideband analysis signal, which itself is the first time derivative of the instantaneous phase of the wideband analysis signal, is constant,
- b5) a sixth indicator representing a first noise computed as the instantaneous amplitude of the time integral of a wideband analysis signal, which presents fast oscillations when significant noise is present, b6) a seventh indicator representing a second noise computed as the instantaneous phase of the time integral of a wideband analysis signal, which presents fast oscillations when significant noise is present, and b7) an eighth indicator representing a third noise computed as the instantaneous frequency of the time integral of a wideband analysis signal, which presents fast oscillations when significant noise is present.

6. The method according to claim 1, wherein the set of signal noise indicators comprise at least one of the following indicators:

b8) a third indicator of signal presence and signal to noise ratio estimation, equal to the variance during the observation duration of samples of the wideband analysis signal of the difference of instantaneous phase between, on one side, the instantaneous phase of the time integral of the signal and, on the other side, the instantaneous phase of the signal;

b9) a second fourth indicator of signal presence and signal to noise ratio estimation, equal to a variance during the observation duration of samples of the wideband analysis signal of a difference of instantaneous frequency between, on one side, the instantaneous frequency of a time integral of the signal and, on the other side, the instantaneous frequency of the signal;

b.10) a third fifth indicator of signal presence and signal to noise ratio estimation, computed as a quotient of a one or more amplitude quotients including:
   quotient of instantaneous amplitudes of the time derivative of the signal and of the signal;
   quotient of instantaneous amplitudes of the time integral of the signal and of the signal;
and for which a degree of temporal correlation with the two following signals:

b.10.a) the instantaneous frequency of the time integral signal of the wideband analysis signal, b.10.b) one of the two following signals:
   the instantaneous frequency of a wideband analysis signal,
   the instantaneous frequency of a time derivative of a wideband analysis signal, provides an indication of detectable signal presence and signal to noise ratio of a wideband analysis signal thanks to its following properties:

b.10.1) in the absence of a detectable signal, the quotient of the one or more amplitude quotients is not correlated to any of the instantaneous frequency signals previously mentioned in b.10.a) or b.10.b), b.10.2) in the presence of a detectable signal, and in the absence of significant noise, the quotient of the one or more amplitude quotients is correlated with the three instantaneous frequency signals previously mentioned in b.10.a) or b.10.b) and b.10.3) in the presence of a detectable signal, and in the presence of significant noise, the quotient of the one or more amplitude quotients is correlated to the instantaneous frequency of a time integral of the wideband analysis signal, but not to the other two instantaneous frequency signals previously mentioned in b.10.a) or b.10.b).

7. The method according to claim 1, wherein in which:

11.1) the temporal concordance between two significant events is measured as the number of samples that separate the apparition of the two events, without taking into account possible systematic differences of durations for computation of the corresponding indicators;

11.2) a concordance of 0 or 1 sample is considered as good, a concordance of 2 samples is considered as average, and beyond two samples, it is considered as bad;

11.3) when the concordance is relative to more than 2 indicators, a concordance indicator will be computed from significant events identified in a window of 5 to 7 consecutive samples.

8. The method according to claim 1, wherein the first step includes a plurality of operations including:

AS1) a series of undersampling operations, each made of a lowpass or bandpass frequency filtering and a corresponding suppression of samples;

AS2) at least one lowpass or bandpass frequency filtering operation not followed by a corresponding suppression of samples; and AS3) zero or more complex Frequency Translation which brings the analysed frequency to a first operating frequency adapted to compute the instantaneous amplitude and to a second operating frequency adapted to compute the instantaneous phase and the instantaneous frequency of the analysis signal.

9. The method according to claim 8, wherein the steps AS2) and AS3) are the following AS21) and AS31) steps:

AS21) zero or more lowpass or bandpass frequency filtering operations, and

AS31) at least one complex Frequency Translation which brings an analysed frequency to an operating frequency adapted to compute the instantaneous amplitude and to an operating frequency adapted to compute the instantaneous phase and the instantaneous frequency of the analysis signal.

10. The method according to claim 8, wherein the steps AS1), AS2) and AS3) (or AS11), AS21 and AS31), are implemented respectively by the following AS10), AS20) and AS30) steps:

AS10) a series of undersampling operations, each made of a frequency filtering lowpass around null frequency or bandpass around frequency equal to one quarter of sampling frequency, and a corresponding suppression of samples;

AS20) at least one frequency filtering operation lowpass around null frequency or bandpass around frequency equal to one quarter of sampling frequency, not followed by a corresponding suppression of samples, implemented with a frequency filter whose useful duration expressed as a number of samples is less than or equal to 12, and advantageously equal to 8, and whose bandwidth fills at least 30% of a spectrum of the output signal of step AS1); and AS30) zero or more complex Frequency Translation which brings the analysed frequency to a frequency equal to the quarter of the sampling frequency, adapted to compute the instantaneous Amplitude, the instantaneous Phase and the instantaneous Frequency of the analysis signal.

11. The method according to claim 10, wherein the step AS20) is implemented by the following AS200) step:

AS200) a bandpass frequency filtering operation with a center frequency equal to one quarter of the sampling frequency, not followed by a corresponding sample suppression, implemented by a Sliding Fourier Transform of length 12 with a Hann window, restricted to a frequency channel centered on a frequency equal to one quarter of the sampling frequency.

12. The method according to claim 1, wherein the duration of observation of samples of the wideband analysis signal is on the order of 10 to 20 samples of the wideband analysis signal.

13. The method according to claim 1, further including processing voice signals, allowing to detect a fundamental frequency (FFV) of the signal by detecting the following elements:
- VA) significant amplitude peaks of at least one of the following indicators:
  - V1) a detection of peaks of amplitude modulation indicator,
  - V2) an indicator of signal presence probability,
  - V3) a frequency modulation indicator, and
- VB) a time concordance for an appearance of amplitude peaks of previous indicators.

14. The method according to claim 1, wherein the method is applied to the sum of elementary signals, resulting from a decomposition of a multi-dimensional initial signal, with a number of dimensions, into a number of elementary signals out of which at least one has dimension 1.

15. The method according to claim 1, wherein each of the plurality of operations of extraction and each of the plurality of operations for estimation is in performed at a speed adapted to process continuously all analysed frequencies from the plurality of analysed frequencies.

* * * * *